US009849660B2

(12) United States Patent
Eguchi et al.

(10) Patent No.: US 9,849,660 B2
(45) Date of Patent: Dec. 26, 2017

(54) SEPARATION APPARATUS

(71) Applicant: Semiconductor Energy Laboratory Co., Ltd., Kanagawa-ken (JP)

(72) Inventors: Saki Eguchi, Tochigi (JP); Koichi Takeshima, Tochigi (JP); Hiroki Adachi, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/165,099

(22) Filed: May 26, 2016

(65) Prior Publication Data

US 2016/0347047 A1     Dec. 1, 2016

(30) Foreign Application Priority Data

May 27, 2015  (JP) .................................. 2015-107024

(51) Int. Cl.
*B32B 43/00*     (2006.01)
*H01L 21/683*    (2006.01)
(Continued)

(52) U.S. Cl.
CPC ...... *B32B 43/006* (2013.01); *H01L 21/67132* (2013.01); *H01L 21/6836* (2013.01); *B32B 37/003* (2013.01); *B32B 37/22* (2013.01); *B32B 38/10* (2013.01); *B32B 2457/14* (2013.01); *B32B 2457/20* (2013.01); *H01L 2221/6835* (2013.01); *H01L 2221/6839* (2013.01);
(Continued)

(58) Field of Classification Search
CPC ... H01L 2221/68318; H01L 2221/6835; H01L 2221/68363; H01L 2221/68386; B32B 38/10; B32B 43/006
See application file for complete search history.

(56) References Cited

U.S. PATENT DOCUMENTS 6,001,893 A * 12/1999 Vaidya ...................... B32B 7/06
430/18
2003/0032210 A1   2/2003 Takayama et al.
(Continued)

FOREIGN PATENT DOCUMENTS

JP      10-125931 A     5/1998
JP      2003-174153 A   6/2003
(Continued)

*Primary Examiner* — Mark A Osele
(74) *Attorney, Agent, or Firm* — Husch Blackwell LLP

(57) ABSTRACT

A yield in a separation process is improved. A separation apparatus which enables easy separation in a large-area substrate is provided. The separation apparatus has a function of dividing a process member into a first member and a second member and includes a support body supply unit, a support body hold unit, a transfer mechanism, a direction changing mechanism, and a structure body. The structure body bonds a support body to a surface of the first member. When at least part of the process member is located between the direction changing mechanism and the structure body or the pressure applying mechanism, the shortest distance between the direction changing mechanism and a first plane including the surface of the first member is longer than the shortest distance between the first plane and the structure body or the pressure applying mechanism.

18 Claims, 31 Drawing Sheets

(51) Int. Cl.
    *H01L 21/67* (2006.01)
    *B32B 37/00* (2006.01)
    *B32B 37/22* (2006.01)
    *B32B 38/10* (2006.01)

(52) U.S. Cl.
    CPC ............... *H01L 2221/68318* (2013.01); *H01L 2221/68363* (2013.01); *H01L 2221/68381* (2013.01); *H01L 2221/68386* (2013.01); *H01L 2221/68395* (2013.01)

(56) References Cited

U.S. PATENT DOCUMENTS

| | | |
|---|---|---|
| 2006/0199382 A1 | 9/2006 | Sugiyama et al. |
| 2008/0044940 A1 | 2/2008 | Watanabe et al. |
| 2008/0113486 A1 | 5/2008 | Eguchi et al. |
| 2008/0132033 A1 | 6/2008 | Eguchi et al. |
| 2014/0234664 A1 | 8/2014 | Yasumoto et al. |
| 2015/0059986 A1 | 3/2015 | Komatsu et al. |
| 2015/0059987 A1 | 3/2015 | Kumakura et al. |
| 2015/0060933 A1 | 3/2015 | Ohno et al. |
| 2015/0068683 A1 | 3/2015 | Ohno et al. |
| 2015/0314424 A1 | 11/2015 | Kumakura et al. |
| 2015/0314456 A1 | 11/2015 | Kumakura et al. |
| 2015/0318200 A1 | 11/2015 | Ohno et al. |
| 2015/0319893 A1 | 11/2015 | Ohno et al. |
| 2015/0367622 A1 | 12/2015 | Adachi et al. |

FOREIGN PATENT DOCUMENTS

| | | |
|---|---|---|
| JP | 2008-109124 A | 5/2008 |
| JP | 2015-208737 A | 11/2015 |
| WO | WO 2015/166363 A1 | 11/2015 |

\* cited by examiner

FIG. 12A
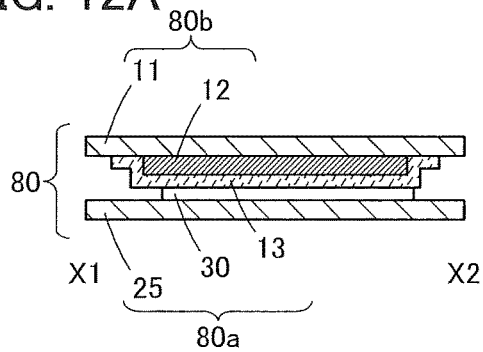 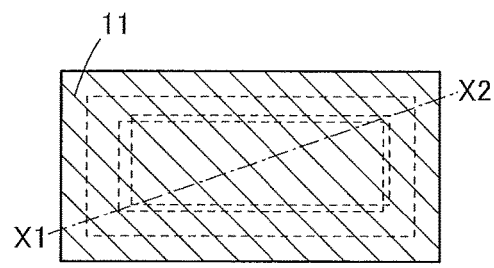
FIG. 12B
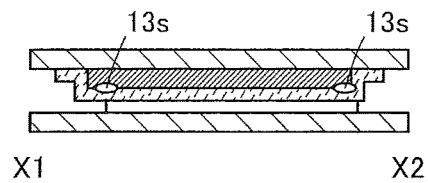 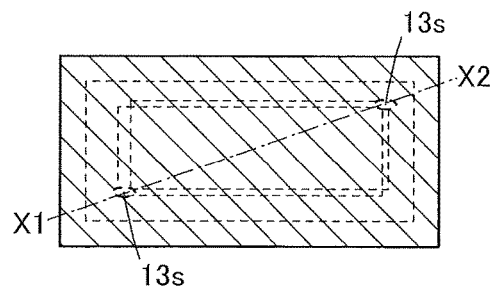
FIG. 12C
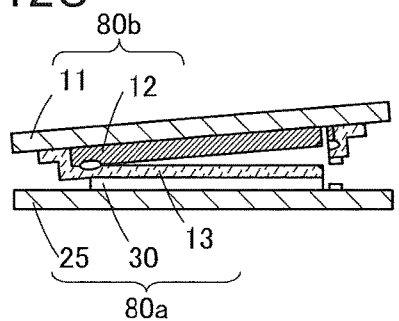
FIG. 12D
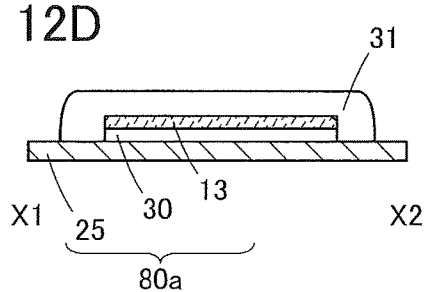 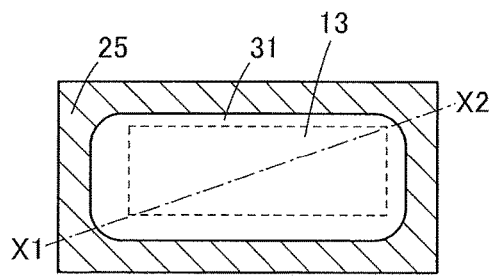
FIG. 12E
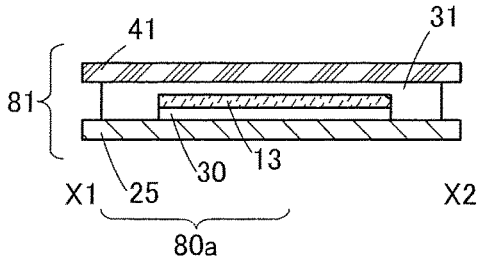 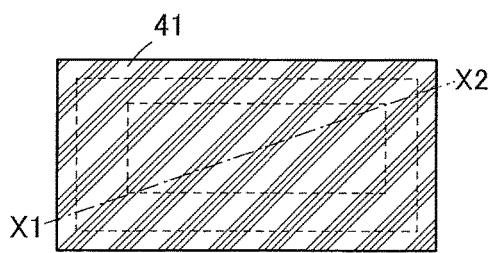

FIG. 14A
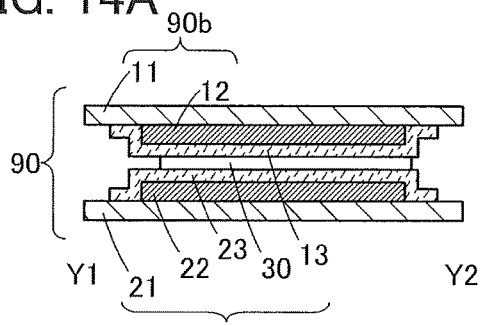
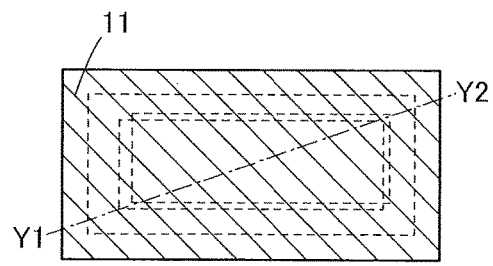
FIG. 14B
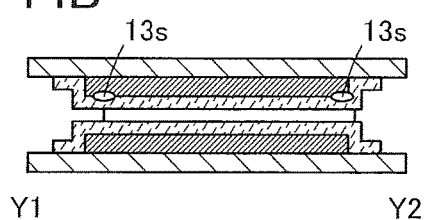
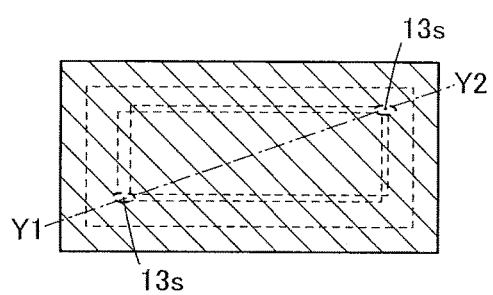
FIG. 14C
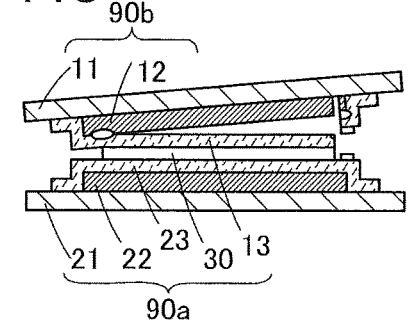
FIG. 14D
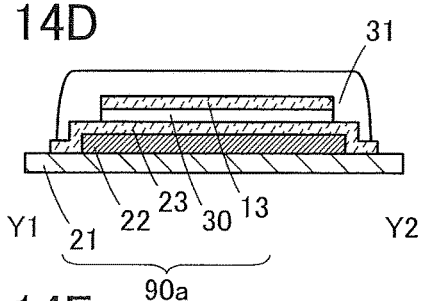
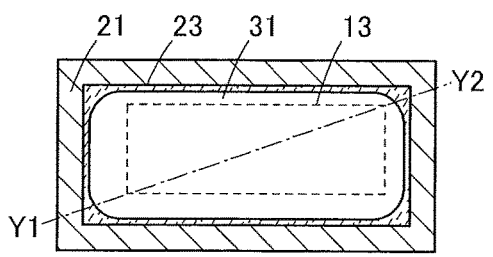
FIG. 14E
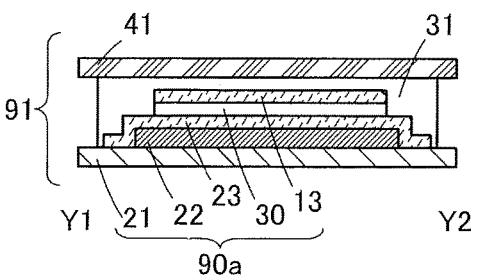
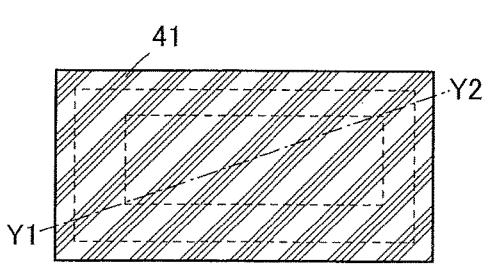

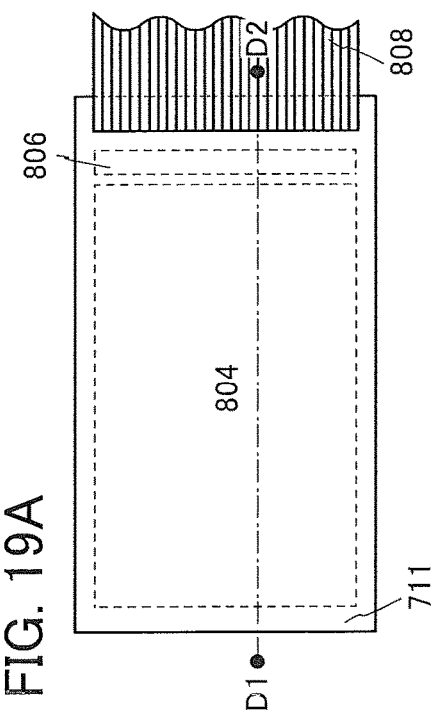
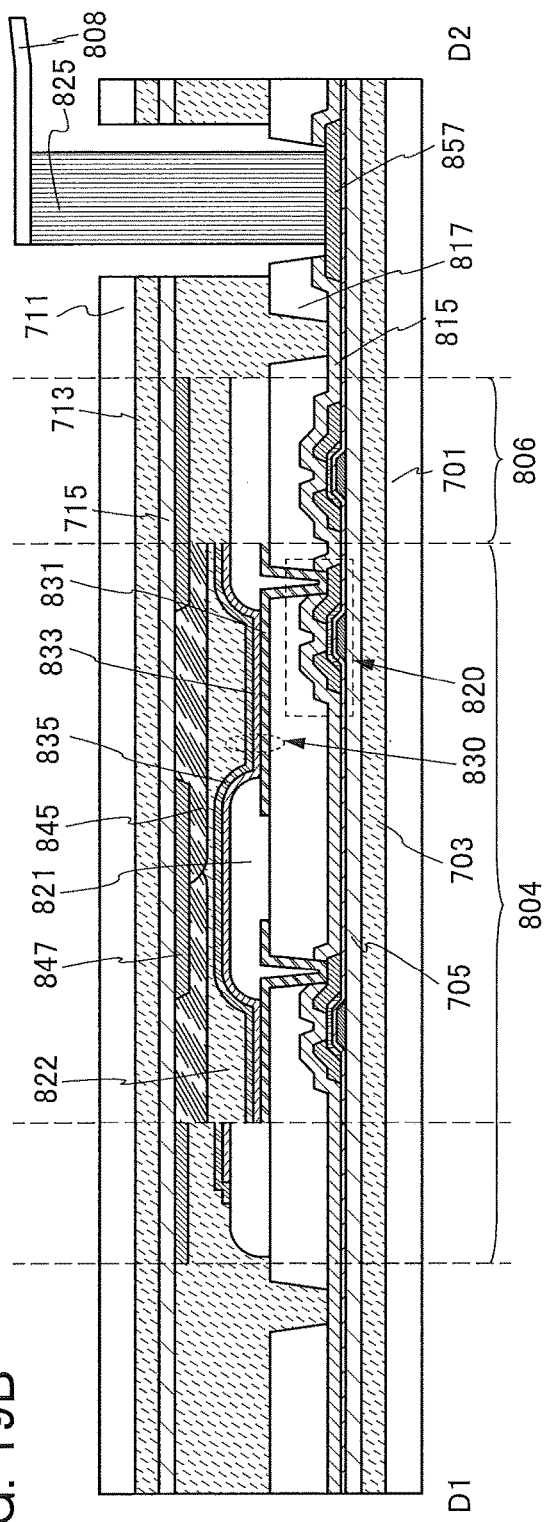
FIG. 19A
FIG. 19B

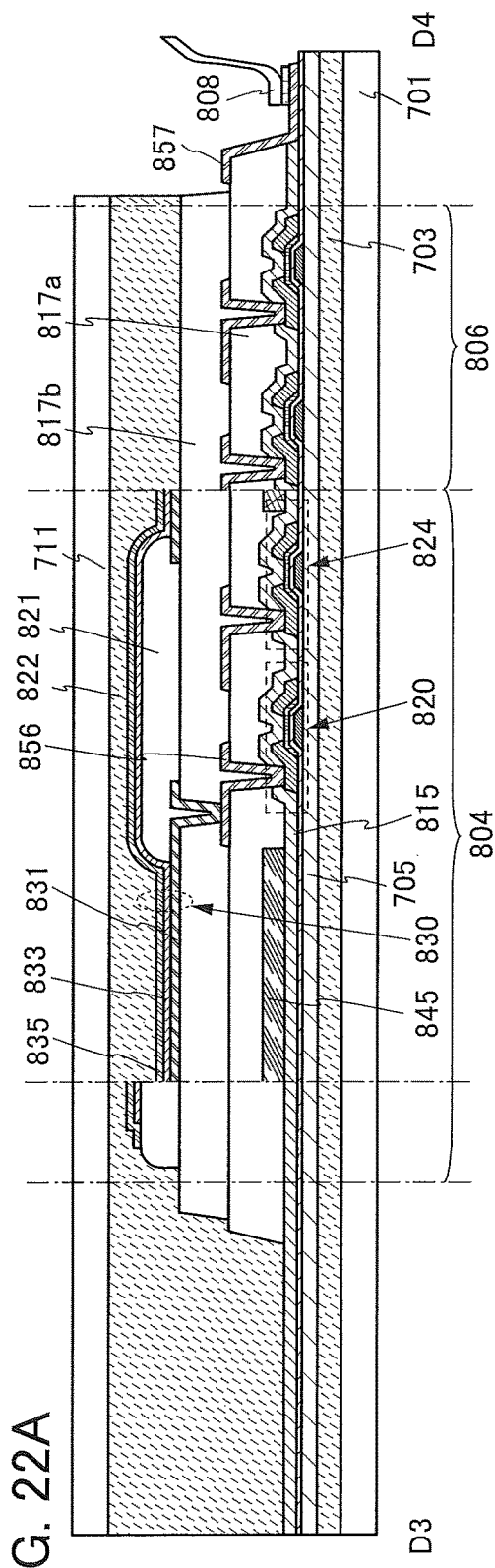
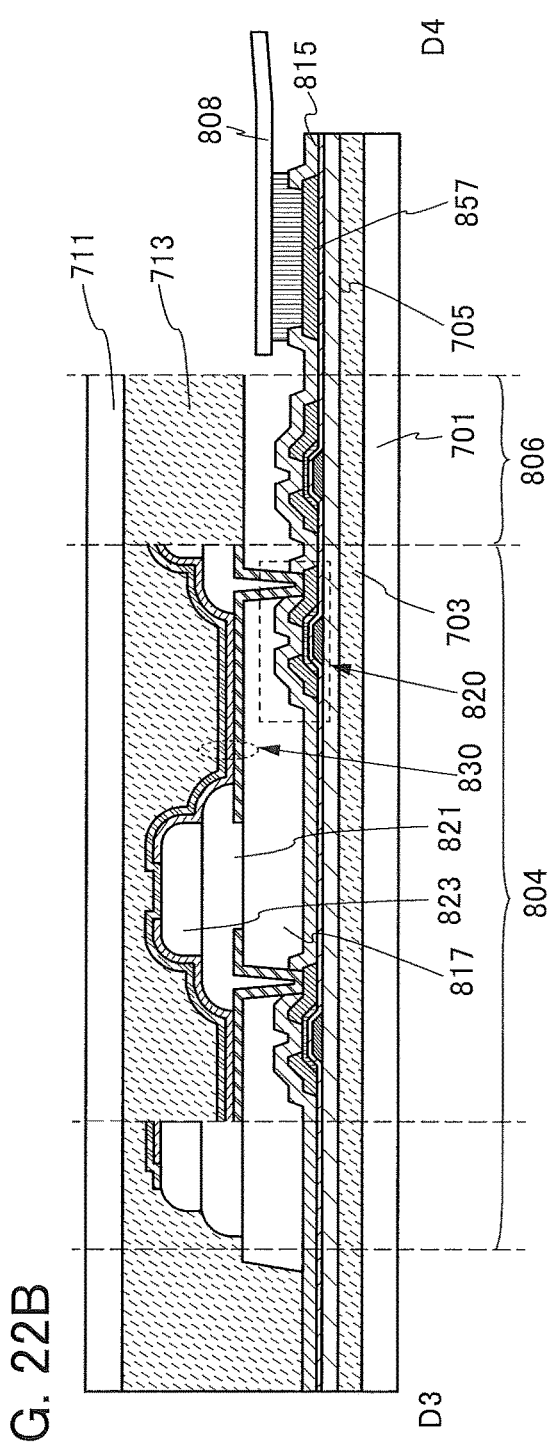
FIG. 22A
FIG. 22B

FIG. 27A
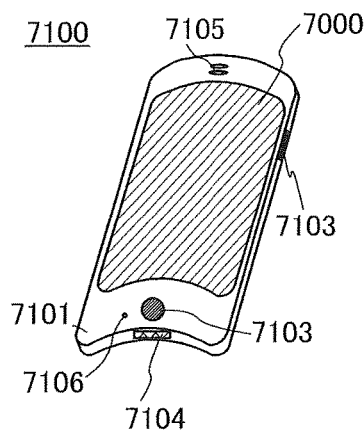
FIG. 27B
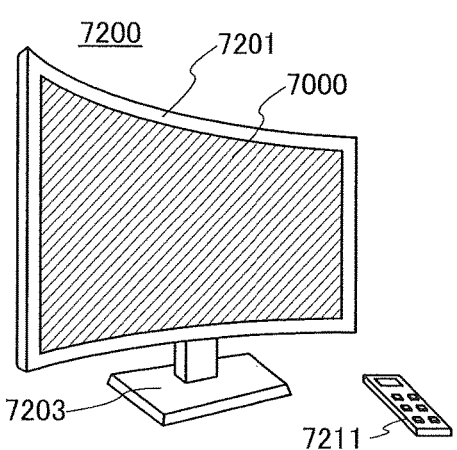
FIG. 27C1
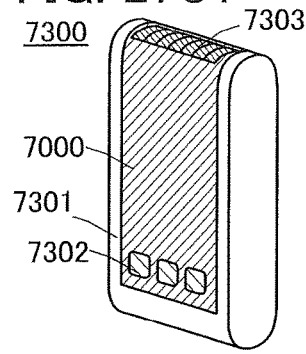
FIG. 27D
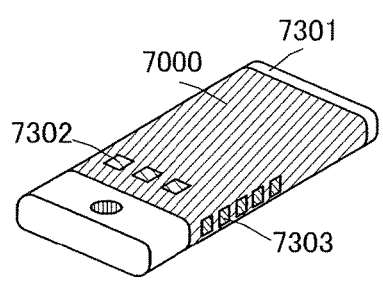
FIG. 27E
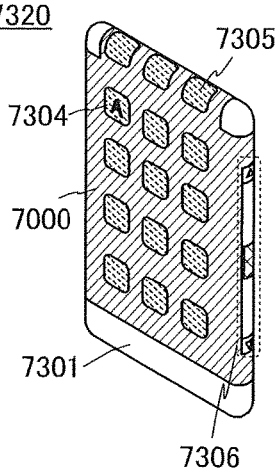
FIG. 27C2
FIG. 27F
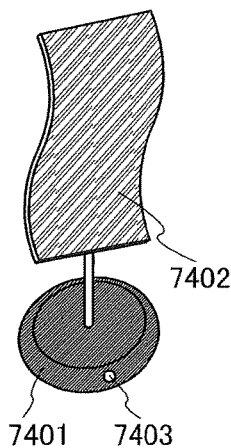
FIG. 27G
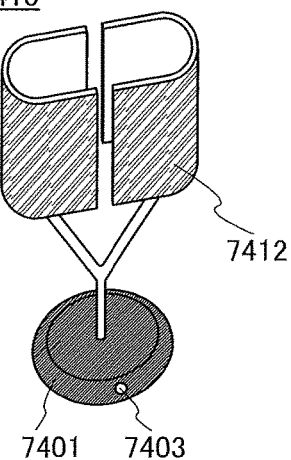
FIG. 27H
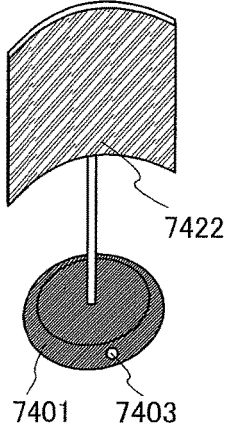

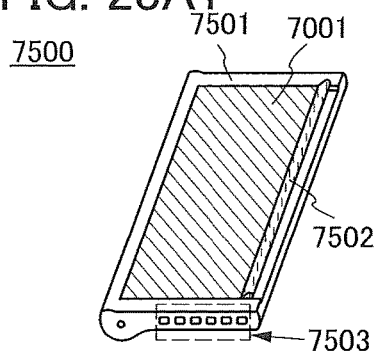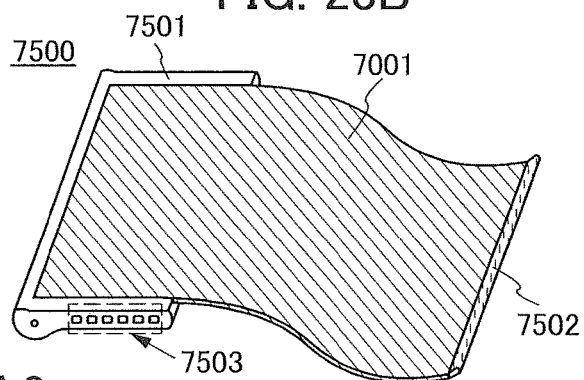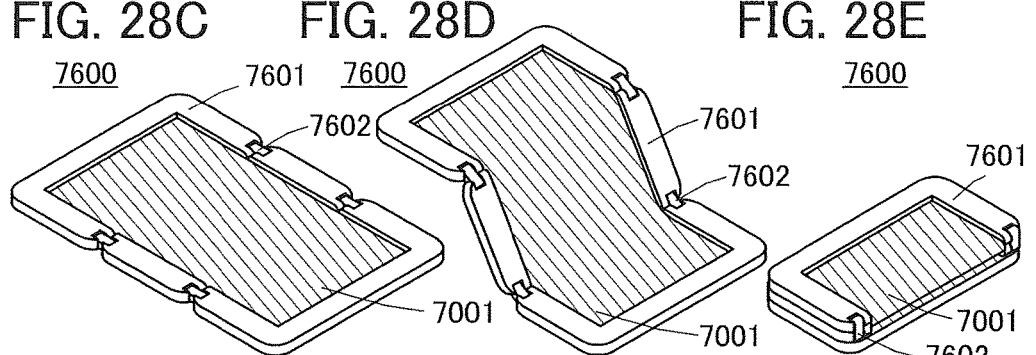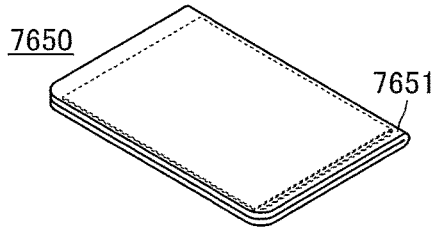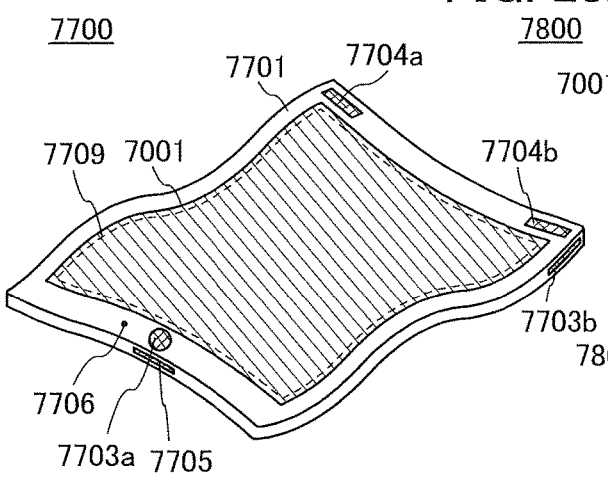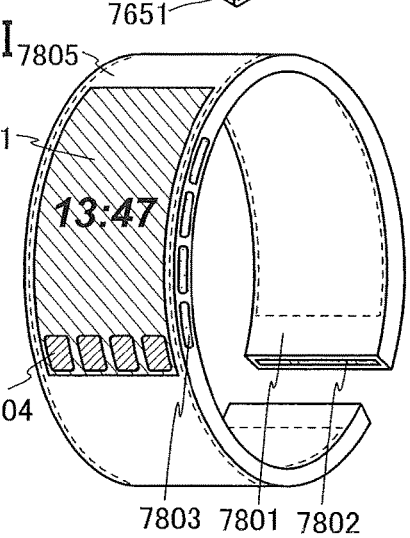

SEPARATION APPARATUS

BACKGROUND OF THE INVENTION

1. Field of the Invention

One embodiment of the present invention relates to a separation apparatus and a stack manufacturing apparatus. One embodiment of the present invention relates to a separation method and a method for manufacturing a stack.

Note that one embodiment of the present invention is not limited to the above technical field. Specifically, examples of the technical field of one embodiment of the present invention disclosed in this specification and the like include a semiconductor device, a display device, a light-emitting device, a power storage device, a memory device, an electronic device, a lighting device, an input device (e.g., a touch sensor), an output device, an input/output device (e.g., a touch panel), a method for driving any of them, and a method for manufacturing any of them.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including semiconductor elements such as transistors.

As a method for manufacturing a device including a flexible substrate, a technique has been developed in which a functional element such as a thin film transistor or an organic electroluminescence (EL) element is formed over a formation substrate (e.g., a glass substrate or a quartz substrate), and then the functional element is transferred to a flexible substrate. This technique needs a process for separating a layer including the functional element from the formation substrate (the process is also referred to as a separation process).

For example, Patent Document 1 discloses the following separation technique using laser ablation: a separation layer formed of amorphous silicon or the like is formed over a substrate, a layer to be separated which includes a thin film element is formed over the separation layer, and the layer to be separated is bonded to a transfer body with the use of a bonding layer; then the separation layer is ablated by laser light irradiation, so that separation is caused in the separation layer.

Patent Document 2 discloses a technique in which separation is conducted by physical force such as by human hands. In Patent Document 2, a metal layer is formed between a substrate and an oxide layer and separation is caused at an interface between the oxide layer and the metal layer by utilizing weak bonding at the interface between the oxide layer and the metal layer, and as a result, a layer to be separated and the substrate are separated from each other.

REFERENCE

[Patent Document 1] Japanese Published Patent Application No. H10-125931
[Patent Document 2] Japanese Published Patent Application No. 2003-174153

SUMMARY OF THE INVENTION

An object of one embodiment of the present invention is to improve a yield in a separation process. An object of one embodiment of the present invention is to provide a separation apparatus that enables easy separation in a large-area substrate.

An object of one embodiment of the present invention is to improve the yield in a process for manufacturing a semiconductor device, a light-emitting device, a display device, an input/output device, an electronic device, a lighting device, or the like; in particular, is to improve the yield in a process for manufacturing a light, thin, or flexible device.

An object of one embodiment of the present invention is to provide a novel separation apparatus or a novel stack manufacturing apparatus.

An object of one embodiment of the present invention is to provide a novel display device, a novel lighting apparatus, or the like. An object of one embodiment of the present invention is to provide a highly reliable display device, a highly reliable lighting device, or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a separation apparatus is configured to divide a process member into a first member and a second member and includes a support body supply unit, a support body hold unit, a direction changing mechanism, and a first structure body. The direction changing mechanism is located between the support body supply unit and the support body hold unit. The first structure body is located between the direction changing mechanism and the support body hold unit. The support body supply unit is configured to feed a support body having a sheet-like shape. The support body supply unit includes one of a pair of tension applying mechanisms. The support body hold unit includes the other of the pair of tension applying mechanisms. The pair of tension applying mechanisms is configured to apply tension to the support body. The direction changing mechanism is configured to change the feed direction of the support body. The first structure body includes a convex surface. The first structure body is configured to change the feed direction of the support body along the convex surface to divide the process member into the first member and the second member.

In the separation apparatus of one embodiment of the present invention, the first structure body may be configured to bond the support body to a surface of the first member. Alternatively, the peeling apparatus of one embodiment of the present invention may include a pressure applying mechanism configured to bond the support body to the surface of the first member.

Here, when at least part of the process member is positioned between the direction changing mechanism and the first structure body or the pressure applying mechanism, a plane including the surface of the first member is called a first plane. In the case where the first structure body has a function of bonding the support body to the surface of the first member, the shortest distance between the first plane and the direction changing mechanism is longer than the shortest distance between the first plane and the first structure body. Note that in the case where the direction in which the process member is transferred is parallel to the horizontal plane, the first plane is parallel to the horizontal plane. At this time, the bottom edge of the direction changing mechanism is located at a higher level than that of the horizontal plane which passes through the bottom edge of the first structure body.

When the pressure applying mechanism is configured to bond the support body to the surface of the first member, the pressure applying mechanism is located between the direction changing mechanism and the first structure body. In addition, the shortest distance between the first plane and the direction changing mechanism is longer than the shortest distance between the first plane and the pressure applying mechanism. Note that in the case where the direction in which the process member is transferred is parallel to the horizontal plane, the bottom edge of the direction changing mechanism is located at a higher level than that of a horizontal plane which passes through the bottom edge of the pressure applying mechanism.

In the separation apparatus with the above structure, it is preferable that an angle at which the first structure body bends back the support body be an obtuse angle.

It is preferable that the separation apparatus with the above structure include a second structure body. The second structure body has a convex surface. The second structure body is located between the first structure body and the support body hold unit. The second structure body is configured to send the support body from the first structure body to the support body hold unit along the convex surface. The second structure body has at least one of a function of applying tension to the support body and a function of controlling the angle at which the first structure body bends back the support body.

In the separation apparatus with the above structure, it is preferable that the radius of curvature of the convex surface included in the first structure body be larger than the radius of curvature of the convex surface included in the second structure body. For example, the radius of curvature of the convex surface included in the first structure body can be greater than or equal to 0.5 mm and less than or equal to 3000 mm, preferably greater than or equal to 0.5 mm and less than or equal to 1000 mm.

It is preferable that the separation apparatus with the above structure include a fixing mechanism. The fixing mechanism is configured to fix the second member at least part of which is separated from the first member.

It is preferable that the separation apparatus with the above structure include a liquid supply mechanism. The liquid supply mechanism is configured to supply liquid between the first member and the second member (or the separation surface).

It is preferable that the separation apparatus with the above structure include a reel. The reel is located between the support body supply unit and the support body hold unit. A tape is bonded to one surface of the support body, and the reel is configured to wind up the tape.

According to one embodiment of the present invention, a yield in a separation process can be improved. According to one embodiment of the present invention, a separation apparatus that enables easy separation in a large-area substrate can be provided.

According to one embodiment of the present invention, the yield in a process for manufacturing a semiconductor device, a light-emitting device, a display device, an input/output device, an electronic device, a lighting device, or the like can be improved. In particular, the yield in a process for manufacturing a light, thin, or flexible device can be improved.

According to one embodiment of the present invention, a novel separation apparatus or a novel stack manufacturing apparatus can be provided.

According to one embodiment of the present invention, a novel display device, novel lighting apparatus, or the like can be provided. According to one embodiment of the present invention, a highly reliable display device, highly reliable lighting device, or the like can be provided.

Note that the description of these effects does not disturb the existence of other effects. In one embodiment of the present invention, there is no need to obtain all the above effects. Other effects are apparent from and can be derived from the description of the specification, the drawings, the claims, and the like.

BRIEF DESCRIPTION OF THE DRAWINGS

FIGS. 1A to 1E illustrate an example of a separation apparatus.
FIGS. 2A to 2F illustrates an example of a separation apparatus.
FIGS. 12A to 12E illustrate a process for manufacturing a stack.
FIGS. 14A to 14E illustrate a process for manufacturing a stack.
FIGS. 19A and 19B illustrate an example of a light-emitting device.
FIGS. 22A and 22B illustrate an example of a light-emitting device.
FIGS. 27A to 27H illustrate examples of an electronic device and a lighting device.
FIGS. 28A1, 28A2, and 28B to 28I illustrate examples of an electronic device.

DETAILED DESCRIPTION OF THE INVENTION

Figure 1:
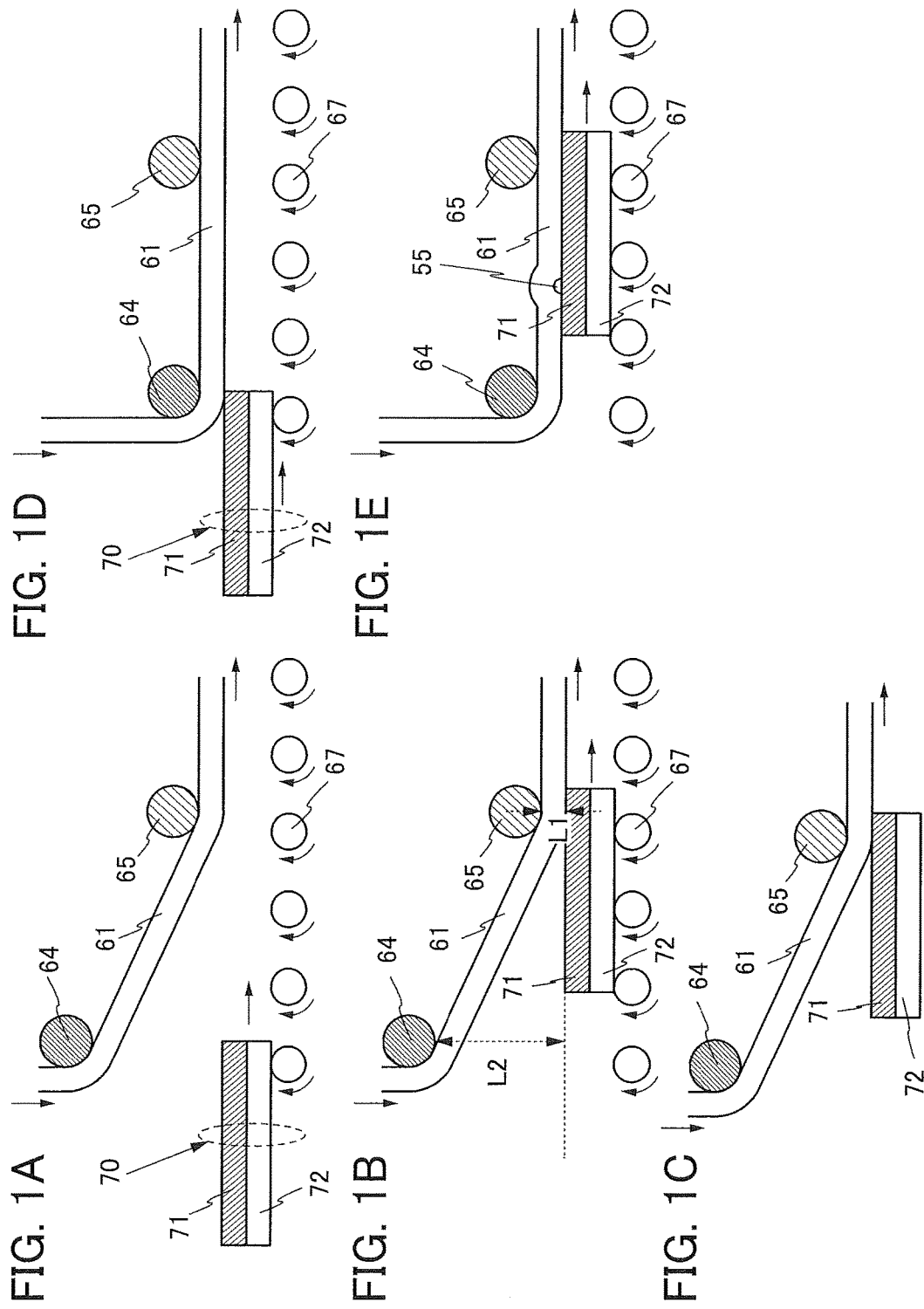

Embodiments and example will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments and example below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

The position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

A layer to be separated can be formed over a formation substrate, separated from the formation substrate, and then transferred to another substrate. With this method, for example, a layer to be separated which is formed over a formation substrate having high heat resistance can be transferred to a substrate having low heat resistance, and the manufacturing temperature of the layer to be separated is not limited by the substrate having low heat resistance. The layer to be separated is transferred to a substrate or the like which is more lightweight, thin, or flexible than the formation substrate, whereby a variety of devices such as a semiconductor device, a light-emitting device, or a display device can be made lightweight, thin, and flexible.

A device that can be manufactured according to one embodiment of the present invention includes a functional element. Examples of the functional element include semiconductor elements such as a transistor; light-emitting elements such as an inorganic EL element, an organic EL element, and a light-emitting diode (LED); and display elements such as a liquid crystal element, an electrophoretic element, and a display element including micro electromechanical systems (MEMS). For example, a semiconductor device including a sealed transistor and a light-emitting device including a sealed light-emitting element (here, a display device including a transistor and a light-emitting element which are sealed is also included) are examples of the device that can be manufactured according to one embodiment of the present invention.

As a specific example, since an organic EL element is likely to deteriorate due to moisture or the like, it is preferable that a protective film having an excellent moisture-proof property be formed over a glass substrate at a high temperature and transferred to a flexible organic resin substrate having low heat resistance and a poor moisture-proof property. After that, an organic EL element is formed over the protective film transferred to the organic resin substrate, so that a highly reliable flexible light-emitting device can be manufactured.

As another example, a protective film having an excellent moisture-proof property may be formed over a glass substrate at a high temperature, and an organic EL element may be formed over the protective film. After that, the protective film and the organic EL element may be separated from the glass substrate and transferred to a flexible organic resin substrate having low heat resistance and a poor moisture-proof property. By transferring the protective film and the organic EL element to the organic resin substrate, a highly reliable flexible light-emitting device can be manufactured.

One embodiment of the present invention relates to a device (or a stack that is a part of the device) manufacturing apparatus using such separation and transfer.

A stack manufacturing apparatus in one embodiment of the present invention includes a supply unit for supplying a process member, a separation unit for separating the process member into a surface layer and a remaining portion, a bonding unit for bonding a support body to the remaining portion, a support body supply unit for supplying the support body, and an unloading unit for unloading a stack including the remaining portion and the support body bonded to each other with a bonding layer.

Thus, one surface layer of a process member can be separated, and a support body can be bonded to a remaining portion of the process member from which the surface layer has been separated. One embodiment of the present invention can provide a novel stack body manufacturing apparatus capable of manufacturing a stack including a support body and a remaining portion of a process member from which a surface layer has been separated.

Note that in this specification, a "support body" and a "substrate" each preferably have at least one of a functional circuit, a functional element, a functional film, and the like. A "support body" and a "substrate" each do not necessary have a function of supporting a functional circuit, a functional element, a functional film, and the like, and may have a function of protecting a surface of the device, or a function of sealing at least one of a functional circuit, a functional element, a functional film, and the like, for example.

In Embodiment 1, a separation apparatus of one embodiment of the present invention is described. In Embodiments 2 and 3, a stack manufacturing apparatus of one embodiment of the present invention which includes the separation apparatus is described. In Embodiment 4, a separation apparatus which can be used in the stack manufacturing apparatus of one embodiment of the present invention and is different from the separation apparatus described in Embodiment 1 is described. In Embodiments 5 to 7, a stack which can be manufactured according to one embodiment of the present invention, and examples of a device, an electronic device, and a lighting device which include the stack are described.

[Embodiment 1]

In this embodiment, a separation apparatus of one embodiment of the present invention is described with reference to FIGS. 1A to 1E, FIGS. 2A to 2F, FIG. 3, FIG. 4, FIG. 5, FIG. 6, FIGS. 7A to 7D, FIGS. 8A to 8E, FIGS. 9A to 9C, and FIGS. 10A to 10C.

The separation apparatus of one embodiment of the present invention can divide a process member into a first member and a second member. The separation apparatus includes a support body supply unit, a support body hold unit, a direction changing mechanism, and a first structure body. The direction changing mechanism is located between the support body supply unit and the support body hold unit. The first structure body is located between the direction changing mechanism and the support body hold unit. The support body supply unit can feed a support body having a sheet-like shape. The support body supply unit includes one of a pair of tension applying mechanisms. The support body hold unit includes the other of the pair of tension applying mechanisms. The pair of tension applying mechanisms can apply tension to the support body. The direction changing mechanism can change the feed direction of the support body. The first structure body has a convex surface. The first structure body can divide the process member into the first member and the second member by changing the feed direction of the support body along the convex surface.

The first structure body of the separation apparatus of one embodiment of the present invention has a function of bonding the support body to a surface of the first member. Alternatively, the separation apparatus of one embodiment of the present invention includes a pressure applying mechanism having a function of bonding the support body to the surface of the first member.

FIGS. 1A to 1C illustrate a positional relationship between a direction changing mechanism 64 and a pressure applying mechanism 65 which are included in the separation apparatus of one embodiment of the present invention. FIGS. 1D and 1E illustrate a positional relationship between the direction changing mechanism 64 and the pressure applying mechanism 65 of another separation apparatus which is a comparative example.

Note that in this embodiment, the direction in which a process member 70 is transferred with a transfer mechanism 67 is the horizontal direction. The horizontal direction is a direction parallel to a plane (horizontal plane) perpendicular to a direction in which gravity acts. Note that in the separation apparatus of one embodiment of the present invention, the direction in which the process member 70 is transferred with the transfer mechanism 67 is not limited to the horizontal direction.

As illustrated in FIGS. 1A to 1E, the process member 70 includes a first member 71 and a second member 72. In FIGS. 1A, 1B, 1D, and 1E, the process member 70 is transferred by the transfer mechanism 67. Note that in one embodiment of the present invention, movement of at least one of a support body 61 and the process member 70 changes the relative positions of the support body 61 and the process member 70. For example, as illustrated in FIG. 1C, the separation apparatus of one embodiment of the present invention may have a structure in which no transfer mechanism is provided so that the process member 70 is not moved. In this case, the process member 70 is located or fixed on a stage or the like. The feed direction of the support body 61 supplied from a support body supply unit (not illustrated) is changed by the direction changing mechanism 64. Between the pressure applying mechanism 65 and the transfer mechanism 67, the support body 61 is bonded to a surface of the first member 71.

Assuming that the bottom edge of the direction changing mechanism 64 is located at the same level as that of the pressure applying mechanism 65 as illustrated in FIGS. 1D and 1E, the support body 61 whose feed direction has been changed by the direction changing mechanism 64 is in contact with the first member 71 before reaching the pressure applying mechanism 65 (FIG. 1D). When at least part of the support body 61 is bonded to the first member 71 by the contact, an air bubble 55 is trapped between the support body 61 and the first member 71 in some cases, as illustrated in FIG. 1E. If many air bubbles are trapped, the adhesion between the support body 61 and the first member 71 is reduced. It is difficult to completely remove the trapped air bubbles, even by using the pressure applying mechanism 65 or the like.

As described above, in the separation apparatus of one embodiment of the present invention, the feed direction of the support body 61 is changed along the convex surface, whereby the process member 70 is divided into the first member 71 and the second member 72. Therefore, low adhesion between the support body 61 and the first member 71 reduces a yield at the time of dividing the process member 70.

In the separation apparatus of one embodiment of the present invention, the bottom edge of the direction changing mechanism 64 is located at a higher level than that of the bottom edge of the pressure applying mechanism 65 as illustrated in FIGS. 1A and 1B. Specifically, the bottom edge of the direction changing mechanism 64 is located at a higher level than that of a horizontal plane which passes through the bottom edge of the pressure applying mechanism 65. When at least part of the process member 70 is located between the direction changing mechanism 64 and the pressure applying mechanism 65, a plane including the surface of the first member 71 is called a first plane. With the first plane taken into consideration, a shortest distance L2 between the first plane and the direction changing mechanism 64 is longer than a shortest distance L1 between the first plane and the pressure applying mechanism 65, as illustrated in FIG. 1B.

The structure illustrated in FIGS. 1A and 1B can prevent air bubbles from being trapped between the support body 61 and the first member 71 to increase the adhesion between the support body 61 and the first member 71.

A roller or the like can be used as the direction changing mechanism 64, for example. A roller, a flat plate, or the like can be used as the pressure applying mechanism 65, for example. Examples of materials for the roller include metals, alloys such as stainless steel, resins, and rubber. Examples of the flat plate include a metal plate, an organic resin plate of acrylic, plastic, or the like, and a glass plate. Alternatively, an elastic flat plate using rubber, a spring, a resin, or the like may be used.

FIGS. 2A to 2E illustrate another structure of the separation apparatus of one embodiment of the present invention.

As illustrated in FIG. 2A, in the separation apparatus of one embodiment of the present invention, the support body 61, which has been attached to the first member 71 in advance, is pulled to separate the first member 71 from the second member 72.

Since a process member is divided while a pair of tension applying mechanisms (not illustrated) applies tension to the support body 61 in the separation apparatus of one embodiment of the present invention, it is possible to inhibit slack in the first member 71 attached to the support body 61 as well as that of the support body 61, which can improve the yield of separation.

Here, when force is applied to the support body 61 as a result of pulling the support body 61, failure of separation or crack in the first member 71 might be caused depending on the speed at which the support body 61 is fed, the feed direction of the support body 61, or the like.

For example, in the case where the first member 71 includes a stacked-layer structure with low adhesion, separation might occur at an interface with low adhesion, which causes a reduction in the yield of separation. In another example in which the first member 71 includes an organic EL element, separation might occur at an interface between two layers of an EL layer or an interface between the EL layer and an electrode, and accordingly, separation at the interface between the first member 71 and the second member 72 might be prevented.

Thus, in the separation apparatus of one embodiment of the present invention, an angle $\alpha$ at which a first structure body 60 bends back the support body 61 is preferably an obtuse angle (i.e., greater than 90° and less than 180°). Separation at an interface with low adhesion in the first member 71 is thus inhibited and the process member can be divided into the first member 71 and the second member 72 with a high yield.

Note that the angle $\alpha$ means an angle formed between a surface of the support body 61 before being bent back on the first structure body 60 side (the horizontal plane, or a virtual line indicated by a dotted line) and the surface of the support body 61 after being bent back on the first structure body 60 side (another virtual line indicated by another dotted line) as shown in FIG. 2A.

For a higher yield of separation, the angle $\alpha$ is preferably greater than or equal to 110° and less than 180°. For example, the angle $\alpha$ may be greater than or equal to 120° and less than or equal to 165°. Note that even when the angle $\alpha$ is an acute angle or 90°, separation can be performed with a high yield, depending on the structure of the process member or the like. In this case, the angle $\alpha$ may be an acute angle or 90°.

The first member 71 that is separated from the second member 72 is warped or distorted in some cases. It is hard for a robot to transfer or deliver the warped or distorted first member 71. However, in one embodiment of the present invention, the first member 71 can be easily transferred because the first member 71 is bonded to the support body 61.

Note that the first structure body 60 may have the function of the pressure applying mechanism 65 illustrated in FIGS. 1A and 1B, i.e., a function of bonding the support body 61 to the surface of the first member 71.

In the case where the first structure body 60 has a function of bonding the support body 61 to the surface of the first member 71, the bottom edge of the direction changing mechanism 64 exists at a higher level than that of the bottom edge of the first structure body 60 as shown in the structure that will be described below with reference to FIG. 4. Specifically, the bottom edge of the direction changing mechanism 64 exists at a higher level than that of a horizontal plane which passes through the bottom edge of the first structure body 60. In addition, when at least part of the process member 70 is located between the direction changing mechanism 64 and the first structure body 60, a plane including the surface of the first member 71 is called a first plane. With the first plane taken into consideration, the shortest distance between the first plane and the direction changing mechanism 64 is longer than the shortest distance between the first plane and the first structure body 60.

As shown in FIG. 2B, the separation apparatus of one embodiment of the present invention preferably includes a second structure body 62 with a convex surface. The second structure body 62 is located between the first structure body 60 and the support body hold unit (not illustrated).

The pair of tension applying mechanisms alone does not suffice to apply tension to the entire support body 61, and a portion of the support body 61 which does not readily undergo the stress is slacked in some cases. For example, failure of separation easily occurs when, as indicated by an arrow in FIG. 2F, the support body 61 is slacked in the vicinity of the position where the process member is divided (which can also be called the vicinity of the first structure body 60) and a gap is formed between the first structure body 60 and the support body 61.

The second structure body 62 has at least one of a function of applying a tension to the support body 61 and a function of controlling an angle $\alpha$ at which the first structure body 60 bends back the support body 61. Accordingly, the second structure body 62 adjusts force applied to the support body 61 and/or the feed direction of the support body 61. As a result, slack of the support body 61 can be prevented and a portion where the first structure body 60 is not adhered to the support body 61 is unlikely to be generated. Furthermore, the process member can be divided into the first member 71 and the second member 72 with a high yield.

The second structure body 62 may be capable of moving in at least one direction (e.g., upward and downward, right and left, or forward and backward). The tension applied to the support body 61 can be adjusted by changing the position of the second structure body 62, for example. Alternatively, the angle $\alpha$ at which the support body 61 is bent back can be adjusted by changing the position of the second structure body 62, for example. The angle $\alpha$ may be adjustable in the range of 110° to less than 180° by changing the position of the second structure body 62, for example. Alternatively, the angle $\alpha$ may be adjustable in the range of 120° to 165°.

For example, FIG. 2B illustrates the second structure body 62 which is movable upward and downward, rightward and leftward, and in the oblique directions (upper left direction and lower right direction) of the figure. The second structure body 62 may be movable in at least one of directions parallel to, perpendicular to, and tilted relative to the horizontal plane. Note that the second structure body 62 may be able to be driven with a motor.

The second structure body 62 has a function of delivering the support body 61 from the first structure body 60 to the support body hold unit along the convex surface. For example, as illustrated in FIG. 2B, the second structure body 62 may bend back the support body 61 to change the feed direction of the support body 61.

Alternatively, the second structure body 62 may wind up the support body 61 (and the first member 71).

To inhibit slack in the support body 61, the material of the first structure body 60 and that of the support body 61 preferably have high adhesiveness to each other.

The separation apparatus of one embodiment of the present invention preferably includes at least one of a flat-plate-like fixing mechanism 68a illustrated in FIG. 2C and a roller-like fixing mechanism 68b illustrated in FIG. 2D. The fixing mechanisms 68a and 68b can each hold the second member 72 that has been exposed after being separated from the first member 71. Thus, the fixing mechanisms 68a and 68b can each prevent the second member 72 from leaving the supporting surface. When the second member 72 leaves the supporting surface, the position of separation changes and separation does not proceed normally in some cases. The second member 72 is preferably held down because the second member 72 can be fixed without fail.

Examples of the flat-plate-like fixing mechanism 68a include a metal plate, an organic resin plate of acrylic, plastic, or the like, and a glass plate. Alternatively, an elastic flat plate using rubber, a spring, a resin, or the like may be used.

As the roller-like fixing mechanism 68b, a nip roller or the like can be used.

Note that the fixing mechanism is not limited to the above examples, and a chuck such as a suction chuck, an electrostatic chuck, a mechanical chuck, or a porous chuck, or a table such as a suction table, a heater table, or a spinner table can also be used.

The separation apparatus of one embodiment of the present invention preferably includes a liquid supply mechanism 69 shown in FIG. 2E. The liquid supply mechanism 69 can supply liquid to a separation surface between the first member 71 and the second member 72.

The presence of the liquid in the portion where the separation proceeds can decrease the force required for the separation.

Moreover, electrostatic discharge damage to an electronic device or the like can be prevented. Specifically, an adverse effect of static electricity caused at the time of separation (e.g., damage to a semiconductor element from static electricity) on a functional element or the like included in the first member 71 can be suppressed. Note that liquid can be sprayed in the form of mist or steam. As the liquid, pure water is preferably used. It is also possible to use an organic solvent or the like. A neutral, alkaline, or acid aqueous solution, or an aqueous solution in which salt is dissolved may be used, for example.

Since the separation apparatus of one embodiment of the present invention has the first structure body 60, liquid does not need to be injected through a slight aperture in the process member 70. During the process using the separation apparatus, specifically, at the start of separation of the first member 71 and the second member 72, a portion to which liquid is to be injected appears, and thus, liquid can be supplied to the desired portion easily without fail by using the liquid supply mechanism 69.

Note that one embodiment of the present invention is not limited to the above, and the process member 70 may be transferred into the separation apparatus of one embodiment of the present invention after liquid is injected to the interface between the first member 71 and the second member 72. Alternatively, the separation apparatus of one embodiment of the present invention may have a liquid supply unit for injecting liquid to the interface between the first member 71 and the second member 72. After liquid is injected to the interface, the support body 61 may be bonded to the first member 71 and then the first member 71 and the second member 72 may be separated from each other. During the separation process, liquid that has been stored in a groove penetrates through the interface between the first member 71 and the second member 72 by capillary action at the same time when the support body 61 moves, so that an area to be separated expands. The liquid stored in the groove also has a function of inhibiting static electricity generated in a portion from which separation starts.

[Structure Example of Separation Apparatus]

Figure 3:
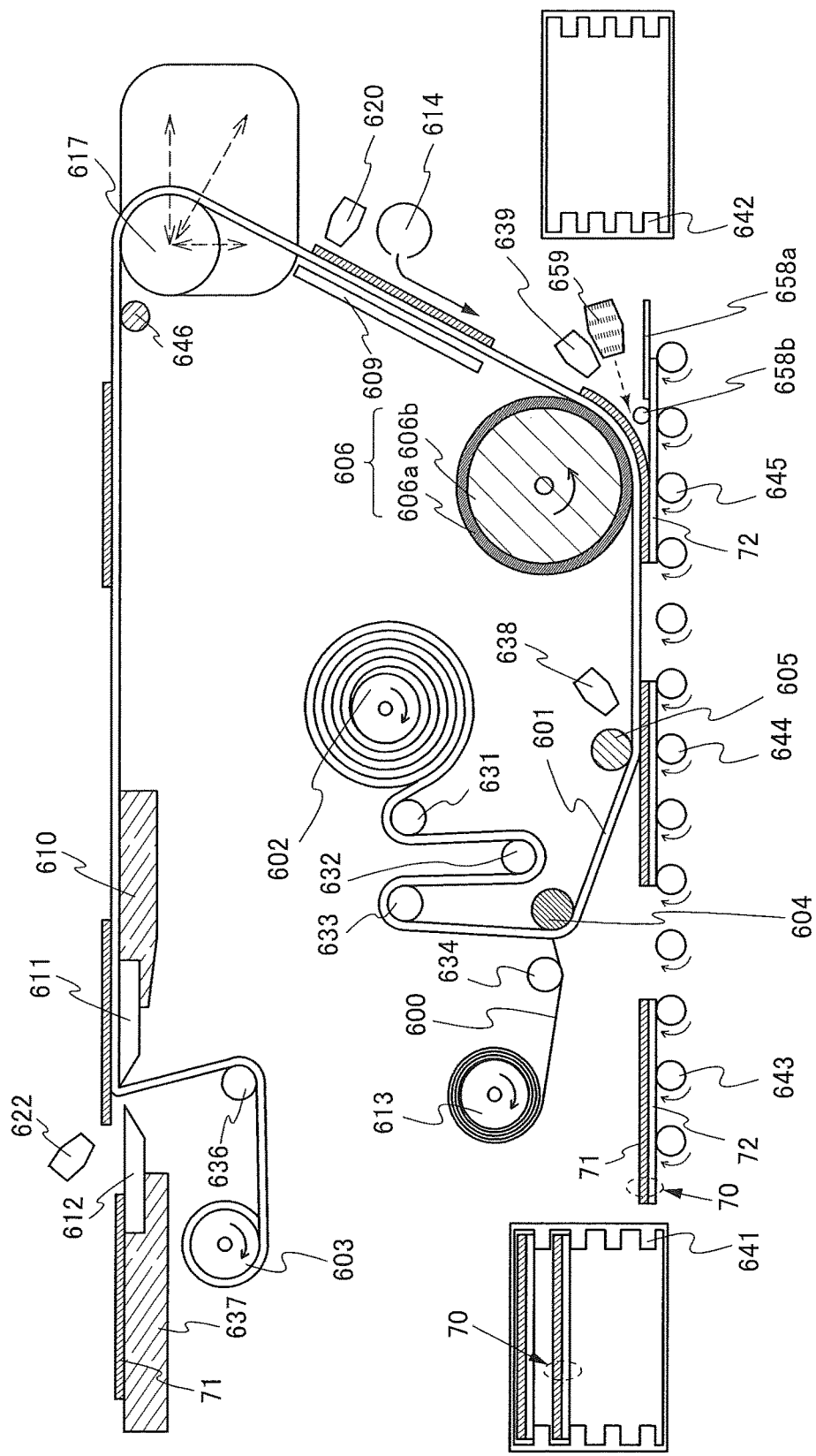
FIG. 3 illustrates an example of a separation apparatus.

The separation apparatus of one embodiment of the present invention is described with reference to FIG. 3, FIG. 4, FIG. 5, FIG. 6, and FIGS. 7A to 7D. Description below is made with reference to mainly FIG. 3. Portions in FIG. 4, FIG. 5, and FIG. 6 which are the same as those in FIG. 3 will not be described again, and portions in FIG. 4, FIG. 5, and FIG. 6 which are not included in FIG. 3 are described in detail. FIGS. 7A to 7D illustrate structure examples of a portion that is denoted as a region Z in FIG. 5.

In this embodiment, an example in which the first member 71 and the second member 72 are separated from each other by separating the first member 71 from the process member 70 is described. Note that the first member 71 and the second member 72 may be separated from each other by separating the second member 72 from the process member 70.

The process member 70 has a sheet-like shape and includes the sheet-like first member 71 and the sheet-like second member 72. The first member 71 and the second member 72 may each have a single-layer structure or a stacked-layer structure. In the process member 70, a separation trigger is preferably formed. The trigger facilitates the separation at the interface between the first member 71 and the second member 72. The first member 71 includes at least one of a functional circuit, a functional element, and a functional film, for example. For example, the first member 71 can include at least one of a pixel circuit, a pixel driver circuit, a display element, a color filter, and a moisture-proof film of a display device.

The separation apparatus in FIG. 3 includes a plurality of transfer rollers (e.g., transfer rollers 643, 644, and 645), a tape reel 602, a first wind-up reel 603, a direction changing roller 604, a second press roller 605, and a first press roller 606.

The tape reel 602 is an example of the support body supply unit. The tape reel 602 can feed a support body 601 in rolled sheet form. The speed at which the support body 601 is fed is preferably adjustable. When the speed is set relatively low, for example, failure in separation of the process member or a crack in a separated member can be inhibited.

The support body supply unit may feed the support body 601 continuously. The support body 601 can be fed continuously when there is no need of stopping feeding the support body 601 during the process. It is preferable to feed the support body 601 continuously because separation can be performed at a uniform speed and with a uniform force. Note that in the separation process, the separation is preferably performed successively without being stopped, and is more preferably performed with constant velocity. When the separation stops in the middle of the process and then resumes from the same region, distortion or the like occurs in the region, unlike in the case of successive separation. Thus, a minute structure of the region or the characteristics of an electronic device or the like located on the region are changed, which might influence display of a display device, for example.

The support body supply unit may feed the support body 601 intermittently. The support body 601 may be fed intermittently in the case where feeding of the support body 601 needs to be stopped during the process (e.g., see FIGS. 7B to 7D). Note that at least during separation, the support body 601 is preferably fed continuously for a higher yield of separation.

As the support body 601, a film in rolled sheet form made of an organic resin, a metal, an alloy, glass, or the like can be used.

The support body 601 may be a member that is not a constituent of the device to be manufactured (e.g., flexible device), such as a carrier tape. Alternatively, the support body 601 may be a flexible substrate or the like, which is a member that is a constituent of the device to be manufactured, like the first member 71.

The support body hold unit can wind up the support body 601, can wind up the support body 601 and the first member 71, or can hold an end portion of the support body 601, for example. The first wind-up reel 603 is an example of the support body hold unit. The first wind-up reel 603 can wind up the support body 601.

The tape reel 602 includes one of a pair of tension applying mechanisms. The first wind-up reel 603 includes the other of the pair of tension applying mechanisms. The pair of tension applying mechanisms can apply tension to the support body 601.

The plurality of transfer rollers are an example of the transfer mechanism. The plurality of transfer rollers can transfer the process member 70. The mechanism for transferring the process member 70 is not limited to the transfer roller and may be a different transfer mechanism such as a belt conveyor or a transfer robot. Alternatively, the process member 70 may be placed over a stage over the transfer mechanism.

The transfer roller 643, the transfer roller 644, and the transfer roller 645, each of which is one of the transfer rollers that are lined up, are provided at predetermined intervals and rotate in the direction in which the process member 70 (or the second member 72) is sent (the clockwise direction as indicated by solid arrows). The plurality of lined-up transfer rollers are each rotated by a driving portion (e.g., a motor), which is not illustrated.

The direction changing roller 604 is an example of a direction changing mechanism. The direction changing roller 604 can change the feed direction of the support body 601. In the example illustrated in FIG. 3, the direction changing roller 604 is positioned between the tape reel 602 and the first press roller 606.

The second press roller 605 is an example of a pressure applying mechanism. In the examples illustrated in FIG. 3 and FIG. 6, the second press roller 605 is positioned between the direction changing roller 604 and the first press roller 606.

Figure 6:
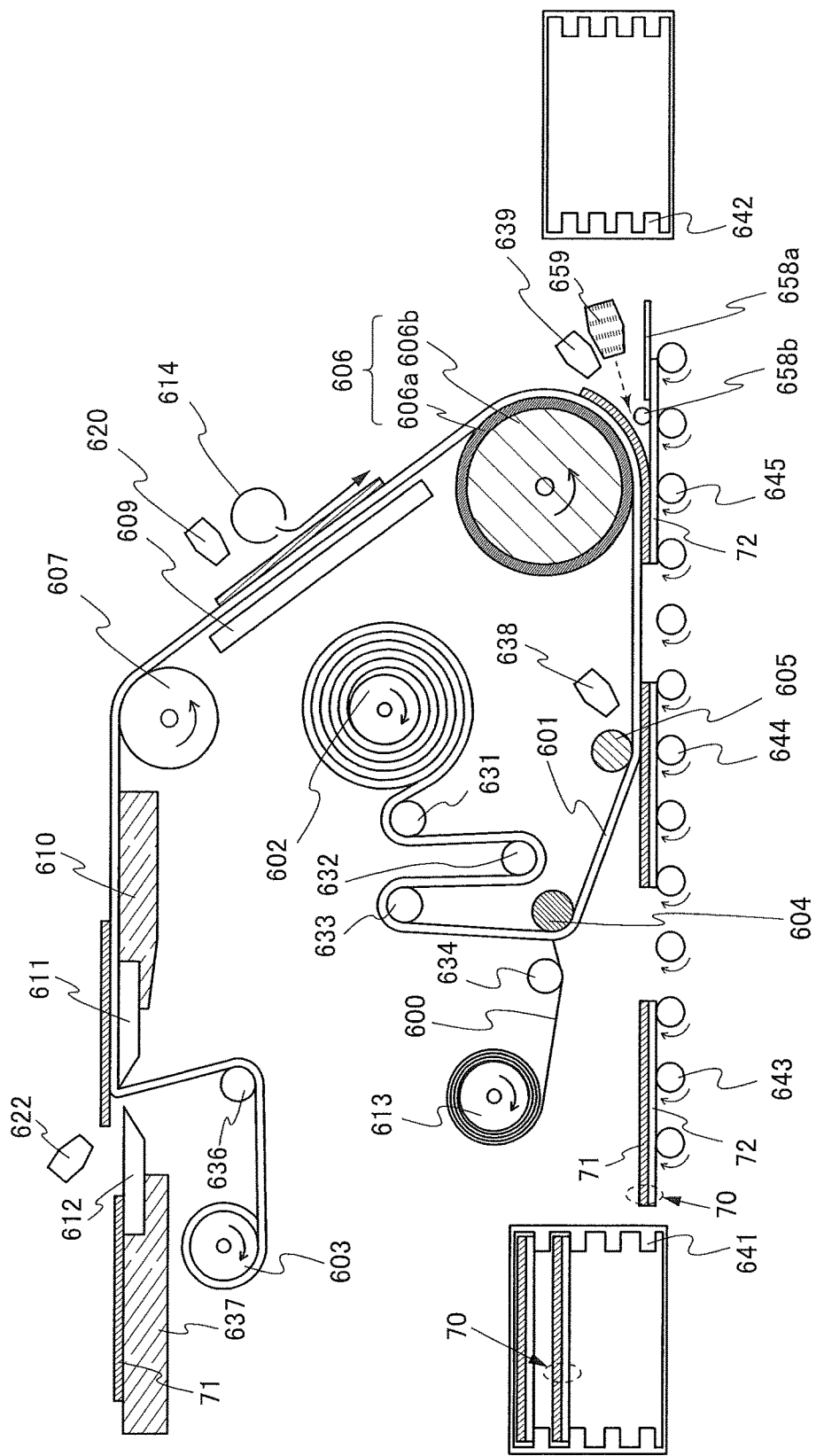
FIG. 6 illustrates an example of a separation apparatus.

In FIG. 3 and FIG. 6, the bottom edge of the direction changing roller 604 is located at a higher level than that of the bottom edge of the second press roller 605. Here, when at least part of the process member 70 is positioned between the direction changing roller 604 and the second press roller 605, a plane including a surface of the first member 71 is called a first plane. With the first plane taken into consideration, the shortest distance between the first plane and the direction changing roller 604 is longer than the shortest distance between the first plane and the second press roller 605.

Such a structure can prevent the support body 601 from being in contact with the first member 71 before reaching the second press roller 605. Accordingly, air bubbles can be inhibited from being trapped between the support body 601 and the first member 71.

The second press roller 605 can bond the process member 70 that is transferred by the transfer roller 644 and the support body 601 that is fed by the tape reel 602 to each other while applying pressure to them. For example, with the use of the transfer roller 644 and the second press roller 605, a bonding surface (or adhesion surface) of the support body 601 that has been exposed by separating a separation tape 600 can be pressed against the process member 70. With the use of the transfer roller 644 and the second press roller 605, a uniform force can be applied to the support body 601 and the process member 70 while the process member 70 is transferred. As a result, the support body 601 and the process member 70 can be bonded to each other. Moreover, air bubbles are prevented from being trapped between the support body 601 and the process member 70.

Figure 4:
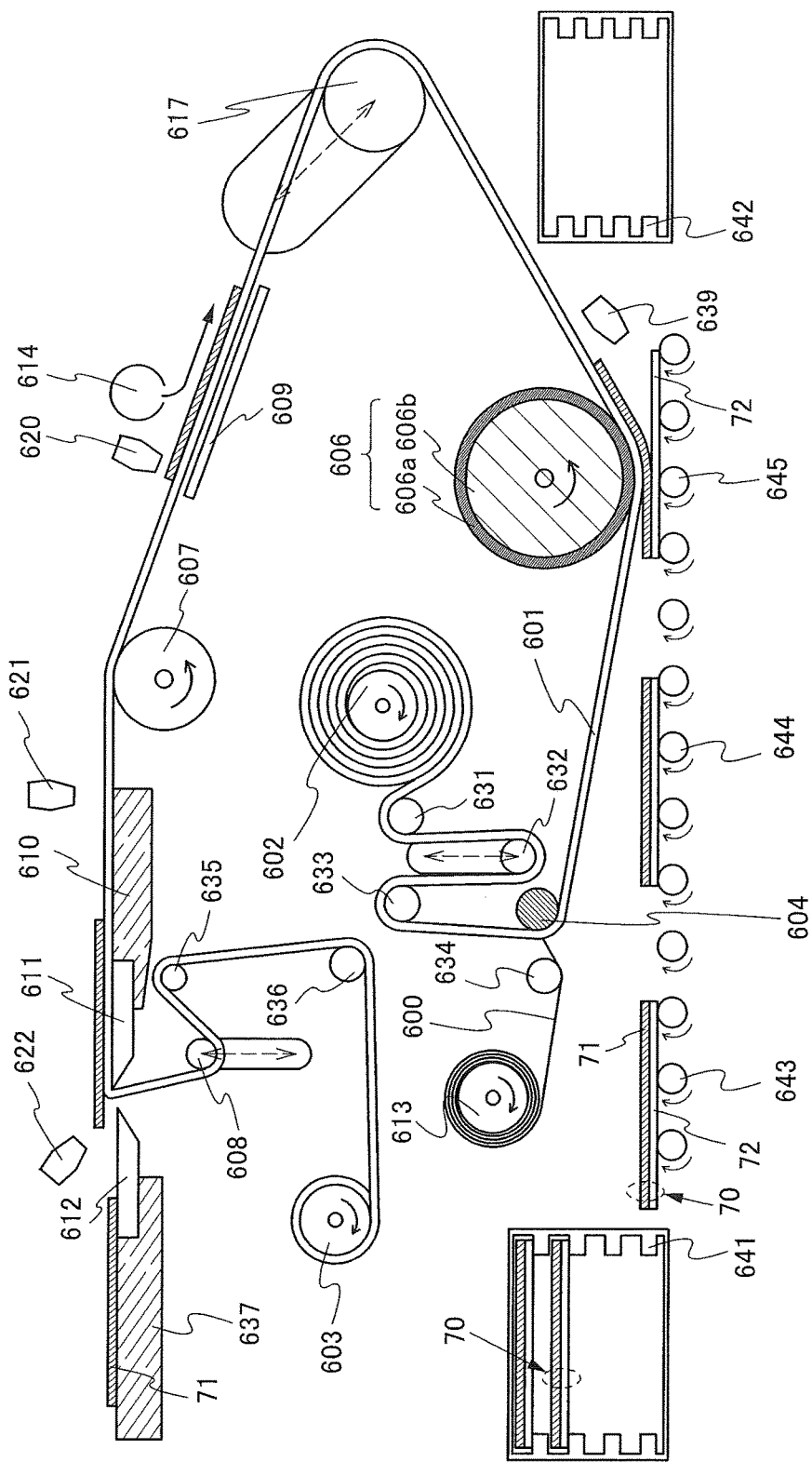
FIG. 4 illustrates an example of a separation apparatus.
Figure 5:
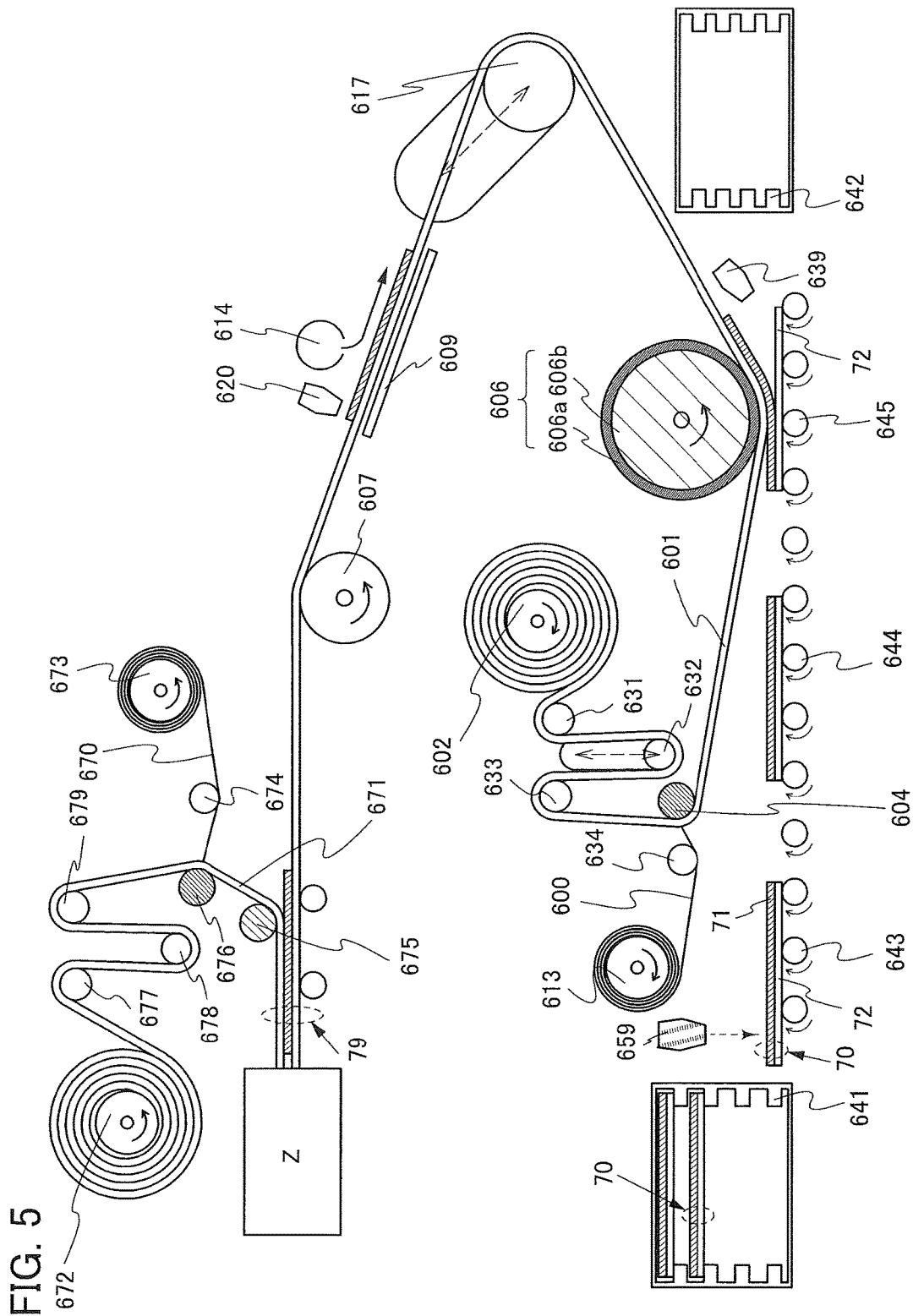
FIG. 5 illustrates an example of a separation apparatus.

Note that the separation apparatuses illustrated in FIG. 4 and FIG. 5 do not include the second press roller 605. The support body 601 is bonded to the first member 71 by the first press roller 606 and the transfer roller 645.

In FIG. 4 and FIG. 5, the bottom edge of the direction changing roller 604 is located at a higher level than that of the bottom edge of the first press roller 606. Here, when at least part of the process member 70 is positioned between the direction changing roller 604 and the first press roller 606, a plane including a surface of the first member 71 is called a first plane. With the first plane taken into consideration, the shortest distance between the first plane and the direction changing roller 604 is longer than the shortest distance between the first plane and the first press roller 606.

Such a structure can prevent the support body 601 from being in contact with the first member 71 before reaching the first press roller 606. Accordingly, air bubbles can be inhibited from being trapped between the support body 601 and the process member 70.

The first press roller 606 is an example of the first structure body having a convex surface. The first press roller 606 is rotated by a driving portion (e.g., a motor) which is not illustrated.

When the first press roller 606 rotates, the force of peeling the first member 71 is applied to the process member 70; thus, the first member 71 is peeled. At this time, the process member 70 preferably has a separation trigger. Separation of the first member 71 starts from the separation trigger. As a result, the process member 70 is divided into the first member 71 and the second member 72.

The mechanism for separating the first member 71 from the process member 70 is not limited to the first press roller 606, and a structure body having a convex surface (or a convex curved surface) is applicable. For example, a cylindrical (e.g., circular cylindrical, right circular cylindrical, elliptic cylindrical, or parabolic cylindrical) or spherical structure body can be used. Furthermore, a roller such as a drum type roller can be used, for example. Examples of the shape of the structure body include a column with a bottom surface whose boundary includes a curved line (e.g., a cylinder with a perfect circle-shaped bottom surface or an elliptic cylinder with an ellipse-shaped bottom surface), and a column with a bottom surface whose boundary includes a curved line and a straight line (e.g., a column with a semicircular bottom surface or a semi-elliptical bottom surface). If the shape of the structure body is any of such columns, the convex surface corresponds to a curved surface of the column.

As a material of the first structure body, a metal, an alloy, an organic resin, rubber, or the like can be used. The first structure body may have a space or a hollow inside. Examples of the rubber include natural rubber, urethane rubber, nitrile rubber, and neoprene rubber. In the case of using rubber, it is preferable to use a material unlikely to be charged by friction or separation or to take countermeasures to prevent static electricity. The first press roller 606 illustrated in FIG. 3 includes, for example, a hollow cylinder 606*a* made of rubber or an organic resin and a cylindrical column 606*b* made of a metal or an alloy and located inside the cylinder 606*a*.

For example, the convex surface of the first structure body can have a radius of curvature of greater than or equal to 0.5 mm and less than or equal to 3000 mm. In the case where a film is separated, for example, the radius of curvature of the convex surface can be greater than or equal to 0.5 mm and less than or equal to 1000 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member.

When the radius of curvature of the convex surface is too small, an element included in the first member 71 which is peeled along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be peeled along the convex surface. For this reason, the radius of curvature of the convex surface is preferably greater than or equal to 300 mm, for example.

When the radius of curvature of the convex surface is too large, the size of the separation apparatus might be increased, which might limit the installation location. For this reason, the radius of curvature of the convex surface is preferably less than or equal to 3000 mm, further preferably less than or equal to 1000 mm, still further preferably less than or equal to 500 mm, for example.

A larger radius of curvature of the convex surface is preferable because the angle α at which the first press roller 606 bends back the support body 601 can be more easily made large. For this reason, the radius of curvature of the convex surface is preferably greater than or equal to 300 mm, for example.

The rotation speed of the first press roller 606 is preferably adjustable. By adjusting the rotation speed of the first press roller 606, the yield of separation can be further increased.

The first press roller 606 and the plurality of transfer rollers may be movable in at least one direction (e.g., upward and downward, rightward and leftward, or forward and backward). The distance between the convex surface of the first press roller 606 and a supporting surface of the transfer roller is preferably adjustable because separation can be performed on process members with various thicknesses.

FIG. 3, FIG. 4, and FIG. 5 each illustrate an example in which the angle α at which the first press roller 606 bends back the support body 601 is an obtuse angle, whereas FIG. 6 illustrates an example in which the angle α is an acute angle.

The separation apparatus in FIG. 3 further includes a flat plate 658a, a roller 658b, a liquid supply mechanism 659, and a roller 617.

The roller 617 is an example of the second structure body with a convex surface. The radius of curvature of the convex surface included in the roller 617 can be, for example, less than or equal to the radius of curvature of the convex surface included in the first press roller 606, and preferably less than the radius of curvature of the convex surface included in the first press roller 606. The roller 617 can send the support body 601 from the first press roller 606 to the first wind-up reel 603 along the convex surface.

The roller 617 can apply tension to the support body 601 by moving the shaft of the roller 617. That is, the roller 617 is also referred to as a tension roller. Specifically, the roller 617 can pull the support body 601 in the feed direction changed with the first press roller 606.

Moving the shaft of the roller 617 enables the roller 617 to control the angle α at which the first press roller 606 bends back the support body 601.

Note that the roller 617 may be movable only in one direction as illustrated in FIG. 4 and FIG. 5. Alternatively, no roller 617 may be provided as illustrated in FIG. 6.

The roller 617 can bend back the support body 601 to change the feed direction of the support body 601. For example, the feed direction of the support body 601 may be changed to the horizontal direction. Alternatively, the following structure may be employed: the roller 617 bends back the support body 601 to changes the feed direction of the support body 601; then, the feed direction of the support body 601 is further changed to the horizontal direction by a direction changing roller 646 (FIG. 3) or a direction changing roller 607 (FIG. 4, FIG. 5, and FIG. 6) located between the roller 617 and the first wind-up reel 603.

The diameters of the direction changing roller 604 and the roller 617 are not limited and, for example, may be smaller than the diameter of the first press roller 606. Materials that can be used for the first press roller 606 can be used for each of the direction changing roller 604 and the roller 617.

The flat plate 658a is an example of the flat-plate-like fixing mechanism 68a and the roller 658b is an example of the roller-like fixing mechanism 68b; thus, the above description can be referred to for the flat plate 658a and the roller 658b. For the liquid feeding mechanism 659, the above description of the liquid supply mechanism 69 can be referred to.

FIG. 3 and FIG. 6 each illustrate an example in which separation is performed while liquid is supplied to the interface between the first member 71 and the second member 72 with the liquid supply mechanism 659. FIG. 4 illustrates an example of the separation apparatus without the liquid supply mechanism 659. FIG. 5 illustrates an example in which liquid is supplied to the interface between the first member 71 and the second member 72 with the liquid supply mechanism 659 before separation.

The separation apparatus of one embodiment of the present invention may further include the following components.

The separation apparatus in FIG. 3 includes guide rollers (e.g., guide rollers 631, 632, and 633), a second wind-up reel 613, a drying mechanism 614, and ionizers (e.g., ionizers 638, 639, 620, and 622).

The separation apparatus may include a guide roller for guiding the support body 601 to the first wind-up reel 603. One guide roller may be provided, or a plurality of guide rollers may be provided. Like the guide roller 632 illustrated in FIG. 4 and FIG. 5, the guide roller may be capable of applying tension to the support body 601.

The separation tape 600 (also called separate film) may be bonded to at least one surface of the support body 601. In this case, the separation apparatus preferably includes a reel that can wind up the separation tape 600 bonded to one surface of the support body 601. The reel is located between the support body supply unit and the support body hold unit. In FIG. 3 and the like, the second wind-up reel 613 is positioned between the tape reel 602 and the second press roller 605. Furthermore, the separation apparatus may include a guide roller 634. The guide roller 634 can guide the separation tape 600 to the second wind-up reel 613.

The separation apparatus may include the drying mechanism 614. Since the functional element (e.g., a transistor or a thin-film integrated circuit) included in the first member 71 is vulnerable to static electricity as described above, it is preferable that liquid be supplied to the interface between the first member 71 and the second member 72 before separation or that the separation be performed while liquid is supplied to the interface. Since watermarks might be formed if the liquid adhered to the first member 71 is vaporized, the liquid is preferably removed immediately after the separation. Thus, immediately after the separation from the second member 72, the first member 71 including a functional element is preferably blow-dried to remove a droplet left on the first member 71. Therefore, generation of watermarks can be suppressed. A carrier plate 609 may be provided to prevent slack in the support body 601.

As illustrated in FIG. 3 and the like, it is preferable that an air flow downward along the inclination of the support body 601 so that the droplet drips down while the support body 601 is transferred in an oblique direction relative to the horizontal plane.

Although the transfer direction of the support body 601 may be perpendicular to the horizontal plane, the transfer direction is preferably tilted relative to the horizontal plane for higher stability and less shaking of the support body 601 being transferred.

During the process, a static eliminator included in the separation apparatus is preferably used at a position where static electricity might be generated. There is no particular limitation on the static eliminator, and for example, a corona discharge ionizer, a soft X-ray ionizer, an ultraviolet ionizer, or the like can be used.

For example, it is preferable that the separation apparatus be provided with an ionizer and static elimination be performed by spraying the first member 71 with air, a nitrogen gas, or the like from the ionizer to reduce adverse effects of static electricity on the functional element. It is particularly preferable to use the ionizer in a step of bonding two members to each other and a step of dividing one member. The separation apparatus illustrated in FIG. 4 includes the ionizer 639, the ionizer 620, an ionizer 621, and the ionizer 622. The separation apparatus illustrated in FIG. 5 includes the ionizers 639 and 620. The separation apparatus illustrated in FIG. 6 includes the ionizers 638, 639, 620, and 622.

For example, the process member 70 is preferably divided into the first member 71 and the second member 72 while the vicinity of the interface between the first member 71 and the second member 72 is irradiated with ions using the ionizer 639 to remove static electricity.

Pressure may be applied while static electricity is removed by irradiation of the vicinity of the interface between the support body 601 and the second press roller 605 with ions using the ionizer 638, for example.

The separation apparatus may include at least one of a substrate load cassette 641 and a substrate unload cassette 642. For example, the process member 70 can be supplied to the substrate load cassette 641. The substrate load cassette 641 can supply the process member 70 to the transfer mechanism or the like. The second member 72 can be supplied to the substrate unload cassette 642.

The process member 70 may be transferred from the substrate load cassette 641 onto the guide roller with the transfer mechanism of the separation apparatus. The second member 72 over the guide roller may be transferred to the substrate unload cassette 642 with the transfer mechanism. In the case where the separation apparatus is connected to a different apparatus, the process member 70 may be transferred from the different apparatus onto the guide roller with the transfer mechanism. In other words, the separation apparatus does not necessarily include the substrate load cassette 641. The second member 72 over the guide roller may be transferred to a different apparatus with the transfer mechanism. In other words, the separation apparatus does not necessarily include the substrate unload cassette 642.

In the separation apparatus of one embodiment of the present invention, the transfer rollers such as the transfer rollers 643, 644, and 645, the first press roller 606, and the like are driving rollers rotated by an electric motor or the like. The rotation speed of the tape reel 602 and that of the first wind-up reel 603 are also adjusted with a motor. These driving rollers, the tape reel 602, and the first wind-up reel 603 adjust the moving speed and tension of the support body 601. For example, the guide rollers 631, 632, 633, and 634, guide rollers 635 and 636, the direction changing roller 604, and a tension roller 608 are driven rollers. Note that in one embodiment of the present invention, whether each roller is a driving roller or a driven roller is not limited to the above and can be determined as appropriate. The roller 617 and the second press roller 605 may each be a driving roller or a driven roller. There is no particular limitation on the number of each kind of roller included in the separation apparatus of one embodiment of the present invention.

In the separation apparatus of one embodiment of the present invention, the first member is separated from the second member in such a manner that a support body is bonded to a process member and the support body is pulled, as described above. Since the process member can be automatically divided with the use of the support body, the processing time can be shortened and the manufacturing yield of products can be improved.

For example, the process member has a structure in which a formation substrate and a functional layer are stacked in this order. The functional layer corresponds to the first member and the formation substrate corresponds to the second member. Here, the support body may be used as a support body of the functional layer. In other words, the support body is not necessarily separated from the first member. A flexible substrate is bonded to the functional layer exposed by being separated from the formation substrate with the use of an adhesive, whereby a flexible device in which the support body, the functional layer, and the flexible substrate are stacked in this order can be manufactured.

Alternatively, the process member has a structure in which a formation substrate, a functional layer, and a flexible substrate are stacked in this order, for example. The functional layer and the flexible substrate correspond to the first member and the formation substrate corresponds to the second member. Since the support body bonded to the flexible substrate is unnecessary after separation, the support body is peeled from the first member. Another flexible substrate is bonded to the functional layer exposed by being separated from the formation substrate with the use of an adhesive, whereby a flexible device in which the flexible substrate, the functional layer, and the flexible substrate are stacked in this order can be manufactured.

Here, when force is applied to the support body for separation of the support body, failure in separation or a crack in the first member might occur depending on the feed speed, feed direction, or the like of the support body.

A structure described below makes it possible to automatically separate the support body and the first member, which enables reduction in the processing time and improvement of the manufacturing yield of the products in the separation apparatus of one embodiment of the present invention.

The separation apparatus in FIG. 3 includes a carrier plate 610, a first wedge-shaped member 611, a second wedge-shaped member 612, a table 637, and the guide roller 636. The separation apparatus in FIG. 4 further includes the tension roller 608 and the guide roller 635.

The guide rollers 635 and 636 guide the support body 601 to the first wind-up reel 603.

The tension roller 608 is located between the roller 617 and the first wind-up reel 603. The tension roller 608 can apply tension in the direction in which the support body 601 is bent back.

As a roller for guiding the support body 601 to the first wind-up reel 603, at least one of the guide rollers 635 and 636 and the tension roller 608 is preferably provided.

The first wedge-shaped member 611 is preferably provided in a position where the support body 601 is bent back with the guide roller 635 or 636 or the tension roller 608. The first wedge-shaped member 611 may be fixed to the carrier plate 610. The first wedge-shaped member 611 has a tapered portion. The angle formed by a flat surface of the carrier plate 610 and the tapered portion of the first wedge-shaped member 611 determines the direction in which the support body 601 is bent back.

The angle of the direction in which the support body 601 is bent back is preferably, but not limited to, an acute angle to facilitate separation of the first member 71 from the support body 601.

The second wedge-shaped member 612 is fixed to the table 637. The first wind-up reel 603 can wind up the support body 601 that has passed between the first wedge-shaped member 611 and the second wedge-shaped member 612.

The table 637 has a flat surface. The first member 71 separated from the support body 601 is placed on the flat surface.

The flat surface of the carrier plate 610 is preferably positioned at a higher level than that of the flat surface of the table 637. In other words, the flat surface of the carrier plate 610 and the flat surface of the table 637 are not on the same plane and are located at different levels in cross section. As long as the flat surfaces are located at different levels, the first wedge-shaped member 611 and the second wedge-shaped member 612 do not necessarily overlap with each other when seen from above. In the case where the first wedge-shaped member 611 and the second wedge-shaped member 612 overlap with each other, a tip of the second wedge-shaped member 612 is located below the first wedge-shaped member 611.

Note that in the case where the support body 601 and the first member 71 are not separated, the feed direction of the support body 601 may be changed to the horizontal direction with the direction changing roller 607 or the tension roller 617, and then, the first member 71 and a support body 671 may be bonded to each other with an adhesive as illustrated in FIG. 5. As a result, a stack 79 in which the support body 601, the first member 71, and the support body 671 are stacked in this order can be manufactured.

A tape reel 672 can feed the support body 671 in rolled sheet form. For the support body 671, a material similar to that for the support body 601 can be used.

The tape reel 672 includes one of a pair of tension applying mechanisms. The other of the pair of tension applying mechanisms is located in the region Z in FIG. 5 (see FIGS. 7A to 7D). Specifically, a third wind-up reel 683 shown in FIG. 7A and a support body hold unit 663 and a fixing mechanism 156a shown in FIG. 7B include the other of the pair of tension applying mechanisms. The pair of tension applying mechanisms can apply tension to the support body 671. Note that the tension applying mechanism included in the third wind-up reel 683 or the support body hold unit 663 or the fixing mechanism 156a shown in FIG. 7B is also paired with the tension applying mechanism included in the tape reel 602.

The separation apparatus may include guide rollers (e.g., guide rollers 677, 678, and 679 in FIG. 5) for guiding the support body 671 to the third wind-up reel 683.

A direction changing roller 676 can change the feed direction of the support body 671.

In FIG. 5, the bottom edge of the direction changing roller 676 is located at a higher level than that of the bottom edge of the third press roller 675. Here, when at least part of the first member 71 is positioned between the direction changing roller 676 and the third press roller 675, a plane including a surface of the first member 71 is called a first plane. With the first plane taken into consideration, the shortest distance between the first plane and the direction changing roller 676 is longer than the shortest distance between the first plane and the third press roller 675.

Such a structure can prevent the support body 671 from being in contact with the first member 71 before reaching the third press roller 675. Accordingly, air bubbles can be inhibited from being trapped between the support body 671 and the first member 71.

The third press roller 675 can bond the first member 71 to the support body 671 that is fed by the tape reel 672 while applying pressure to them. Accordingly, trapping of air bubbles between the support body 671 and the first member 71 can be inhibited.

A separation tape 670 may be bonded to at least one surface of the support body 671. A reel 673 can wind up the separation tape 670. A guide roller 674 can guide the separation tape 670 to the reel 673.

The manufactured stack 79 may be wound up or cut in the region Z shown in FIG. 5. Structure examples of the region Z shown in FIG. 5 are illustrated in FIGS. 7A to 7D.

Figure 7A:
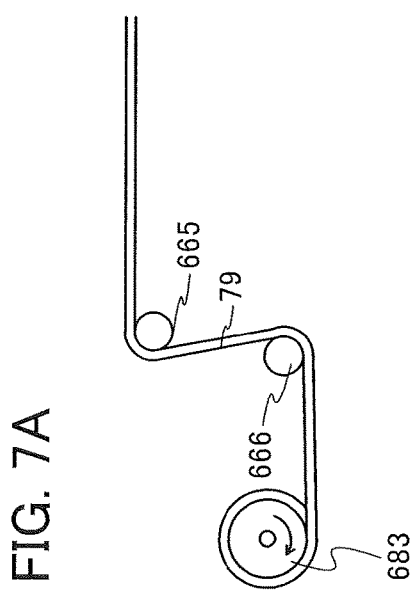
FIGS. 7A to 7D illustrates an example of a separation apparatus.
Figure 7B:
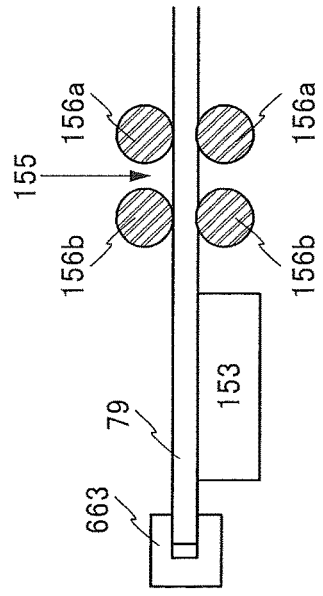

FIG. 7A illustrates an example in which the third wind-up reel 683 winds up the stack 79. A guide roller for guiding the stack 79 to the third wind-up reel 683 (e.g., guide rollers 665 and 666) may be provided.

Figure 7C:
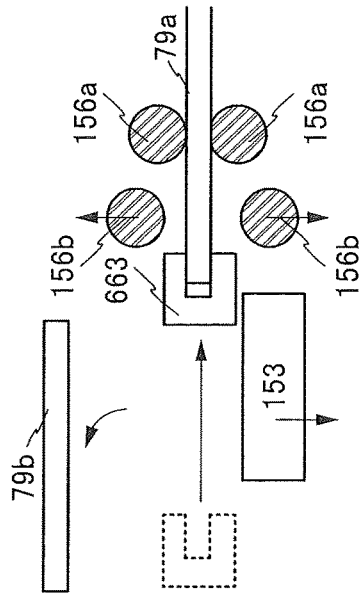
Figure 7D:
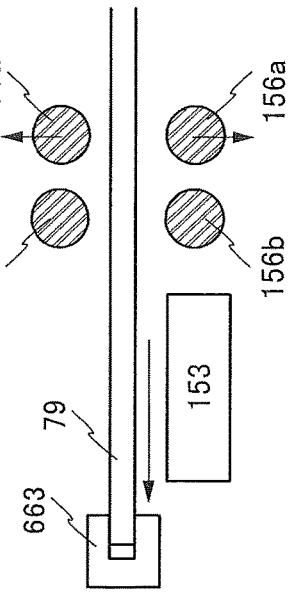

FIGS. 7B to 7D illustrates an example in which the stack 79 is cut.

As illustrated in FIG. 7B, the end portion of the stack 79 is held by the support body hold unit 663. The pair of tension applying mechanisms included in the support body hold unit 663 and the tape reel 602 applies tension to the stack 79 before being cut, so that the stack 79 can remain at rest. Note that it is preferable to stop feeding the support body 601 and the support body 671 when the stack 79 is cut. In other words, the tape reel 602 and the tape reel 672 preferably feed the support bodies intermittently. The stack 79 before being cut is also fixed by the fixing mechanism 156a and a fixing mechanism 156b.

The stack 79 is cut using a cutting mechanism 155. The cutting mechanism 155 cuts the stack 79 between the fixing mechanism 156a and the fixing mechanism 156b.

After the stack 79 is cut into a stack 79a and a stack 79b, the stack 79a is fixed by the fixing mechanism 156a and the tape reel 602 and the stack 79b is fixed by a stage 153 and the fixing mechanism 156b.

As illustrated in FIG. 7C, after the stack 79 is cut, the stage 153, the fixing mechanism 156b, and the support body hold unit 663 move away from the stack 79b. Thus, the stack 79b including the support body 601, the first member 71, and the support body 671 can be taken out from the separation apparatus. The separation apparatus may include a transfer mechanism or a carry-out unit for the stack 79b. In one embodiment of the present invention, the stacks can be manufactured with high productivity. One embodiment of the present invention can also be regarded as a stack manufacturing apparatus that performs a separation process and a bonding process.

The support body hold unit 663 moves to clamp the end portion of the stack 79a held by the fixing mechanism 156a.

Then, the fixing mechanism 156a moves away from the stack 79a as illustrated in FIG. 7D. After that, feeding of the support body 601 and feeding the support body 671 resume. Meanwhile, the process member is divided, for example. After certain amounts of the support body 601 and the support body 671 are sent, feeding is stopped. Then, the operation returns to the state shown in FIG. 7B.

The stage 153 is movable in at least one direction (e.g., upward and downward, rightward and leftward, or forward and backward). Examples of the fixing mechanism for fixing the stack 79 placed over the stage 153 include a chuck such as a suction chuck, an electrostatic chuck, a mechanical chuck, or a porous chuck, and a table such as a suction table, a heater table, or a spinner table.

The cutting mechanism 155 is not particularly limited as long as it can cut the stack 79; for example, a sharp edge tool such as a cutter or a laser can be used.

The fixing mechanisms 156a and 156b are not particularly limited as long as they can fix the stack 79; for example, clips can be used. The fixing mechanisms 156a and 156b are movable in at least one direction (e.g., upward and downward, rightward and leftward, or forward and backward).

[Process Example]

A process in which a process member is divided into a first member and a second member with the use of the separation apparatus in FIG. 3 is described with reference to FIGS. 8A to 8E, FIGS. 9A to 9C, and FIGS. 10A to 10C.

In mass production of flexible devices, a layer to be separated which includes a transistor, a display device, or the like is formed over a large-area formation substrate and is automatically separated from the formation substrate, whereby shorter processing time and a higher manufacturing yield of the products can be achieved. In addition, manufacturing cost of the products can be reduced.

In this embodiment, an example using a large-area formation substrate, which is cut into four parts later, is described. Note that in one embodiment of the present invention, the size of the formation substrate is not limited, and the formation substrate is not necessarily cut. The formation substrate may be cut into any number of parts.

In this process example, the process member 70 includes a glass substrate 401, an insulating layer 402, a separation layer 403, an insulating layer 404, a layer 405 including a transistor, and a flexible substrate 406 which are stacked in this order. The glass substrate 401, the insulating layer 402, and the separation layer 403 correspond to the second member 72, and the insulating layer 404, the layer 405 including a transistor, and the flexible substrate 406 correspond to the first member 71.

First, the large glass substrate 401 is prepared as a formation substrate. When a formation substrate is large, the number of products per formation substrate is also large, resulting in reduced manufacturing costs. Although there is no particular limitation on the size of the formation substrate, a glass substrate with a size of 1850 mm×1500 mm, 1850 mm×750 mm, 1500 mm×925 mm, or 720 mm×600 mm is used, for example.

There is no particular limitation on the formation substrate as long as the formation substrate has heat resistance high enough to withstand a manufacturing process and a thickness and a size which can be used in a manufacturing apparatus. Examples of materials that can be used for the formation substrate include glass, quartz, sapphire, ceramics, metal, an inorganic material, and an organic material. For example, a semiconductor wafer or a steel plate may be used.

Next, the insulating layer 402 is formed over the glass substrate 401. The insulating layer 402 has a function of preventing the glass substrate 401 from being etched at the time of etching the separation layer 403, which is formed later. Alternatively, the insulating layer 402 has a function of preventing diffusion of impurities contained in the glass substrate 401. The insulating layer 402 can be formed using one or more films selected from a silicon nitride film, a silicon oxide film, a silicon nitride oxide film, and a silicon oxynitride film.

After the separation layer 403 is formed, it is selectively etched to remove at least part of the separation layer 403 which is over the periphery part of the substrate.

Examples of a material that can be used for the separation layer 403 include an inorganic material and an organic material.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. The crystal structure of a layer containing silicon may be amorphous, microcrystal, or polycrystal.

Specific examples of the organic material include polyimide, polyester, polyolefin, polyamide, polycarbonate, and an acrylic resin.

The separation layer 403 may have a single-layer structure or a stacked-layer structure.

In the case where the separation layer 403 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. It is to be noted that a mixture of tungsten and molybdenum is an alloy of tungsten and molybdenum, for example.

In the case where the separation layer 403 has a stacked-layer structure, a stacked-layer structure including a layer containing tungsten and a layer containing an oxide of tungsten can be employed, for example.

The layer containing an oxide of tungsten may be formed by stacking another layer with a layer containing tungsten; for example, the layer containing an oxide of tungsten may be formed by stacking a film containing oxygen, such as a silicon oxide film or a silicon oxynitride film, over a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

The separation layer 403 can be formed by a sputtering method, a plasma CVD method, a coating method, a printing method, or the like. Note that a coating method includes a spin coating method, a droplet discharge method, and a dispensing method.

Note that the separation layer is not necessarily provided in the case where separation at an interface between the formation substrate and the layer to be separated is possible. For example, a glass substrate is used as the formation substrate, an organic resin such as polyimide, polyester, polyolefin, polyamide, polycarbonate, or acrylic is formed in contact with the glass substrate, and the insulating layer 404, the layer 405 including a transistor, and the like are formed over the organic resin. In this case, locally heating the organic resin by laser light or the like enables separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated. At this time, the organic resin can be used as a substrate of a device such as a light-emitting device. Alternatively, the organic resin may be attached to a substrate with an adhesive.

Figure 8A:
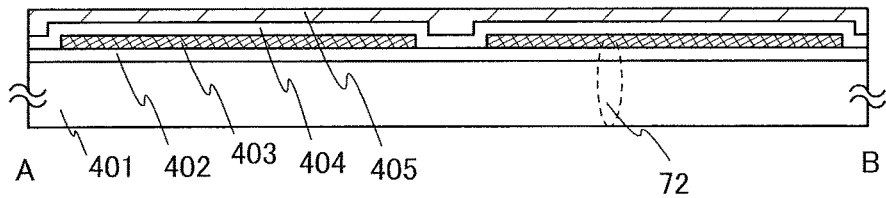
FIGS. 8A to 8E illustrate an example of a separation apparatus.
Figure 9A:
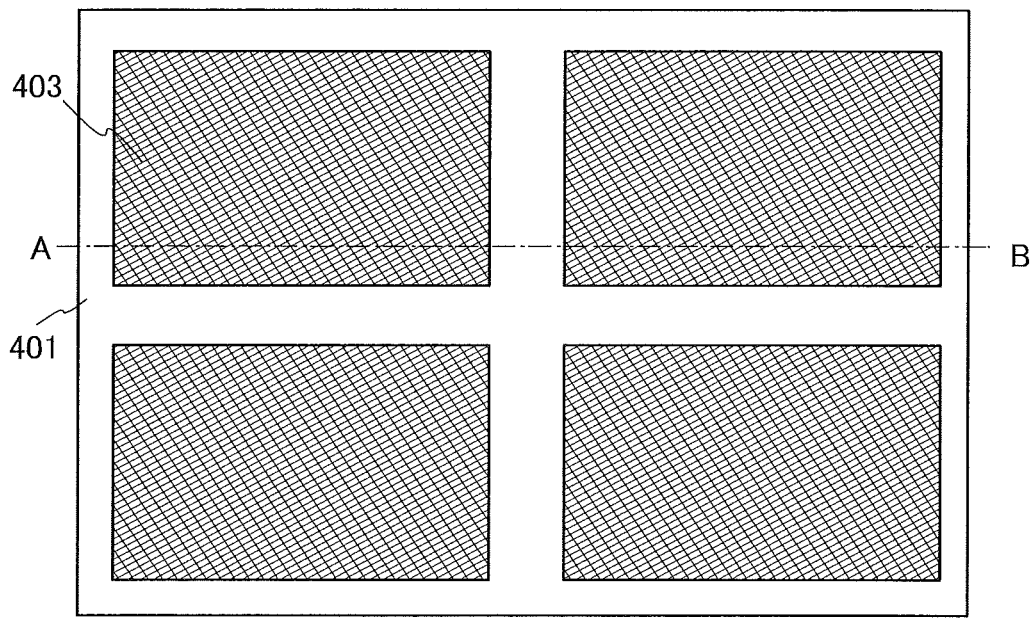
FIGS. 9A to 9C illustrate an example of a separation apparatus.

Then, the insulating layer 404 is formed, and the layer 405 including a transistor is formed thereover (FIG. 8A). FIG. 9A is a plan view of the glass substrate 401. A cross-sectional view taken along a dashed-dotted line A-B in FIG. 9A corresponds to FIG. 8A. Note that in the plan view, some components are not shown.

The insulating layer 404 can be formed using, for example, one or more films selected from a silicon nitride film, a silicon oxide film, a silicon nitride oxide film, and a silicon oxynitride film.

In this embodiment, the separation layers 403 are formed in four positions as illustrated in FIG. 9A. Note that in one embodiment of the present invention, the separation layer 403 may be formed in one position and the layer 405 including a plurality of transistors may be formed over the separation layer 403.

Next, the glass substrate 401 is cut into four parts with a scriber, a breaker, or the like. After that, the flexible substrate 406 is placed so that the layer 405 including a transistor is positioned between the glass substrate 401 and the flexible substrate 406. Note that the glass substrate 401 is not necessarily cut when the glass substrate 401 is small enough for the separation apparatus of one embodiment of the present invention to perforin separation.

For example, the flexible substrate 406 can be bonded to the layer 405 including a transistor with an adhesive layer positioned therebetween. For the adhesive layer, a glass layer with a melting point of 400° C. or lower, preferably 300° C. or lower, an adhesive, or the like can be used.

Examples of the adhesive include a light curable adhesive such as a UV curable adhesive, a reactive curable adhesive, a heat curable adhesive, and an anaerobic adhesive. A sheet-like adhesive is preferably used because the manufacturing process can be shortened and the manufacturing apparatus can be simplified.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

As an example of the flexible substrate, a substrate with flexibility that uses a material similar to that for the formation substrate can be given.

Figure 8B:
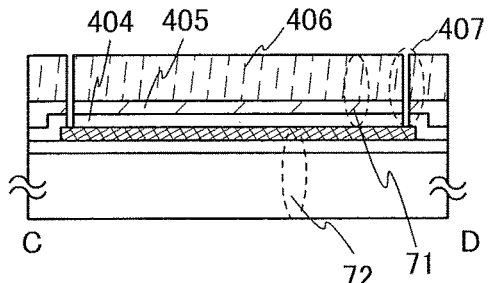
Figure 9B:
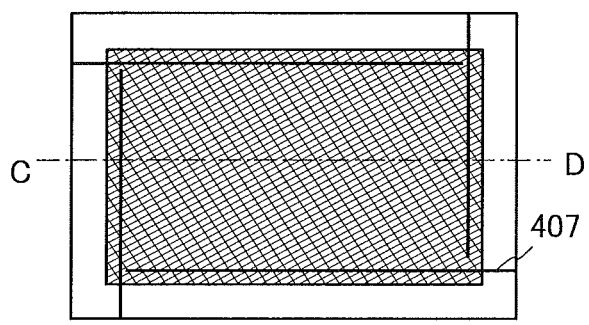

Next, a groove 407 serving as a separation trigger is formed. Here, the groove 407 is formed by laser light (FIG. 9B). The groove 407 where the separation layer 403 is exposed is formed by the laser light. FIG. 8B is a cross-sectional view taken along a dashed-dotted line C-D in FIG. 9B.

The separation trigger can be formed with any of a variety of lasers or a sharp knife such as a cutter. For example, the separation trigger can be formed by inserting a sharp tip into the separation layer 403 and the insulating layer 404. Alternatively, the separation trigger can be formed by separation part of the insulating layer 404 from the separation layer 403 by a noncontact method using a laser or the like (e.g., a laser ablation method). The separation trigger can be formed to have a point-like shape or a linear shape (including a solid line shape, a dashed line shape, and a frame-like shape).

In one embodiment of the present invention, the groove may be formed by irradiating the periphery of the separation layer 403 with laser light without a break. It is thus preferable to provide areas where the grooves 407 are not formed at the four corners of the periphery of the separation layer 403 as illustrated in FIG. 9B. Here, two adjacent grooves preferably have a distance of, for example, 1 cm or more and 2 cm or less therebetween. However, when the groove is formed in the periphery of the separation layer 403 without a break, separation might start immediately after that, causing the entire region surrounded by the groove to be peeled. In addition, if part of the region surrounded by the groove is peeled at the time of the formation of the groove in the periphery of the separation layer 403 without a break, it might be difficult to attach a support film in a later step.

Figure 8C:
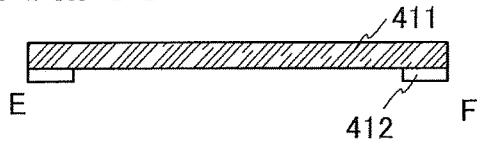
Figure 8D:
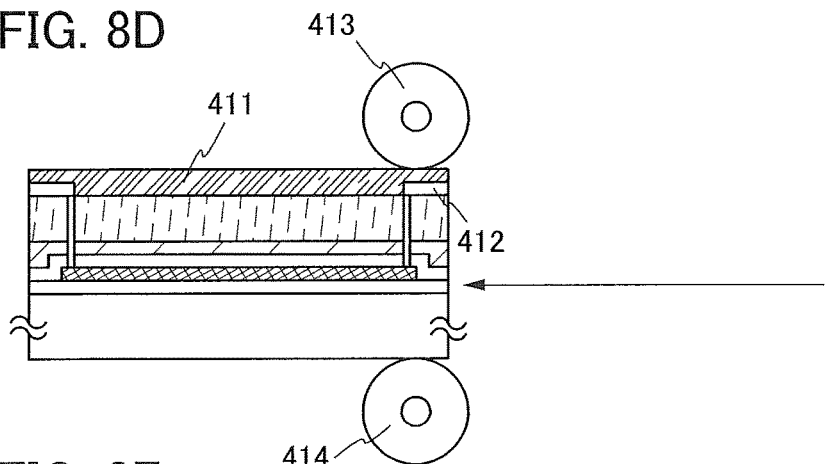
Figure 9C:
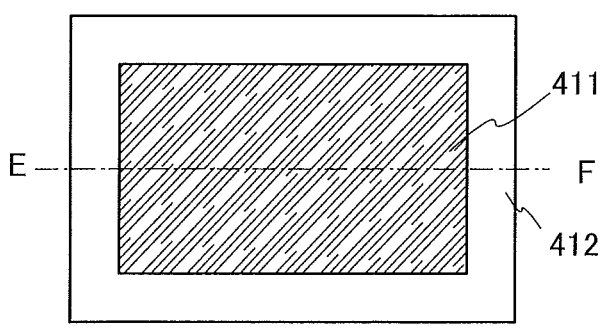

Next, a support film 411 is bonded to the flexible substrate 406. The support film 411 is not necessarily bonded. One surface of the support film 411 is provided with a protective sheet. The protective sheet is peeled to expose an adhesion surface of the support film 411. In this embodiment, a protective sheet 412 remains in the periphery of the support film 411 so that the center of the support film 411 is exposed as illustrated in FIG. 9C. FIG. 8C is a cross-sectional view taken along the dashed-dotted line E-F in FIG. 9C that is a plan view. Note that the protective sheet 412 is preferably bonded so as to overlap the groove 407. The support film 411 can be uniformly bonded to the flexible substrate 406 by being passed through between a pair of rollers 413 and 414, as illustrated in FIG. 8D.

Note that the support film 411 is not particularly limited as long as it is a pressure sensitive one-side adhesive tape, and can be a film made of polyethylene or the like (e.g., a PET film), a polypropylene film, or the like. The support film 411 not only prevents electrostatic breakdown but also functions as a support of the layer 405 including a transistor.

Figure 8E:
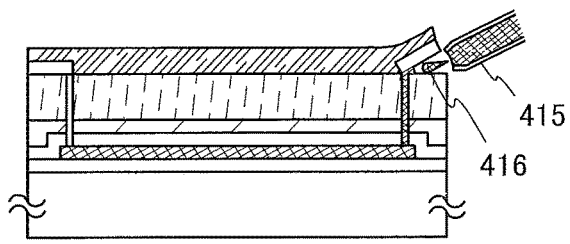

Next, as illustrated in FIG. 8E, a droplet 416 may be supplied to the groove 407 with an injector 415 which is in the form of a dropper or a syringe. Note that even when the amount of the droplet 416 to be supplied is small, static electricity generation in a later separation process can be inhibited. Portions which are overlapped with the support film 411 with the protective sheet 412 positioned therebetween (i.e., portion overlapping the groove 407 and a region outside thereof) are not bonded to the flexible substrate 406. The droplet 416 is injected to a space between the protective sheet 412 and the flexible substrate 406 with the injector 415.

In the case where the separation apparatus of one embodiment of the present invention includes the liquid supply mechanism 659 illustrated in FIG. 3, the droplet 416 is not necessarily injected.

In addition, if necessary, pretreatment in which pressure is applied along the groove 407 with a sharp tool such as a knife may be performed before the injection of the droplet 416 into the groove 407 for the purpose of smooth separation.

Next, the glass substrate 401 provided with the support film 411 is set in the substrate load cassette 641 in the separation apparatus of one embodiment of the present invention. After that, the glass substrate 401 is placed on the transfer roller 643 with the use of a substrate transfer mechanism (not illustrated). The glass substrate 401 on the transfer roller 643 is transferred to the substrate unload cassette 642 though the transfer rollers 644 and 645.

Figure 10A:
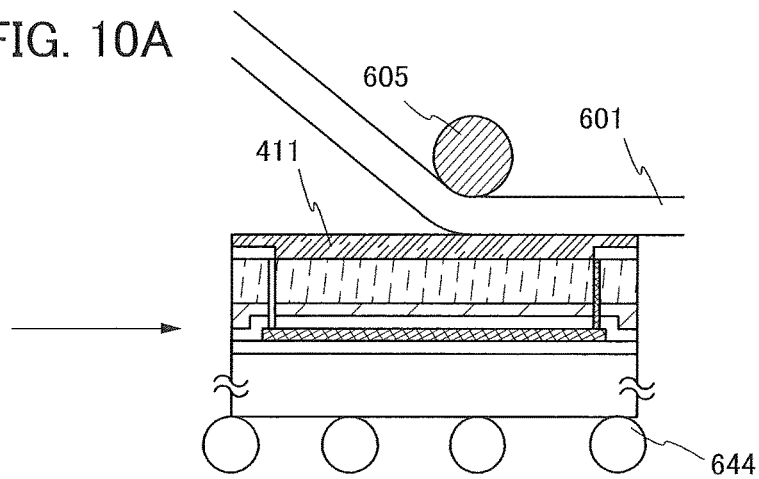
FIGS. 10A to 10C illustrate an example of a separation apparatus.

While the glass substrate 401 is transferred by the transfer roller 644, the support body 601 is bonded to the support film 411 as illustrated in FIG. 10A. The support body 601 is fed from the tape reel 602 and is guided to the first wind-up reel 603 by the guide rollers 631, 632, and 633, and the like.

The separation tape 600 is separated from the support body 601 fed from the tape reel 602 to expose a bonding surface of the support body 601, and then the support body 601 is bonded to the support film 411. The separation tape 600 is separated by being pulled by the second wind-up reel 613 through the guide roller 634. The support body 601 with the exposed bonding surface is bent back and pulled by the first press roller 606 rotated by a driving portion (e.g., a motor).

As illustrated in FIG. 10A, the bonding surface of the support body 601 which is exposed after separation of the separation tape 600 is pressed against the support film 411 by the second press roller 605 and the transfer roller 644.

The glass substrate 401 to which the support film 411 is bonded is transferred to the position where the first press roller 606 overlaps with the groove 407 by the plurality of transfer rollers. The first press roller 606 rotates while pressing the glass substrate 401, so that the layer 405 including a transistor is peeled from the glass substrate 401 because of a difference between the adhesive strength between the glass substrate 401 and the separation layer 403 and the adhesive strength between the support body 601 and the support film 411.

Note that the adhesive strength between the support film 411 and the layer 405 including a transistor is stronger than that between the support body 601 and the support film 411. However, the separation process does not depend on the adhesive strength of the support body 601.

In addition, the first press roller 606 applies pressure at which the glass substrate 401 is not broken. For example, the thickness of the glass substrate 401 serving as a support substrate is 0.7 mm and the thickness of the support body 601 is 0.1 mm Setting the distance between the second press roller 605 and the transfer roller 644 to less than 0.75 mm might cause the breakage of the glass substrate 401.

A rubber member is preferably used for the first press roller 606 and the second press roller 605 in order to prevent the breakage of the glass substrate 401. The use of rubber enables more uniform pressure application than the use of a metal.

The angle α at which the first press roller 606 bends back the support body 601 is an obtuse angle, as described above. Separation at an interface with low adhesion in the process member 70 is thus inhibited and the process member 70 can be divided into the first member 71 and the second member 72 with a high yield.

When separation from the glass substrate 401 is completed after separation, the liquid remains on the layer 405 including a transistor. For this reason, the layer 405 including a transistor is blow-dried from one direction while being held oblique to the horizontal plane, preferably at an angle of approximately 60° so that the liquid is dripped down.

After the blow-dry, the support body 601 that has been moved obliquely is made to move in the horizontal direction with the roller changing the feed direction of the support body 601 into the horizontal direction.

After the separation process, the support body 601 which moves in the horizontal direction again is made in contact with the tip of the first wedge-shaped member 611 fixed to the carrier plate 610 and the support body 601 is bent back along the tip, whereby the layer 405 including a transistor is separated from the support body 601.

Figure 10B:
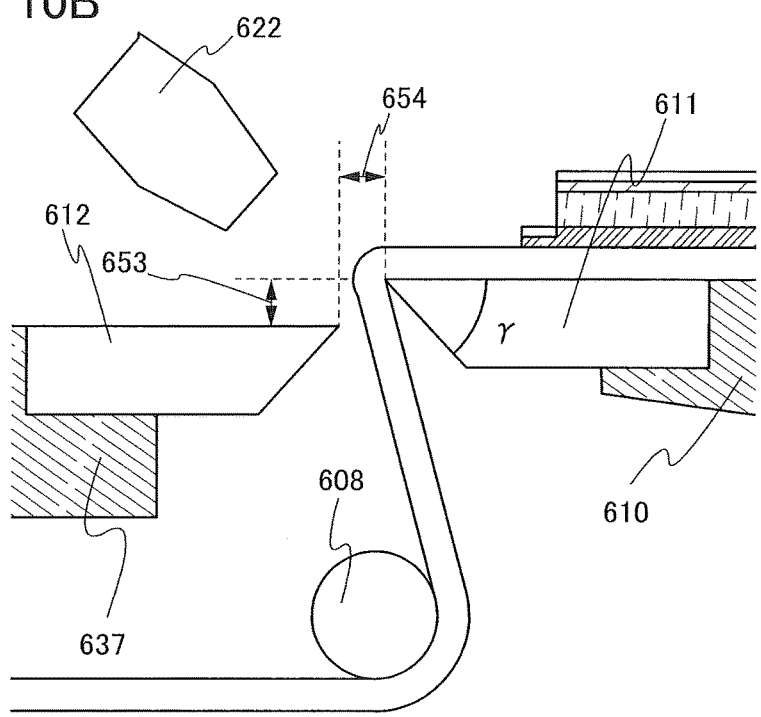

FIG. 10B is an enlarged view of the tip of the first wedge member 611 and the surroundings thereof in FIG. 3.

An angle γ of the tip of the first wedge-shaped member 611 is preferably an acute angle of less than 90° with respect to a plane which is horizontal to the flat surface of the carrier plate 610 (the plane is indicated by a virtual dotted line) illustrated in FIG. 10B. In that case, the first member 71 can be easily separated from the support body 601. The tip of the first wedge-shaped member 611 is made to be sharp or thin, so that the support body 601 can be peeled without fail. Note that the support body 601 is not cut by the tip of the first wedge-shaped member 611.

The tension of the support body 601 is controlled by the tension roller 608. The shaft of the tension roller 608 can move up and down, and the tension of the support body 601 can be adjusted by changing the position of the shaft of the tension roller 608. The support body 601 that has been separated by being bent back along the tip of the first wedge-shaped member 611 is guided to the first wind-up reel 603 by the guide rollers 635 and 636.

The table 637 with the flat surface on which the layer 405 including a transistor which has been separated from the support body 601 is placed is provided with the second wedge-shaped member 612. It is important that a surface parallel to the flat surface of the table 637 does not align with a surface parallel to the flat surface of the carrier plate 610, that is, the surfaces are not at the same level. If the surfaces are at the same level, the layer 405 including a transistor might be turned back together with the support body 601 and might not be separated from the support body 601. In this embodiment, as illustrated in FIG. 10B, the surface parallel to the flat surface of the table 637 and the surface parallel to the flat surface of the carrier plate 610 are located at different levels so that the former is lower than the latter. A level difference 653 between the surfaces is set to approximately 2 mm; however, it is not limited thereto. The level difference 653 also depends on the thickness and material of the support body 601, a distance 654 between the first wedge-shaped member 611 and the second wedge-shaped member 612, and the like, and thus is set as appropriate in consideration of these elements.

In this embodiment, the distance 654 between the first wedge member 611 and the second wedge member 612 is set to 2 mm; however, the distance 654 is not particularly limited thereto. If the first wedge member 611 and the second wedge member 612 have a difference in level, they may partly overlap each other when seen from the above.

The structure illustrated in FIG. 10B enables the support body 601 to be separated stably without excessive load on the layer 405 including a transistor.

Figure 10C:
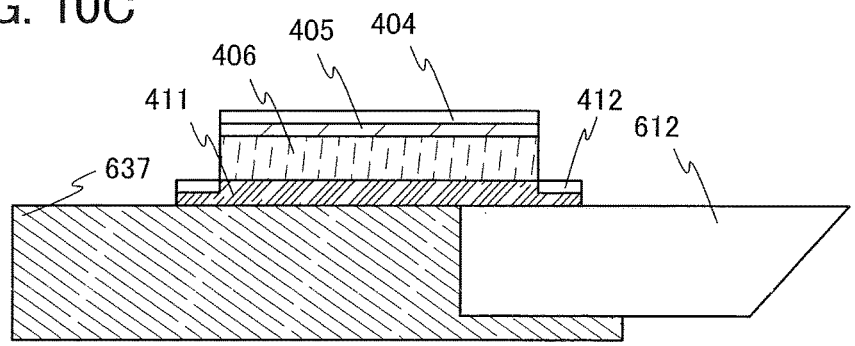

The layer 405 including a transistor which is separated from the support body 601 is placed on the table 637 so that the support film 411 is in contact with the table 637. FIG. 10C illustrates a state in which the layer 405 including a transistor is placed on the table 637 after being separated from the support body 601. As illustrated in FIG. 10C, a stack which includes the flexible substrate 406, the layer 405 including a transistor, and the insulating layer 404 over the support film 411 is placed on the table 637 with a rear surface of the insulating layer 404 exposed. In addition, the protective sheet 412 is provided in the periphery of the support film 411. The flexible substrate 406, the layer 405 including a transistor, and the insulating layer 404 do not overlap with an exposed surface of the protective sheet 412.

In this manner, with the use of the separation apparatus of one embodiment of the present invention, the process member can be divided into the first member and the second member with a high yield. The separation apparatus of one embodiment of the present invention does not require a complicated structure and can be used for the separation of process members with a variety of sizes.

Separation can be performed by a worker manually but in that case, experience is required for a high speed and a high yield of separation. Thus, automation using the separation apparatus of one embodiment of the present invention is important. When separation of a process member is automated with the separation apparatus of one embodiment of the present invention, transfer and separation of the process member at a certain speed and separation with uniform force can be performed, which can inhibit failure of separation and crack caused in a separated member.

Note that one embodiment of the present invention is applicable to not only a separation apparatus but also a transfer apparatus or a bonding apparatus. For example, the first member 71 or the process member 70 can be transferred to the support body 61 illustrated in FIGS. 1A to 1E. There is no particular limitation on the materials and number of layers of the film to be transferred to the support body 61. As the film, any of a variety of functional films and functional elements, such as an EL layer, an inorganic insulating film, and a semiconductor element, can be employed. Alternatively, the first member 71 or the process member 70 can be bonded to the support body 61 illustrated in FIGS. 1A to 1E. When the first member 71 is transferred or bonded, the process member 70 is divided into the first member 71 and the second member 72. When the process member 70 is transferred or bonded, the first structure body 60 with a convex surface (see FIG. 2A and the like) is not necessarily provided.

This embodiment can be combined with any other embodiment as appropriate.

[Embodiment 2]

In this embodiment, a stack manufacturing apparatus of one embodiment of the present invention is described with reference to FIG. 11 and FIGS. 12A to 12E.

The stack manufacturing apparatus of one embodiment of the present invention includes a first supply unit configured to supply a process member having a sheet-like shape, a first separation unit configured to be supplied with the process member and divide the process member into one surface layer and a first remaining portion, a support body supply unit configured to supply a first support body having a sheet-like shape, a first bonding unit configured to be supplied with the first remaining portion and the first support body and bond the first remaining portion and the first support body to each other with a first adhesive layer, and a first unloading unit configured to unload a first stack including the first remaining portion, the first adhesive layer, and the first support body. The first separation unit includes the separation apparatus described in Embodiment 1.

The stack manufacturing apparatus having the above structure manufactures a stack using the sheet-like process member supplied to the first supply unit. The first separation unit separates the process member into the one surface layer and the first remaining portion. The first bonding unit bonds the first remaining portion and the sheet-like first support body supplied from the support body supply unit to each other with the first adhesive layer. Then, the first unloading unit unloads the first stack including the first remaining portion, the first adhesive layer, and the first support body.

Figure 11:
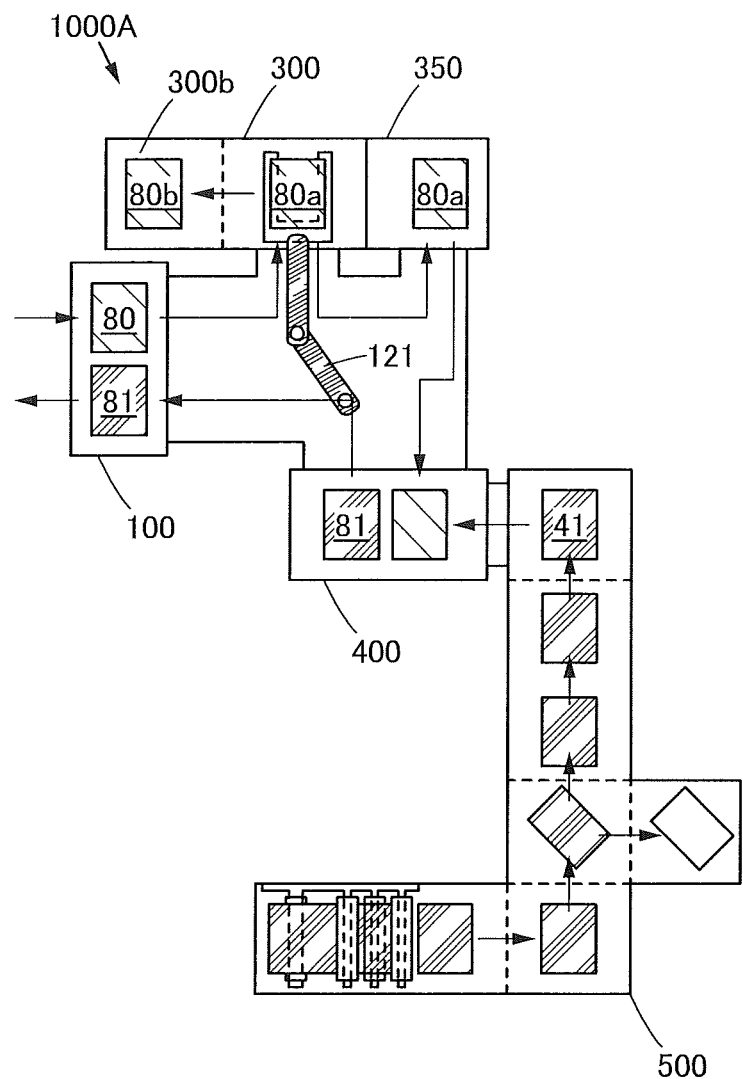
FIG. 11 illustrates a stack manufacturing apparatus.

FIG. 11 is a schematic diagram illustrating a structure of a stack manufacturing apparatus 1000A of one embodiment of the present invention, and a transfer path of a process member and a stack in a process.

FIGS. 12A to 12E are schematic views illustrating a process for manufacturing a stack with the use of the stack manufacturing apparatus 1000A of one embodiment of the present invention. FIGS. 12A, 12B, 12D, and 12E each illustrate a plan view and a cross-sectional view taken along dashed-dotted line X1-X2 in the plan view. FIG. 12C illustrates only a cross-sectional view.

The stack manufacturing apparatus 1000A described in this embodiment includes a first supply unit 100, a first separation unit 300, a first bonding unit 400, and a support body supply unit 500 (FIG. 11).

Note that each unit can be named freely, and the name does not limit the function of each unit.

In this embodiment, an example in which the first separation unit 300 includes the separation apparatus of one embodiment of the present invention that is described in Embodiment 1 is described.

The first supply unit 100 can supply a process member 80. Note that the first supply unit 100 can also serve as a first unloading unit.

The first separation unit 300 can separate one surface layer 80b and a first remaining portion 80a of the process member 80 from each other (FIG. 11 and FIGS. 12A to 12C).

Note that in this specification, the surface layer may have a stacked-layer structure instead of a single-layer structure as long as it includes an outermost layer. For example, the one surface layer 80b in FIG. 12A corresponds to a first substrate 11 and a first separation layer 12.

The first bonding unit 400 is supplied with the first remaining portion 80a and a first support body 41. The first bonding unit 400 bonds the first support body 41 and the first remaining portion 80a to each other with a first adhesive layer 31 (FIG. 11 and FIGS. 12D and 12E).

The support body supply unit 500 supplies the first support body 41 (FIG. 11).

The first supply unit 100 also serving as the first unloading unit can unload a stack 81 including the first remaining portion 80a, the first adhesive layer 31, and the first support body 41 (FIG. 11 and FIG. 12E). The stack manufacturing apparatus of one embodiment of the present invention may include an unloading unit and a supply unit separately.

The above stack manufacturing apparatus of one embodiment of the present invention includes the first supply unit 100 that supplies the process member 80 and also serves as the first unloading unit for unloading the stack 81, the first separation unit 300 that separates the one surface layer 80b and the first remaining portion 80a of the process member 80 from each other, the first bonding unit 400 that bonds the first support body 41 to the first remaining portion 80a, and the support body supply unit 500 that supplies the first support body 41. This structure makes it possible to separate the one surface layer 80b of the process member 80 and bond the first support body 41 to the first remaining portion 80a which is separated. As described above, one embodiment of the present invention can provide an apparatus for manufacturing a stack including a support body and a remaining portion of a process member.

Furthermore, the stack manufacturing apparatus 1000A in this embodiment includes a first storage portion 300b, a first cleaning device 350, a transfer mechanism 121, and the like.

The first storage portion 300b stores the one surface layer 80b separated from the process member 80.

The first cleaning device 350 cleans the first remaining portion 80a separated from the process member 80.

The transfer mechanism 121 transfers the process member 80, the first remaining portion 80a separated from the process member 80, and the stack 81.

<<Stack Manufacturing Apparatus>>

Individual components of the stack manufacturing apparatus of one embodiment of the present invention are described below.

<First Supply Unit>

The first supply unit 100 supplies the process member 80. For example, to allow the transfer mechanism 121 to transfer a plurality of process members 80 successively, a multistage storage which can store the plurality of process members 80 can be included.

Furthermore, the first supply unit 100 in this embodiment also serves as the first unloading unit. The first supply unit 100 unloads the stack 81 including the first remaining portion 80*a*, the first adhesive layer 31, and the first support body 41. For example, to allow the transfer mechanism 121 to transfer a plurality of stacks 81 successively, the first supply unit 100 can include a multistage storage which can store the plurality of stacks 81.

<First Separation Unit>

The first separation unit 300 includes the separation apparatus of one embodiment of the present invention that is described in Embodiment 1 as an example.

<First Bonding Unit>

The first bonding unit 400 includes a mechanism for forming the first adhesive layer 31 and a crimp mechanism for bonding the first remaining portion 80*a* and the first support body 41 to each other with the use of the first adhesive layer 31.

Examples of the mechanism for forming the first adhesive layer 31 include a dispenser for applying a liquid adhesive and a device feeding an adhesive sheet shaped as a sheet in advance.

Note that the first adhesive layer 31 may be formed on the first remaining portion 80*a* and/or the first support body 41. Specifically, the first support body 41 on which the first adhesive layer 31 is formed in advance may be used.

Examples of the crimp mechanism for bonding the first remaining portion 80*a* and the first support body 41 to each other include mechanisms for applying pressure that are controlled to apply a constant pressure or provide a uniform gap, such as a pair of rollers, a flat plate and a roller, and a pair of flat plates facing each other.

<Support Body Supply Unit>

The support body supply unit 500 supplies the first support body 41. For example, the support body supply unit 500 unrolls a film which is supplied in a rolled shape, cuts the film to a predetermined length, activates the surface of the film, and supplies the film as the first support body 41.

<<Stack Manufacturing Method>>

A method for manufacturing the stack 81 from the process member 80 with the use of the stack manufacturing apparatus 1000A is described below with reference to FIG. 11 and FIGS. 12A to 12E.

The process member 80 includes the first substrate 11, the first separation layer 12 on the first substrate 11, a first peeled layer 13 whose one surface is in contact with the first separation layer 12, a bonding layer 30 whose one surface is in contact with the other surface of the first peeled layer 13, a base 25 in contact with the other surface of the bonding layer 30 (FIG. 12A). Note that in this embodiment, description is given of a case of using the process member 80 in which the separation triggers 13*s* are formed in advance near end portions of the bonding layer 30 (FIG. 12B).

<First Step>

The process member 80 is loaded into the first supply unit 100. The first supply unit 100 supplies the process member 80, and the transfer mechanism 121 transfers the process member 80 and supplies the process member 80 to the first separation unit 300.

<Second Step>

The first separation unit 300 separates the one surface layer 80*b* of the process member 80. Specifically, from the separation trigger 13*s* formed near the end portion of the bonding layer 30, the first substrate 11 and the first separation layer 12 are separated from the first peeled layer 13 (FIG. 12C).

By this step, the first remaining portion 80*a* is obtained from the process member 80. Specifically, the first remaining portion 80*a* includes the first peeled layer 13, the bonding layer 30 whose one surface is in contact with the first peeled layer 13, and the base 25 in contact with the other surface of the bonding layer 30.

<Third Step>

The transfer mechanism 121 transfers the first remaining portion 80*a*. The first cleaning device 350 cleans the supplied first remaining portion 80*a*.

The transfer mechanism 121 transfers the first remaining portion 80*a* that has been cleaned and supplies the first remaining portion 80*a* to the first bonding unit 400. The support body supply unit 500 supplies the first support body 41 to the first bonding unit 400.

Note that the transfer mechanism 121 may supply the first remaining portion 80*a* from the first separation unit 300 directly to the first bonding unit 400 without supplying it to the cleaning device.

The first bonding unit 400 forms the first adhesive layer 31 on the supplied first remaining portion 80*a* (FIG. 12D), and bonds the first remaining portion 80*a* and the first support body 41 to each other with the first adhesive layer 31 (FIG. 12E).

By this step, the stack 81 is obtained using the first remaining portion 80*a*. Specifically, the stack 81 includes the first support body 41, the first adhesive layer 31, the first peeled layer 13, the bonding layer 30 whose one surface is in contact with the first peeled layer 13, and the base 25 in contact with the other surface of the bonding layer 30.

<Fourth Step>

The transfer mechanism 121 transfers the stack 81 and supplies it to the first supply unit 100 also serving as the first unloading unit.

After this step, the stack 81 can be unloaded.

<Another Step>

Note that when it takes time to cure the first adhesive layer 31, it is preferable that the stack 81 in which the first adhesive layer 31 is not cured yet be unloaded and the first adhesive layer 31 be cured outside the stack manufacturing apparatus 1000A, in which case occupancy time of the apparatus can be reduced.

This embodiment can be combined with any of the other embodiments as appropriate.

[Embodiment 3]

In this embodiment, a stack manufacturing apparatus of one embodiment of the present invention is described with reference to FIG. 13, FIGS. 14A to 14E, and FIGS. 15A to 15E.

The stack manufacturing apparatus of one embodiment of the present invention includes a first supply unit configured to supply a process member having a sheet-like shape, a first separation unit configured to be supplied with the process member and separate the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first adhesive layer, a first unloading unit configured to unload a first stack including the first remaining portion, the first adhesive layer, and the first support body, a second supply unit configured to supply the first stack, a trigger formation unit configured to be supplied with the first stack and form a separation trigger near an end portion of the first remaining portion, a second separation unit configured to be supplied with the first stack including the separation trigger and divide the first stack into one surface layer and a second remaining portion, a second bonding unit configured to be supplied with the second remaining portion and the second support body and bond the second remaining portion and the second support body to each other with a second adhesive layer, and a second unloading unit configured to unload a second stack including the second remaining portion, the second adhesive layer, and the second support body. At least one of the first separation unit and the second separation unit includes the separation apparatus described in Embodiment 1.

The stack manufacturing apparatus having the above structure manufactures a stack using the sheet-like process member supplied to the first supply unit. The first separation unit separates the process member into the one surface layer and the first remaining portion. The first bonding unit bonds the first remaining portion and the first support body supplied from the support body supply unit to each other with the first adhesive layer. Then, the first unloading unit unloads the first stack including the first remaining portion, the first adhesive layer, and the first support body, and supplies the first stack to the second supply unit. The trigger formation unit forms the separation trigger in the first stack supplied from the second supply unit. The second separation unit separates the first stack including the separation trigger into the one surface layer and the second remaining portion. The second bonding unit bonds the second remaining portion and the second support body supplied from the support body supply unit to each other with the second adhesive layer. Then, the second unloading unit unloads the second stack including the second remaining portion, the second adhesive layer, and the second support body.

Figure 13:
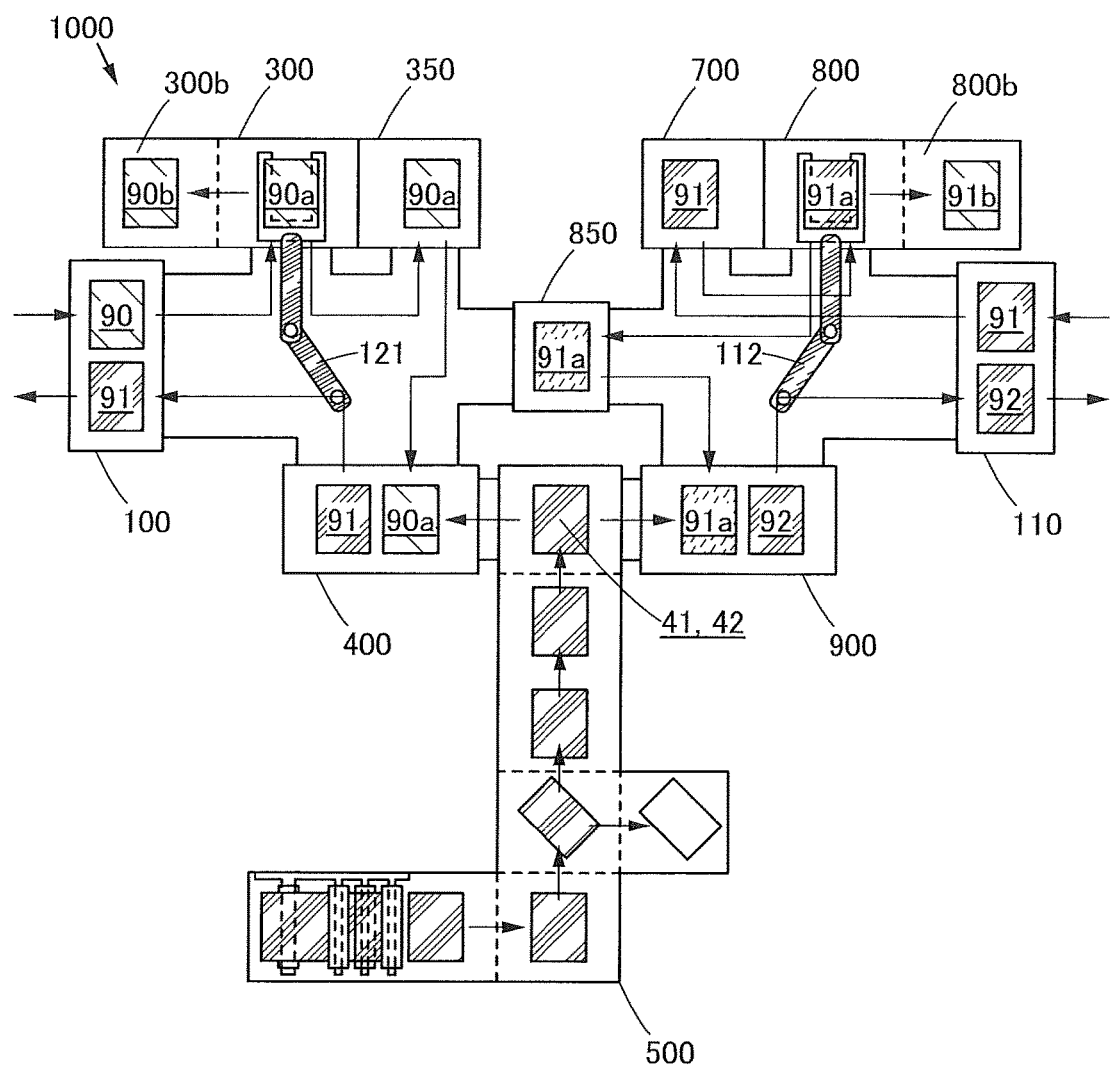
FIG. 13 illustrates a stack manufacturing apparatus.

FIG. 13 is a schematic diagram illustrating a structure of a stack manufacturing apparatus 1000 of one embodiment of the present invention, and a transfer path of a process member and a stack in a process.

Figure 15A:
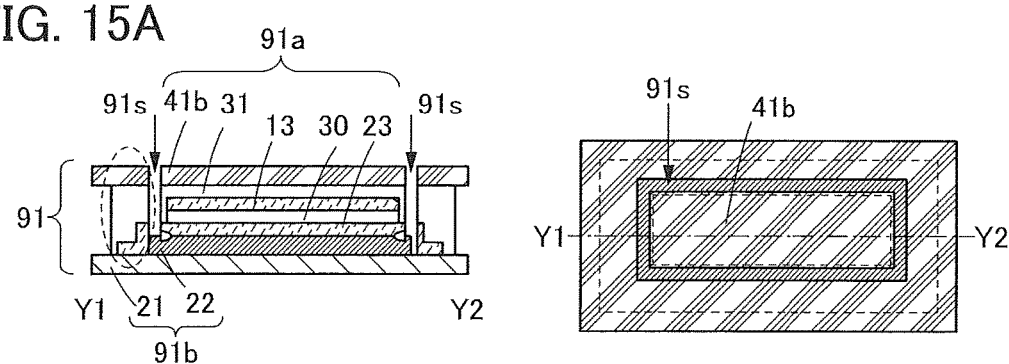
FIGS. 15A to 15E illustrate a process for manufacturing a stack.
Figure 15B:
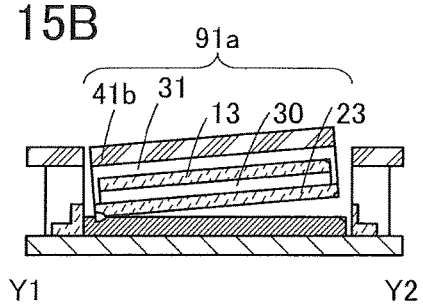
Figure 15C:
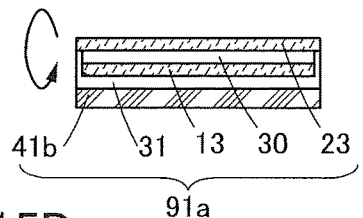

FIGS. 14A to 14E and FIGS. 15A to 15E are schematic views illustrating a process for manufacturing a stack with the use of the stack manufacturing apparatus 1000 of one embodiment of the present invention. FIGS. 14A, 14B, 14D, and 14E and FIGS. 15A, 15D, and 15E each illustrate a plan view and a cross-sectional view taken along dashed-dotted line Y1-Y2 in the plan view. FIG. 14C and FIGS. 15B and 15C each illustrate only a cross-sectional view.

The stack manufacturing apparatus 1000 described in this embodiment includes the first supply unit 100, the first separation unit 300, the first bonding unit 400, the support body supply unit 500, a second supply unit 110, a trigger formation unit 700, a second separation unit 800, and a second bonding unit 900.

Note that each unit can be named freely, and the name does not limit the function of each unit.

It is preferable that at least one of the first separation unit 300 and the second separation unit 800 include the separation apparatus of one embodiment of the present invention. For example, the first separation unit 300 and the second separation unit 800 each may include the separation apparatus of one embodiment of the present invention that is described in Embodiment 1. Alternatively, the first separation unit 300 may include a different separation apparatus and the second separation unit 800 may include the separation apparatus of one embodiment of the present invention described in Embodiment 1. For example, the different separation apparatus is a separation apparatus described in Embodiment 4.

The first supply unit 100 can supply a process member 90. Note that the first supply unit 100 can also serve as a first unloading unit.

The first separation unit 300 can separate one surface layer 90b and a first remaining portion 90a of the process member 90 from each other (FIG. 13 and FIGS. 14A to 14C).

The first bonding unit 400 is supplied with the first support body 41, and bonds the first support body 41 and the first remaining portion 90a to each other with the first adhesive layer 31 (FIG. 13 and FIGS. 14D and 14E).

The support body supply unit 500 supplies the first support body 41 and a second support body 42 (FIG. 13).

The first supply unit 100 also serving as the first unloading unit can unload a stack 91 including the first remaining portion 90a, the first adhesive layer 31, and the first support body 41 (FIG. 13 and FIG. 14E).

The second supply unit 110 can supply the stack 91. Note that the second supply unit 110 can also serve as a second unloading unit.

The trigger formation unit 700 forms a separation trigger 91s near end portions of the first remaining portion 90a (FIG. 15A). Specifically, part of a second peeled layer 23 which overlaps with a second separation layer 22 and the first adhesive layer 31 is removed.

The second separation unit 800 separates one surface layer 91b and a second remaining portion 91a of the stack 91 from each other (FIGS. 15A and 15B).

Figure 15D:
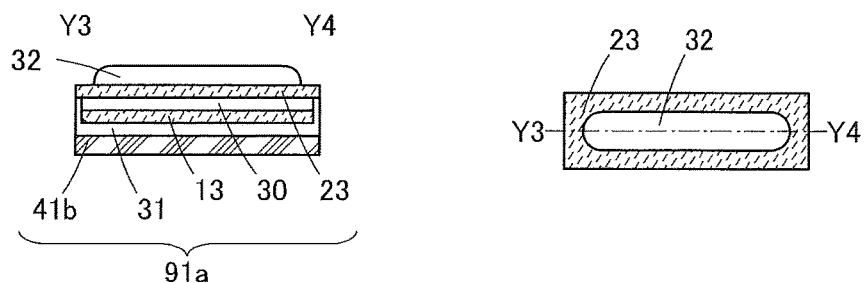
Figure 15E:
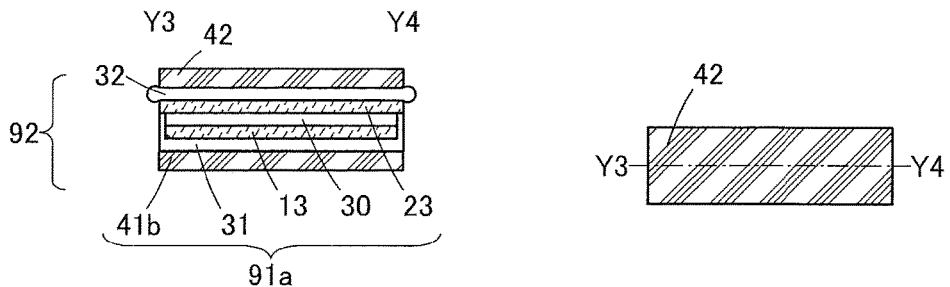

The second bonding unit 900 is supplied with the second support body 42, and bonds the second support body 42 and the second remaining portion 91a to each other with a second adhesive layer 32 (FIGS. 15D and 15E).

The second supply unit 110 also serving as the second unloading unit unloads a stack 92 including the second remaining portion 91a, the second adhesive layer 32, and the second support body 42 (FIG. 13 and FIG. 15E).

The above stack manufacturing apparatus of one embodiment of the present invention includes the first supply unit 100 that supplies the process member 90 and also serves as the first unloading unit for unloading the stack 91, the first separation unit 300 that separates the one surface layer 90b and the first remaining portion 90a of the process member 80 from each other, the first bonding unit 400 that bonds the first support body 41 to the first remaining portion 90a, the support body supply unit 500 that supplies the first support body 41 and the second support body 42, the second supply unit 110 that supplies the stack 91 and unloads the stack 92, the trigger formation unit 700 that forms the separation trigger, the second separation unit 800 that separates the one surface layer 91b and the second remaining portion 91a of the stack 91 from each other, and the second bonding unit 900 that bonds the second support body 42 to the second remaining portion 91a. This structure makes it possible to separate both surface layers of the process member 90 and bond the first support body 41 and the second support body 42 to the remaining portion. As described above, one embodiment of the present invention can provide an apparatus for manufacturing a stack including a remaining portion of a process member and support bodies.

Furthermore, the stack manufacturing apparatus 1000 in this embodiment includes the first storage portion 300b, a second storage portion 800b, the first cleaning device 350, a second cleaning device 850, the transfer mechanism 121, a transfer mechanism 112, and the like.

The first storage portion 300b stores the one surface layer 90b separated from the process member 90.

The second storage portion 800b stores the one surface layer 91b separated from the stack 91.

The first cleaning device 350 cleans the first remaining portion 90a separated from the process member 90.

The second cleaning device 850 cleans the second remaining portion 91a separated from the stack 91.

The transfer mechanism 121 transfers the process member 90, the first remaining portion 90a separated from the process member 90, and the stack 91.

The transfer mechanism 112 transfers the stack 91, the second remaining portion 91a separated from the stack 91, and the stack 92.

<<Stack Manufacturing Apparatus>>

Individual components of the stack manufacturing apparatus of one embodiment of the present invention are described below.

Note that the stack manufacturing apparatus 1000 differs from the stack manufacturing apparatus 1000A described in Embodiment 2 in including the second supply unit 110, the trigger formation unit 700, the second separation unit 800, the second bonding unit 900, the second storage portion 800b, and the second cleaning device 850. In this embodiment, a structure different from that of the stack manufacturing apparatus 1000A is described, and the description in Embodiment 2 is referred to for a structure common to that of the stack manufacturing apparatus 1000A.

<Second Supply Unit>

The second supply unit 110 can have a structure similar to that of the first supply unit described in Embodiment 2 except that the second supply unit 110 supplies the stack 91 (i.e., supplies an object different from that of the first supply unit).

Furthermore, the second supply unit 110 in this embodiment also serves as the second unloading unit. The second unloading unit can have a structure similar to that of the first unloading unit described in Embodiment 2 except that the second unloading unit unloads the stack 92 (i.e., unloads an object different from that of the first unloading unit).

<Trigger Formation Unit>

The trigger formation unit 700 includes a cutting mechanism which cuts the first support body 41 and the first adhesive layer 31 and separates part of the second peeled layer 23 from the second separation layer 22, for example.

Specifically, the cutting mechanism includes at least one blade which has a sharp tip and a transfer mechanism which transfers the blade relatively to the stack 91.

<Second Separation Unit>

The second separation unit 800 includes the separation apparatus of one embodiment of the present invention that is described in Embodiment 1 as an example.

<Second Bonding Unit>

The second bonding unit 900 includes a mechanism for forming the second adhesive layer 32 and a crimp mechanism for bonding the second remaining portion 91a and the second support body 42 to each other with the use of the second adhesive layer 32.

The mechanism for forming the second adhesive layer 32 can have a structure similar to that of the first bonding unit 400 described in Embodiment 2, for example.

Note that the second adhesive layer 32 may be formed on the second remaining portion 91a and/or the second support body 42. Specifically, the second support body 42 on which the second adhesive layer 32 is formed in advance may be used.

The crimp mechanism for attaching the second remaining portion 91a and the second support body 42 to each other can have a structure similar to that of the first bonding unit 400 described in Embodiment 2, for example.

<<Stack Manufacturing Method>>

A method for manufacturing the stack 92 from the process member 90 with the use of the stack manufacturing apparatus 1000 is described below with reference to FIG. 13, FIGS. 14A to 14E, and FIGS. 15A to 15E.

The process member 90 has the same structure as the process member 80 except that a first base includes a second substrate 21, the second separation layer 22 on the second substrate 21, and the second peeled layer 23 whose one surface is in contact with the second separation layer 22.

Specifically, the process member 90 includes the first substrate 11, the first separation layer 12 on the first substrate 11, the first peeled layer 13 whose one surface is in contact with the first separation layer 12, the bonding layer 30 whose one surface is in contact with the other surface of the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22 (FIG. 14A). Note that in this embodiment, description is given of a case of using the process member 90 in which the separation triggers 13s are formed in advance near end portions of the bonding layer 30 (FIG. 14B).

<First Step>

The process member 90 is loaded into the first supply unit 100. The first supply unit 100 supplies the process member 90, and the transfer mechanism 121 transfers the process member 90 and supplies the process member 90 to the first separation unit 300.

<Second Step>

The first separation unit 300 separates the one surface layer 90b of the process member 90. Specifically, from the separation trigger 13s formed near the end portion of the bonding layer 30, the first substrate 11 and the first separation layer 12 are separated from the first peeled layer 13 (FIG. 14C).

By this step, the first remaining portion 90a is obtained from the process member 90. Specifically, the first remaining portion 90a includes the first peeled layer 13, the bonding layer 30 whose one surface is in contact with the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22.

<Third Step>

The transfer mechanism 121 transfers the first remaining portion 90a. The first cleaning device 350 cleans the supplied first remaining portion 90a.

The transfer mechanism 121 transfers the first remaining portion 90a that has been cleaned and supplies the first remaining portion 90a to the first bonding unit 400. The support body supply unit 500 supplies the first support body 41 to the first bonding unit 400.

The first bonding unit 400 forms the first adhesive layer 31 over the first remaining portion 90a supplied thereto (FIG. 14D), and bonds the first remaining portion 90a and the first support body 41 to each other with the first adhesive layer 31.

By this step, the stack 91 is obtained using the first remaining portion 90a. Specifically, the stack 91 includes the first support body 41, the first adhesive layer 31, the first peeled layer 13, the bonding layer 30 whose one surface is in contact with the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22 (FIG. 14E).

<Fourth Step>

The transfer mechanism 121 transfers the stack 91 and supplies it to the first supply unit 100 also serving as the first unloading unit.

After this step, the stack 91 can be unloaded. For example, when it takes time to cure the first adhesive layer 31, it is possible that the stack 91 in which the first adhesive layer 31 is not cured yet is unloaded and the first adhesive layer 31 is cured outside the stack manufacturing apparatus 1000. In that case, occupancy time of the apparatus can be reduced.

<Fifth Step>

The stack 91 is loaded into the second supply unit 110. The second supply unit 110 supplies the stack 91, and the transfer mechanism 112 transfers the stack 91 and supplies it to the trigger formation unit 700.

<Sixth Step>

The trigger formation unit 700 forms the separation trigger 91s by separation, from the second separation layer 22, part of the second peeled layer 23 near the end portion of the first adhesive layer 31 of the stack 91.

For example, the first support body 41 and the first adhesive layer 31 are cut from the first support body 41 side, and part of the second peeled layer 23 is separated from the second separation layer 22.

Specifically, the first adhesive layer 31 and the first support body 41 in a region which is on the second separation layer 22 and in which the second peeled layer 23 is provided are cut to draw a closed curve with a blade or the like having a sharp tip, and along the closed curve, the second peeled layer 23 is partly separated from the second separation layer 22 (FIG. 15A).

By this step, the separation trigger 91s is formed in the cut portion near the end portions of a first support body 41b and the first adhesive layer 31.

<Seventh Step>

The second separation unit 800 separates the one surface layer 91b of the stack 91. Specifically, from the separation trigger 91s formed near the end portion of the bonding layer 30, the second substrate 21 and the second separation layer 22 are separated from the second peeled layer 23 (FIG. 15B).

By this step, the second remaining portion 91a is obtained from the stack 91. Specifically, the second remaining portion 91a includes the first support body 41b, the first adhesive layer 31, the first peeled layer 13, the bonding layer 30 whose one surface is in contact with the first peeled layer 13, and the second peeled layer 23 whose one surface is in contact with the other surface of the bonding layer 30.

<Eighth Step>

The transfer mechanism 112 transfers the second remaining portion 91a and turns the second remaining portion 91a so that the second peeled layer 23 faces upward (FIG. 15C). The second cleaning device 850 cleans the supplied second remaining portion 91a.

The transfer mechanism 112 transfers the second remaining portion 91a after the cleaning and supplies the second remaining portion 91a to the second bonding unit 900. The support body supply unit 500 supplies the second support body 42 to the second bonding unit 900.

Note that the transfer mechanism 112 may supply the second remaining portion 91a from the second separation unit 800 directly to the second bonding unit 900 without supplying it to the cleaning device.

The second bonding unit 900 forms the second adhesive layer 32 on the second remaining portion 91a supplied thereto (FIG. 15D), and bonds the second remaining portion 91a and the second support body 42 to each other with the second adhesive layer 32 (FIG. 15E).

By this step, the stack 92 is obtained using the second remaining portion 91a. Specifically, the stack 92 includes the first peeled layer 13, the first adhesive layer 31, the first support body 41b, the bonding layer 30, the second peeled layer 23, and the second support body 42.

<Ninth Step>

The transfer mechanism 112 transfers the stack 92, and the stack 92 is supplied to the second supply unit 110 also serving as the second unloading unit.

After this step, the stack 92 can be unloaded.

<Modification Example>

A modification example of this embodiment is described with reference to FIG. 16.

Figure 16:
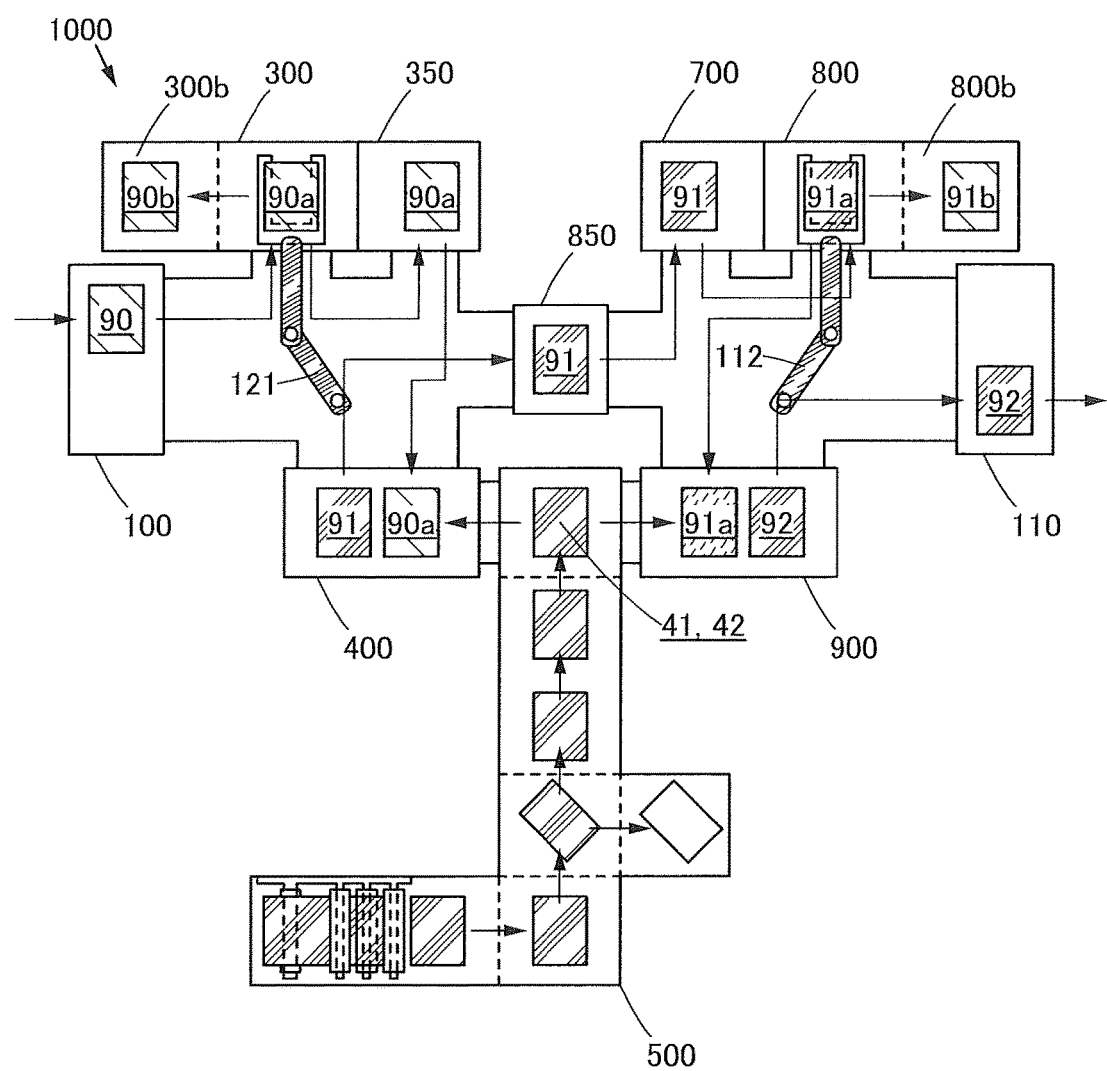
FIG. 16 illustrates a stack manufacturing apparatus.

FIG. 16 is a schematic diagram illustrating a structure of the stack manufacturing apparatus 1000 of one embodiment of the present invention, and a transfer path of a process member and a stack in a process.

In the modification example of this embodiment, a method for manufacturing the stack 92 from the process member 90 with the use of the stack manufacturing apparatus 1000, which is different from the above-described method, is described with reference to FIGS. 14A to 14E, FIGS. 15A to 15E, and FIG. 16.

Specifically, the differences between the method in this modification example and the above-described method are as follows: in the fourth step, the transfer mechanism 121 transfers the stack 91 and the stack 91 is supplied not to the first supply unit 100 also serving as the first unloading unit but to the second cleaning device 850; in the fifth step, the transfer mechanism 112 transfers the stack 91 and the stack 91 is supplied to the trigger formation unit 700; and in the eighth step, the second remaining portion 91a is directly supplied to the second bonding unit 900 without being supplied to the second cleaning device 850. Thus, different portions will be described in detail below. Refer to the above description for portions where the same methods can be employed.

<Modification Example of Fourth Step>

The transfer mechanism 121 transfers the stack 91 and the stack 91 is supplied to the second cleaning device 850.

In the modification example of this embodiment, the second cleaning device 850 is used as a delivery chamber in which the transfer mechanism 121 delivers the stack 91 to the transfer mechanism 112 (FIG. 16).

By this step, the stack 91 can be continuously processed without being unloaded from the stack manufacturing apparatus 1000. The stack manufacturing apparatus 1000 may include a delivery chamber separately. In that case, the second remaining portion 91a can be cleaned in the second cleaning device 850 and the stack 91 can be delivered via the delivery chamber at the same time.

<Modification Example of Fifth Step>

The transfer mechanism 112 transfers the stack 91, and the stack 91 is supplied to the trigger formation unit 700.

<Modification Example of Eighth Step>

The transfer mechanism 112 transfers the second remaining portion 91a, and turns the second remaining portion 91a so that the second peeled layer 23 faces upward. The second remaining portion 91a is supplied to the second bonding unit 900.

The second bonding unit 900 forms the second adhesive layer 32 on the second remaining portion 91a supplied thereto (FIG. 14D), and bonds the second remaining portion 91a and the second support body 42 to each other with the second adhesive layer 32 (FIG. 14E).

By this step, the stack 92 is obtained using the second remaining portion 91a.

This embodiment can be combined with any of the other embodiments as appropriate.

[Embodiment 4]

In this embodiment, a separation apparatus that can be used as the separation unit in the stack manufacturing apparatus of one embodiment of the present invention is described with reference to FIG. 17 and FIGS. 18A to 18C.

Depending on the kind of device using a flexible substrate, the following process may be used: thin components formed over two different rigid substrates are bonded to each other, one of the rigid substrates is separated to be replaced by a flexible substrate, and the other of the rigid substrates is also separated to be replaced by a flexible substrate. In this case, the pair of rigid substrates are separated from each other in the initial separation step. To perform separation using the separation apparatus of Embodiment 1 so as not to break the rid substrate, the radius of curvature of a curved surface of a structure body needs to be increased. Depending on the material or size of the rid substrate, the size of the separation apparatus of Embodiment 1 is extremely large in some cases.

Thus, in one embodiment of the present invention, a separation apparatus described in this embodiment is used when one of the rid substrates is separated. Note that after one of the rid substrates is separated using the separation apparatus described in this embodiment, the separation apparatus of Embodiment 1 can be used for separation of the other of the rid substrates. Alternatively, depending on the circumstances, the separation apparatus of this embodiment may be used for separation of both the rid substrates.

Figure 17:
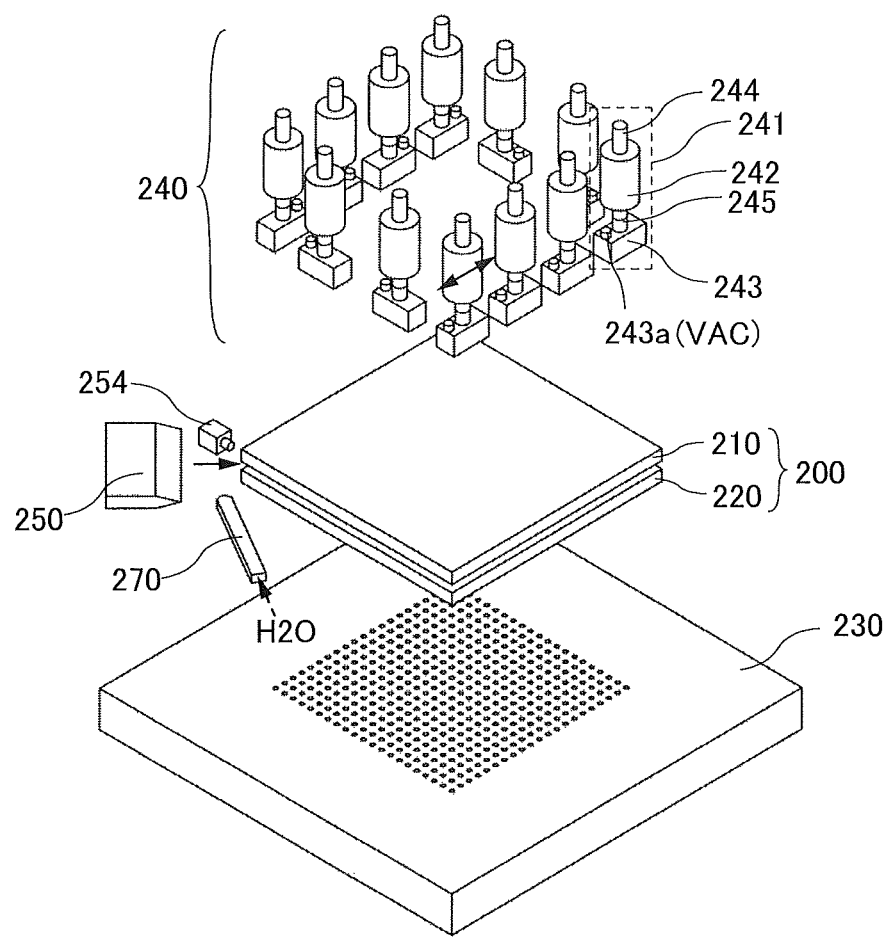
FIG. 17 illustrates an example of a separation apparatus.

FIG. 17 is a perspective view of a separation apparatus. The separation apparatus includes a fixing stage 230, a suction mechanism 240, and a wedge-shaped jig 250. Note that a detail such as a power mechanism of each component is not illustrated in FIG. 17.

A process member 200 can be a member including a substrate 210, a substrate 220, and a thin component provided between the substrates.

As the fixing stage 230 to which the process member 200 is fixed, for example, a vacuum suction stage, an electrostatic attachment stage, or the like can be used. Alternatively, the process member 200 may be fixed to the stage with a screwing jig or the like.

The suction mechanism 240 includes a plurality of suction jigs 241. The suction jigs 241 are placed to fix the vicinity of the rim of a first plane (the substrate 210 in FIG. 17) of the process member 200. The suction jigs 241 each include a vertical movement mechanism 242 and a suction portion 243. The vertical movement mechanisms 242 are included in the suction jigs 241 to independently control the vertical movements of the suction portions 243. The suction portions 243 each have an inlet 243a connected to a vacuum pump or the like, and perform vacuum suction of the process member 200. A movable portion 245 is provided between an axis 244 of the vertical movement mechanism 242 and the suction portion 243. The suction jig 241 includes a mechanism for movement in the horizontal direction indicated by a double-headed arrow. Thus, suction can be maintained even when the substrate 210 is deformed or its position is changed in the separation process. Note that the movable portion 245 may be formed using a mechanical mechanism including a joint or a material with elasticity such as a rubber or a spring. Although FIG. 17 illustrates the suction mechanism 240 including the twelve suction jigs, the structure is not limited thereto. The number of suction jigs 241, the size of the suction portion 243, and the like in the suction mechanism 240 can be determined depending on the size and the physical property of the process member 200.

As the wedge-shaped jig 250, a blade jig can be used. Here, the wedge-shaped jig 250 pushes the attached substrates 210 and 220 apart by being inserted into an extremely narrow gap between the substrates 210 and 220. For this reason, it is preferable that the thickness of the pointed tip of the wedge-shaped jig 250 be smaller than the gap and the thickness of a plate-like portion of the wedge-shaped jig 250 be larger than the gap. A sensor 254 that senses an inserted position of the wedge-shaped jig 250 may be included. Note that the term "gap" in this embodiment refers to a region in which the component is not provided between the substrate 210 and the substrate 220, and mainly refers to a region of outer edges of the substrates.

Furthermore, a nozzle 270 to which liquid is supplied is preferably provided in the vicinity of the position of the process member 200 where the wedge-shaped jig 250 is inserted. As the liquid, water can be used, for example. When water exists in a portion where the separation is in process, separation strength can be decreased. Moreover, electrostatic discharge damage to an electronic device or the like can be prevented. As the liquid, water, an organic solvent, a neutral solution, an alkaline solution, an acid solution, or the like can be used.

In the separation method of one embodiment of the present invention, separation is performed from a short side of a process member or a stack in a long side direction. Accordingly, separation conditions such as the force for separation can be easily controlled and the yield of the separation can be improved. Such separation of the process member 200 having a long side and a short side using the separation apparatus will be described with reference to FIGS. 18A to 18C.

Figure 18A:
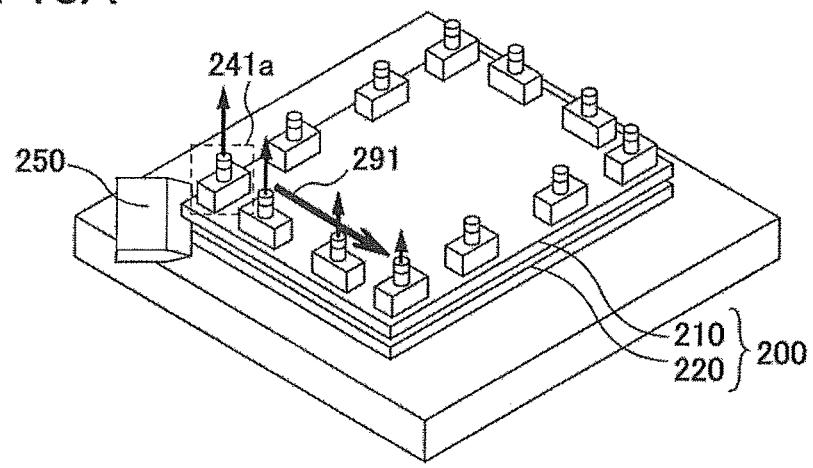
FIGS. 18A to 18C illustrate an example of a separation apparatus.
Figure 18B:
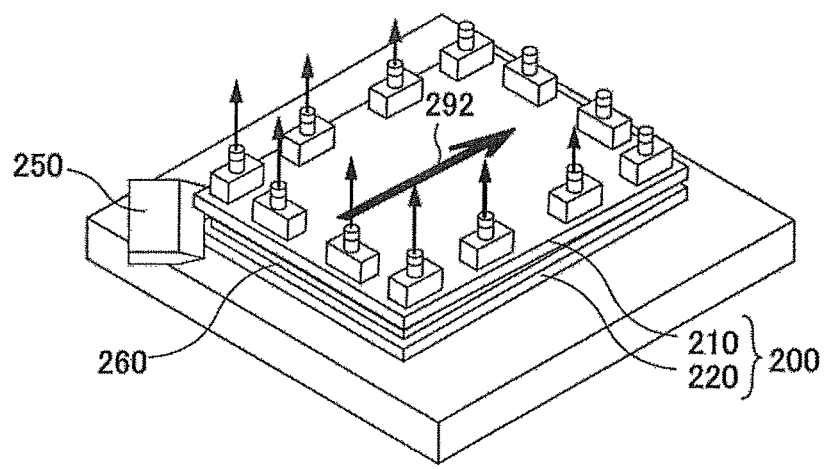
Figure 18C:
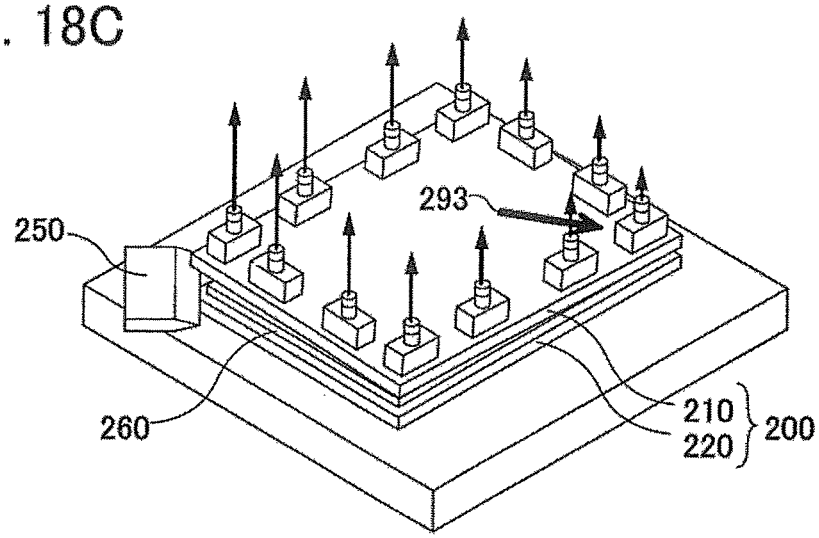

Note that some of the components illustrated in FIG. 17 are omitted in FIGS. 18A to 18C for simplicity. An arrow illustrated with each suction jig schematically illustrates the move distance in the upward direction of the suction portion 243 which is included in each suction jig, or strength required of lifting the suction portion 243 upward.

FIG. 18A illustrates a perspective view of a state in which a separated side of the process member 200 (the substrate 220) is fixed to the fixing stage 230, the plurality of suction jigs 241 included in the suction mechanism 240 are placed on a separated side of the process member 200 (the substrate 210), and the wedge-shaped jig 250 is inserted into a gap in the process member 200.

Here, a component provided between the substrates 210 and 220 has extremely small thickness, and thus the process member 200 has an extremely narrow gap. Given that the component is included in a light-emitting device, the gap is approximately 10 μm to 15 μm, and it is very difficult to fix the position of the wedge-shaped jig 250 and insert the wedge-shaped jig 250 into the gap. Therefore, it is preferable that the position of the gap be sensed with the use of the sensor 254 (e.g., an optical sensor, a displacement sensor, or a camera) illustrated in FIG. 17, and then the wedge-shaped jig 250 be inserted into the position.

In addition, it is preferable that a structure in which the wedge-shaped jig 250 can move in the thickness direction of the process member 200 be employed and a substrate whose end portions are chamfered be used for the process member 200. Thus, it is possible to include chamfers in an area to which the wedge-shaped jig 250 can be inserted. In this case, the area including the chamfers on the gap side is sensed with the sensor 254.

As illustrated in FIG. 18A, when the wedge-shaped jig 250 is inserted into a gap in a corner of the process member 200 to push the attached substrates 210 and 220 apart, separation starts in the region to be the separation starting point that is formed in advance. At this time, water is preferably supplied to the portion where the separation is in process as described above.

After the wedge-shaped jig 250 is inserted into the gap in the corner of the process member 200 and the separation starts, the suction portion 243 included in the suction jig 241a which is closest to the corner is moved slowly. Then, the suction portions 243 included in the corresponding suction jigs are moved sequentially so that the separation is carried on in a direction 291 indicated by an arrow in FIG. 18A; thus, one side of the process member 200 is separated.

Note that the suction portion included in the suction jig 241a preferably has higher suction power than suction portions of the other suction jigs. For example, the suction area of the suction portion included in the suction jig 241a is preferably larger than those of the suction portions of the other suction jigs. When separation is started, larger power is needed to lift up the substrate 210; therefore, larger suction power of the suction portion included in the suction jig 241a facilitates separation.

Next, as illustrated in FIG. 18B, the suction portions 243 included in the corresponding suction jigs are moved sequentially so that the separation is carried on from the separation side of the process member 200 in a direction 292 indicated by an arrow.

The suction surface of the suction portion 243 is provided with a suction pad formed using rubber or the like. The suction pad is capable of elastic deformation following the warpage of the substrate 210 to prevent the suction portion 243 from being separated from the substrate 210; as a result, separation of the substrate 210 can be performed certainly.

Then, as illustrated in FIG. 18C, the suction portions 243 included in the corresponding suction jigs are moved sequentially so that a position on the diagonal line of the corner of the process member 200 to which the wedge-shaped jig 250 is inserted becomes a separation end point; thus, the separation is carried on in a direction 293 indicated by an arrow.

Note that in the separation process, the separation rate is preferably managed. When the movement of the suction portions 243 of the suction jigs is fast and the separation cannot follow the movement, the separation portion is cut. For this reason, it is preferable that the angle between the substrates 210 and 220 at the time of separation, tractive force in the movement of the suction portions 243 included in the suction jigs, and the like be managed with the use of image processing, a displacement sensor, a pull gauge, or the like to prevent the separation rate from being excessively high.

To remove water or the like that remains after the separation step, a dryer or the like may be further provided. Water can be removed by spraying a gas such as the air or a $N_2$ gas to the substrate, for example.

In the above manner, a crack in the substrate, cutting of the separation portion, and the like are less likely to occur and the separation process of the process member 200 can be performed with a high yield.

This embodiment can be combined with any other embodiment as appropriate.

[Embodiment 5]

In this embodiment, a light-emitting device that can be manufactured by applying one embodiment of the present invention is described with reference to drawings. Although a light-emitting device mainly including an organic EL element is described in this embodiment as an example, one embodiment of the present invention is not limited to this example.

<Structure Example 1>

FIG. 19A is a plan view of a light-emitting device, and FIG. 19B is an example of a cross-sectional view taken along dashed-dotted line D1-D2 in FIG. 19A. The light-emitting device in Structure example 1 is a top-emission light-emitting device using a color filter method. In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan or magenta may be used.

The light-emitting device illustrated in FIG. 19A includes a light-emitting portion 804, a driver circuit portion 806, and an FPC 808.

The light-emitting device illustrated in FIG. 19B includes a flexible substrate 701, a bonding layer 703, an insulating layer 705, functional layers (a plurality of transistors, a conductive layer 857, an insulating layer 815, an insulating layer 817, a plurality of light-emitting elements, and an insulating layer 821), a bonding layer 822, functional layers (a coloring layer 845 and a light-blocking layer 847), an insulating layer 715, a bonding layer 713, and a flexible substrate 711. The bonding layer 822, the insulating layer 715, the bonding layer 713, and the flexible substrate 711 transmit visible light. Light-emitting elements and transistors included in the light-emitting portion 804 and the driver circuit portion 806 are sealed with the flexible substrate 701, the flexible substrate 711, and the bonding layer 822.

In the light-emitting portion 804, a transistor 820 and a light-emitting element 830 are provided over the flexible substrate 701 with the bonding layer 703 and the insulating layer 705 positioned therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In the light-emitting portion 804, the coloring layer 845 overlapping with the light-emitting element 830 and the light-blocking layer 847 overlapping with the insulating layer 821 are provided. The space between the light-emitting element 830 and the coloring layer 845 is filled with the bonding layer 822.

The insulating layer 815 has an effect of preventing diffusion of impurities into a semiconductor included in the transistor. As the insulating layer 817, an insulating layer having a planarization function is preferably selected in order to reduce surface unevenness due to the transistor. In the case where an organic material is used for the insulating layer 817, an impurity such as moisture outside the light-emitting device might enter the transistor, the light-emitting element 830, or the like through the insulating layer 817 which is exposed at an end portion of the light-emitting device. The deterioration of the transistor or the light-emitting element 830 due to the entry of an impurity leads to the deterioration of the light-emitting device. Thus, as illustrated in FIG. 19B and the like, it is preferable that an opening which reaches an inorganic film (here, the insulating layer 815) be formed in the insulating layer 817 so that an impurity such as moisture entering from the outside of the light-emitting device does not easily reach the transistor and the light-emitting element 830. Note that the insulating layer 817 is not necessarily formed at the end portion of the light-emitting device.

In the driver circuit portion 806, a plurality of transistors are provided over the flexible substrate 701 with the bonding layer 703 and the insulating layer 705 positioned therebetween. FIG. 19B illustrates one of the transistors included in the driver circuit portion 806.

The insulating layer 705 and the flexible substrate 701 are attached to each other with the bonding layer 703. The insulating layer 715 and the flexible substrate 711 are attached to each other with the bonding layer 713. At least one of the insulating layer 705 and the insulating layer 715 is preferably highly resistant to moisture, in which case impurities such as water can be prevented from entering the light-emitting element 830 and the transistor 820, leading to higher reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. To prevent an increase in the number of fabrication steps, the conductive layer 857 is preferably formed using the same material and the same step as the electrode or the wiring in the light-emitting portion or the driver circuit portion. Here, an example is described in which the conductive layer 857 is formed using the same material and the same step as the electrodes of the transistor 820.

In the light-emitting device in FIG. 19B, the FPC 808 is located over the flexible substrate 711. A connector 825 is connected to the conductive layer 857 through an opening provided in the flexible substrate 711, the bonding layer 713, the insulating layer 715, the bonding layer 822, the insulating layer 817, and the insulating layer 815. Furthermore, the connector 825 is connected to the FPC 808. That is, the FPC 808 and the conductive layer 857 are electrically connected to each other through the connector 825. When the conductive layer 857 and the flexible substrate 711 overlap with each other, an opening formed in the flexible substrate 711 (or the use of a substrate with an opening) allows the conductive layer 857, the connector 825, and the FPC 808 to be electrically connected to each other.

Figure 20A:
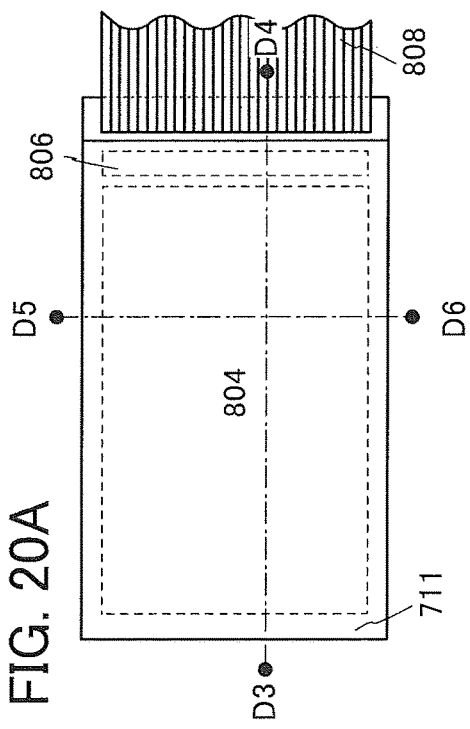
FIGS. 20A and 20B illustrate an example of a light-emitting device.
Figure 20B:
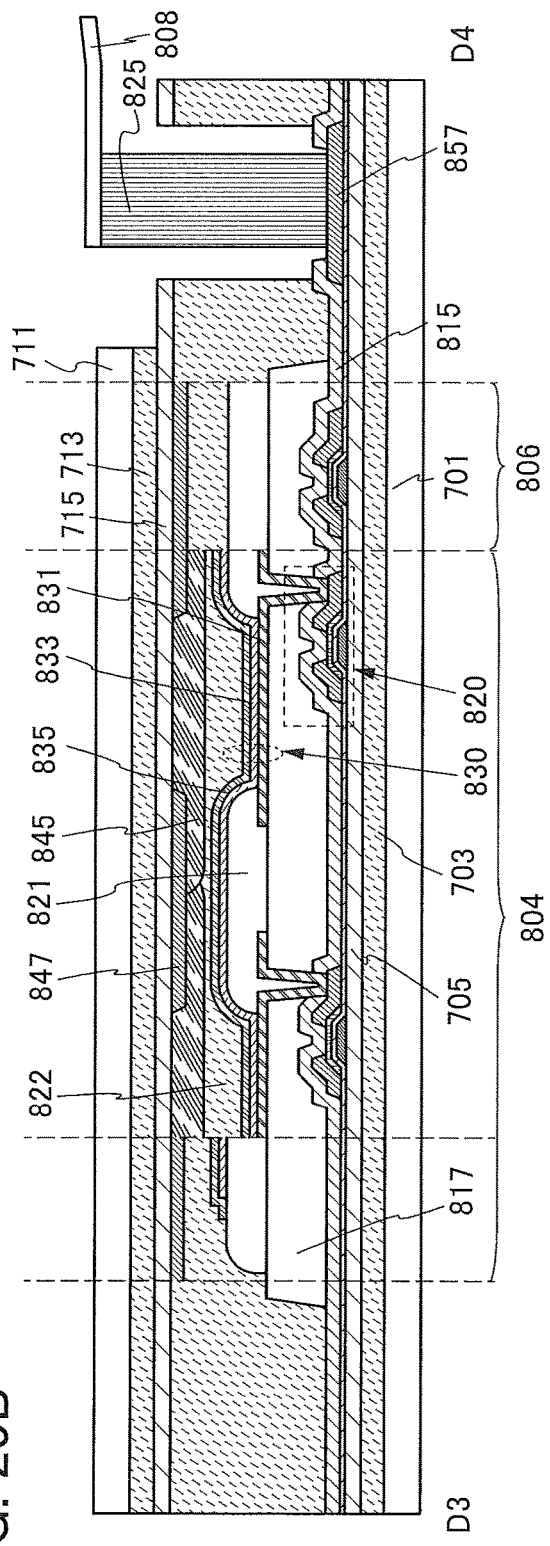
Figure 21A:
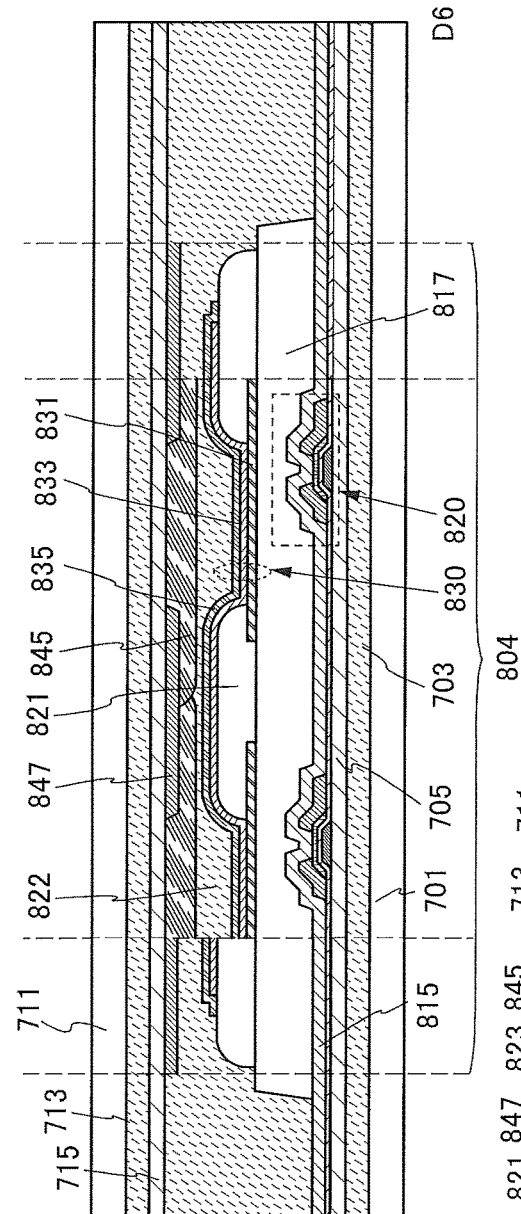
FIGS. 21A to 21D illustrate an example of a light-emitting device.

A modification example of the light-emitting device illustrated in FIGS. 19A and 19B is described. FIG. 20A is a plan view of a light-emitting device, and FIG. 20B is an example of a cross-sectional view taken along dashed-dotted line D3-D4 in FIG. 20A. FIG. 21A is an example of a cross-sectional view taken along dashed-dotted line D5-D6 in FIG. 20A.

The light-emitting device illustrated in FIGS. 20A and 20B shows an example in which the flexible substrate 701 and the flexible substrate 711 have different sizes. The FPC 808 is positioned over the insulating layer 715 and does not overlap with the flexible substrate 711. The connector 825 is connected to the conductive layer 857 through an opening provided in the insulating layer 715, the bonding layer 822, the insulating layer 817, and the insulating layer 815. There is no limitation on the material for the flexible substrate 711 because an opening does not need to be provided in the flexible substrate 711.

It is preferred that the insulating layer formed using an organic resin having a poor gas barrier property or a poor moisture-resistant property not be exposed in an end portion of the light-emitting device. Such a structure can prevent the entry of impurities from the side surface of the light-emitting device. For example, as illustrated in FIG. 20B and FIG. 21A, the structure in which the insulating layer 817 is not provided in the end portion of the light-emitting device may be employed.

Figure 21B:
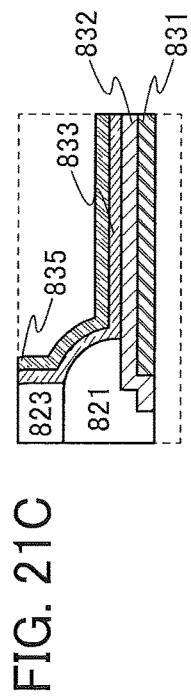

FIG. 21B shows a modification example of the light-emitting portion 804.

The light-emitting device illustrated in FIG. 21B includes insulating layers 817*a* and 817*b* and a conductive layer 856 over the insulating layer 817*a*. The source electrode or the drain electrode of the transistor 820 and the lower electrode of the light-emitting element 830 are electrically connected to each other through the conductive layer 856.

The light-emitting device illustrated in FIG. 21B includes a spacer 823 over the insulating layer 821. The spacer 823 can adjust the distance between the flexible substrate 701 and the flexible substrate 711.

The light-emitting device in FIG. 21B includes an overcoat 849 covering the coloring layer 845 and the light-blocking layer 847. The space between the light-emitting element 830 and the overcoat 849 is filled with the bonding layer 822.

Figure 21C:
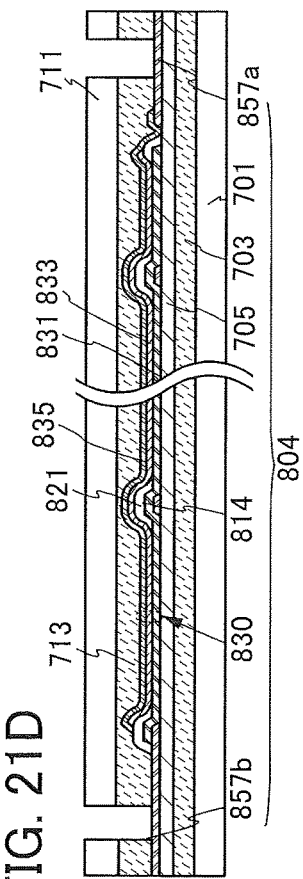

FIG. 21C shows a modification example of the light-emitting element 830.

Note that as illustrated in FIG. 21C, the light-emitting element 830 may include an optical adjustment layer 832 between the lower electrode 831 and the EL layer 833. A light-transmitting conductive material is preferably used for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer is varied depending on the emission color of the subpixel.

<Structure Example 2>

Figure 21D:
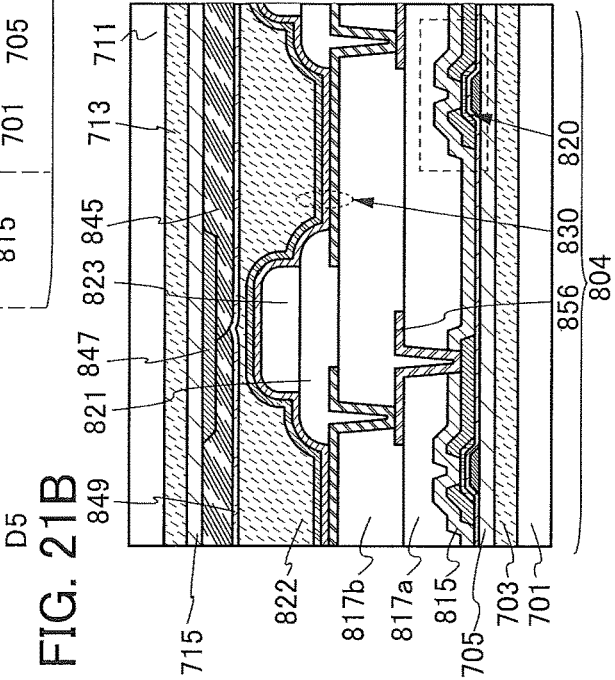

A light-emitting device illustrated in FIG. 21D includes the flexible substrate 701, the bonding layer 703, the insulating layer 705, functional layers (a conductive layer 814, a conductive layer 857*a*, a conductive layer 857*b*, the light-emitting element 830, and the insulating layer 821), the bonding layer 713, and the flexible substrate 711.

The conductive layer 857*a* and the conductive layer 857*b* serve as external connection electrodes of the light-emitting device and can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 has a bottom-emission structure, a top-emission structure, or a dual-emission structure. The electrode, substrate, insulating layer, and the like through which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, the substrate with the light extraction structure can be formed by bonding the above lens or film to a resin substrate with an adhesive or the like having substantially the same refractive index as the substrate, the lens, or the film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, and aluminum, an alloy material containing any of these materials as its main component, and the like. The thickness of the conductive layer 814 can be, for example, greater than or equal to 0.1 µm and less than or equal to 3 µm, preferably greater than or equal to 0.1 µm and less than or equal to 0.5 µm.

<Structure Example 3>

FIG. 20A is a plan view of a light-emitting device. FIG. 22A is an example of a cross-sectional view taken along dashed-dotted line D3-D4 in FIG. 20A. The light-emitting device in Structure example 3 is a bottom-emission light-emitting device using a color filter method.

The light-emitting device illustrated in FIG. 22A includes the flexible substrate 701, the bonding layer 703, the insulating layer 705, functional layers (a plurality of transistors, the conductive layer 857, the insulating layer 815, the coloring layer 845, the insulating layer 817a, the insulating layer 817b, the conductive layer 856, a plurality of light-emitting elements, and the insulating layer 821), the bonding layer 713, and the flexible substrate 711. The flexible substrate 701, the bonding layer 703, the insulating layer 705, the insulating layer 815, the insulating layer 817a, and the insulating layer 817b transmit visible light.

In the light-emitting portion 804, the transistor 820, a transistor 824, and the light-emitting element 830 are provided over the flexible substrate 701 with the bonding layer 703 and the insulating layer 705 positioned therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. The upper electrode 835 preferably reflects visible light. The lower electrode 831 transmits visible light. There is no particular limitation on the position of the coloring layer 845 overlapping with the light-emitting element 830; for example, the coloring layer 845 can be provided between the insulating layer 817a and the insulating layer 817b or between the insulating layer 815 and the insulating layer 817a.

In the driver circuit portion 806, a plurality of transistors are provided over the flexible substrate 701 with the bonding layer 703 and the insulating layer 705 positioned therebetween. FIG. 22A illustrates two of the transistors in the driver circuit portion 806.

The insulating layer 705 and the flexible substrate 701 are attached to each other with the bonding layer 703. The insulating layer 705 is preferably highly resistant to moisture, in which case impurities such as water can be prevented from entering the light-emitting element 830, the transistor 820, or the transistor 824, leading to higher reliability of the light-emitting device.

The conductive layer 857 is electrically connected to an external input terminal through which a signal or a potential from the outside is transmitted to the driver circuit portion 806. In this example, the FPC 808 is provided as the external input terminal, and the conductive layer 857 is formed using the same material and the same step as the conductive layer 856.

<Structure Example 4>

FIG. 20A is a plan view of a light-emitting device. FIG. 22B is an example of a cross-sectional view taken along dashed-dotted line D3-D4 in FIG. 20A. The light-emitting device in Structure example 4 is a top-emission light-emitting device using a separate coloring method.

The light-emitting device in FIG. 22B includes the flexible substrate 701, the bonding layer 703, the insulating layer 705, functional layers (a plurality of transistors, the conductive layer 857, the insulating layer 815, the insulating layer 817, a plurality of light-emitting elements, the insulating layer 821, and the spacer 823), the bonding layer 713, and the flexible substrate 711. The bonding layer 713 and the flexible substrate 711 transmit visible light.

In the light-emitting device illustrated in FIG. 22B, the connector 825 is positioned over the insulating layer 815. The connector 825 is connected to the conductive layer 857 through an opening provided in the insulating layer 815. The connector 825 is also connected to the FPC 808. That is, the FPC 808 and the conductive layer 857 are electrically connected to each other through the connector 825.

<Examples of Materials>

Next, materials that can be used for the light-emitting device are described. Note that description of the components already described in this specification is omitted in some cases.

For the substrates, glass, quartz, an organic resin, a metal, an alloy, a semiconductor, or the like can be used. The substrate through which light from the light-emitting element is extracted is formed using a material that transmits the light.

It is particularly preferable to use a flexible substrate. For example, it is possible to use glass, a metal, or an alloy that is thin enough to have flexibility, or an organic resin. For example, the thickness of the flexible substrate is preferably greater than or equal to 1 µm and less than or equal to 200 µm, further preferably greater than or equal to 1 µm and less than or equal to 100 µm, still further preferably greater than or equal to 10 µm and less than or equal to 50 µm, and particularly preferably greater than or equal to 10 µm and less than or equal to 25 µm.

An organic resin, which has a smaller specific gravity than glass, is preferably used for the flexible substrate, in which case the light-emitting device can be lighter in weight than that using glass.

A material with high toughness is preferably used for the substrates. In that case, a light-emitting device with high impact resistance that is less likely to be broken can be provided. For example, when an organic resin substrate or a metal or alloy substrate with a small thickness is used, the light-emitting device can be lightweight and less likely to be broken as compared with the case where a glass substrate is used.

A metal material and an alloy material, both of which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Although there is no particular limitation on materials for the metal substrate and the alloy substrate, it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, the surface temperature of the light-emitting device can be prevented from rising, leading to prevention of breakage or a decrease in reliability of the light-emitting device. For example, the substrate may have a stacked-layer structure of a metal substrate and a layer with high thermal emissivity (e.g., a layer formed using a metal oxide or a ceramic material).

Examples of a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a cycloolefin resin, a polystyrene resin, a polyamide imide resin, a polyvinyl chloride resin, and a polytetrafluoroethylene (PTFE) resin. In particular, a material with a low coefficient of linear expansion is preferred, and for example, a polyamide imide resin, a polyimide resin, a polyamide resin, or PET can be suitably used. It is also possible to use a substrate in which a fibrous body is impregnated with a resin (also referred to as prepreg) or a substrate whose coefficient of linear expansion is reduced by mixing an organic resin with an inorganic filler.

The flexible substrate may have a stacked-layer structure of a layer of any of the above-mentioned materials and a hard coat layer by which a surface of the device is protected from damage (e.g., a silicon nitride layer), a layer that can disperse pressure (e.g., an aramid resin layer), or the like.

The flexible substrate may be formed by stacking a plurality of layers. When a glass layer is used, a barrier property against water or oxygen can be improved and thus a reliable light-emitting device can be provided.

For example, it is possible to use a flexible substrate in which a glass layer, a bonding layer, and an organic resin layer are stacked from the side closer to a light-emitting element. The thickness of the glass layer is greater than or equal to 20 μm and less than or equal to 200 μm, preferably greater than or equal to 25 μm and less than or equal to 100 μm. With such a thickness, the glass layer can have both high flexibility and a high barrier property against water or oxygen. The thickness of the organic resin layer is greater than or equal to 10 μm and less than or equal to 200 μm, preferably greater than or equal to 20 μm and less than or equal to 50 μm. Providing such an organic resin layer, occurrence of a crack or a break in the glass layer can be suppressed and mechanical strength can be improved. With the substrate using such a composite material of a glass material and an organic resin, a flexible light-emitting device with high reliability can be provided.

For the bonding layer, various curable adhesives such as a photo curable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the light-emitting device.

When a filler with a high refractive index or a light scattering member is contained in the bonding layer, the efficiency of light extraction from the light-emitting element can be improved. For example, titanium oxide, barium oxide, zeolite, or zirconium can be used.

Insulating films highly resistant to moisture are preferably used as the insulating layer 705 and the insulating layer 715. Alternatively, the insulating layer 705 and the insulating layer 715 each preferably have a function of preventing diffusion of impurities to the light-emitting element.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the light-emitting device, it is necessary that at least one of the insulating layer 705 and the insulating layer 715 transmit light emitted from the light-emitting element. One of the insulating layer 705 and the insulating layer 715, which transmits light emitted from the light-emitting element, preferably has higher average transmittance of light having a wavelength greater than or equal to 400 nm and less than or equal to 800 nm than the other.

There is no particular limitation on the structure of the transistors in the light-emitting device. For example, a forward staggered transistor or an inverted staggered transistor may be used. A top-gate transistor or a bottom-gate transistor may be used. There is no particular limitation on a semiconductor material used for the transistors, and silicon, germanium, or an organic semiconductor can be used, for example. Alternatively, an oxide semiconductor containing at least one of indium, gallium, and zinc (e.g., In—Ga—Zn-based metal oxide) may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

In one embodiment of the present invention, a c-axis aligned crystalline oxide semiconductor (CAAC-OS) is preferably used as a semiconductor material for the transistors. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible light-emitting device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single crystal structure. An example of such structures is a nano-crystal (nc) structure, which is an aggregate of nanoscale microcrystals. The crystallinity of a CAAC-OS structure is lower than that of a single crystal structure and higher than that of an nc structure.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In this case, the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element can have any of a top-emission structure, a bottom-emission structure, and a dual-emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy of silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, it is possible to use a stacked film of silver and ITO or a stacked film of an alloy of silver and magnesium and ITO.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 833, either a low molecular compound or a high molecular compound can be used, and an inorganic compound may be used. Each of the layers included in the EL layer 833 can be formed by any of the following methods: an evaporation method (including a vacuum evaporation method), a transfer method, a printing method, an ink-jet method, a coating method, and the like.

The light-emitting element 830 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer is preferably several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Thus, the separation layer and the phosphorescent layer can be separately deposited depending on the presence of the phosphorescent material. With such a structure, the separation layer and the phosphorescent layer can be formed in the same chamber. Thus, the manufacturing cost can be reduced.

Moreover, the light-emitting element 830 may be a single element including one EL layer or a tandem element in which EL layers are stacked with a charge generation layer provided therebetween.

The light-emitting element is preferably provided between a pair of insulating films that are highly resistant to moisture, in which case impurities such as water can be prevented from entering the light-emitting element, thereby preventing a decrease in the reliability of the light-emitting device. Specifically, when insulating films highly resistant to moisture are used as the insulating layer 705 and the insulating layer 715, the light-emitting element is located between a pair of insulating films highly resistant to moisture, whereby a decrease in the reliability of the light-emitting device can be prevented.

As the insulating layer 815, an inorganic insulating film such as a silicon oxide film, a silicon oxynitride film, or an aluminum oxide film can be used, for example. For the insulating layers 817, 817a, and 817b, an organic material such as polyimide, acrylic, polyamide, polyimide amide, or a benzocyclobutene-based resin can be used, for example. Alternatively, a low dielectric constant material (low-k material) or the like can be used. Furthermore, each of the insulating layers may be formed by stacking a plurality of insulating films.

The insulating layer 821 is formed using an organic insulating material or an inorganic insulating material. As a resin, a polyimide resin, a polyamide resin, an acrylic resin, a siloxane resin, an epoxy resin, or a phenol resin can be used, for example. It is particularly preferable that the insulating layer 821 be formed using a photosensitive resin material to have an opening portion over the lower electrode 831 so that a sidewall of the opening portion is formed as an inclined surface with curvature.

The spacer 823 can be formed using an inorganic insulating material, an organic insulating material, a metal material, or the like. As the inorganic insulating material and the organic insulating material, a variety of materials that can be used for the aforementioned insulating layers can be used, for example. As the metal material, titanium, aluminum, or the like can be used. When the spacer 823 containing a conductive material and the upper electrode 835 are electrically connected to each other, a potential drop due to the resistance of the upper electrode 835 can be suppressed. The spacer 823 may have a tapered shape or an inverse tapered shape.

A conductive layer functioning as an electrode of the transistor, a wiring, an auxiliary wiring of the light-emitting element, or the like in the light-emitting device can be formed with a single-layer structure or a stacked-layer structure using any of metal materials such as molybdenum, titanium, chromium, tantalum, tungsten, aluminum, copper, neodymium, and scandium and an alloy material containing any of these elements, for example. The conductive layer may be formed using a conductive metal oxide such as indium oxide (e.g., $In_2O_3$), tin oxide (e.g., $SnO_2$), ZnO, ITO, indium zinc oxide (e.g., $In_2O_3$—ZnO), or any of these metal oxide materials containing silicon oxide.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an ink-jet method, an etching method using a photolithography method, or the like. In a white subpixel, a resin such as a transparent resin may be provided so as to overlap with the light-emitting element.

The light-blocking layer is provided between adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than the light-emitting portion, such as a driver circuit portion, in which case undesired leakage of guided light or the like can be suppressed.

An overcoat covering the coloring layer and the light-blocking layer may be provided. The overcoat can prevent impurities and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

In the case where upper surfaces of the coloring layer and the light-blocking layer are coated with a material of the bonding layer, a material that has high wettability with respect to the material of the bonding layer is preferably used as the material of the overcoat. For example, the overcoat is preferably an oxide conductive film such as an ITO film or a metal film such as an Ag film that is thin enough to transmit light.

When the overcoat is formed using a material that has high wettability with respect to the material for the bonding layer, the material for the bonding layer can be uniformly applied. Thus, entry of bubbles in the step of attaching the pair of substrates to each other can be prevented, and thus a display defect can be prevented.

For the connector, any of a variety of anisotropic conductive films (ACF), anisotropic conductive pastes (ACP), and the like can be used.

As described above, one embodiment of the present invention can be used in a light-emitting device, a display device, an input/output device, and the like.

For example, in this specification and the like, an active matrix method in which an active element (a non-linear element) is included in a pixel or a passive matrix method in which an active element is not included in a pixel can be used.

In the active matrix method, as an active element, not only a transistor but also a variety of active elements, for example, a metal insulator metal (MIM) or a thin film diode (TFD) can be used. These elements are manufactured with a small number of steps, resulting in low manufacturing cost or high yield. Furthermore, since these elements are small, the aperture ratio can be increased, leading to low power consumption and high luminance.

Since an active element is not used in a passive matrix method, the number of manufacturing steps is small, so that the manufacturing cost can be reduced or the yield can be improved. Furthermore, since an active element is not used in a passive matrix method, the aperture ratio can be improved, so that power consumption can be reduced or higher luminance can be achieved.

Note that the light-emitting device of one embodiment of the present invention may be used as a display device or as a lighting device. For example, it may be used as a light source such as a backlight or a front light, that is, a lighting device for a display device.

This embodiment can be combined with any other embodiment as appropriate.

[Embodiment 6]

In this embodiment, an input/output device that can be manufacturing by applying one embodiment of the present invention is described with reference to drawings. Note that the above description can be referred to for the components of an input/output device which are similar to those of the light-emitting device described in Embodiment 5. Although a touch panel including a light-emitting element is described in this embodiment as an example, one embodiment of the present invention is not limited to this example.

<Structure Example 1>

Figure 23A:
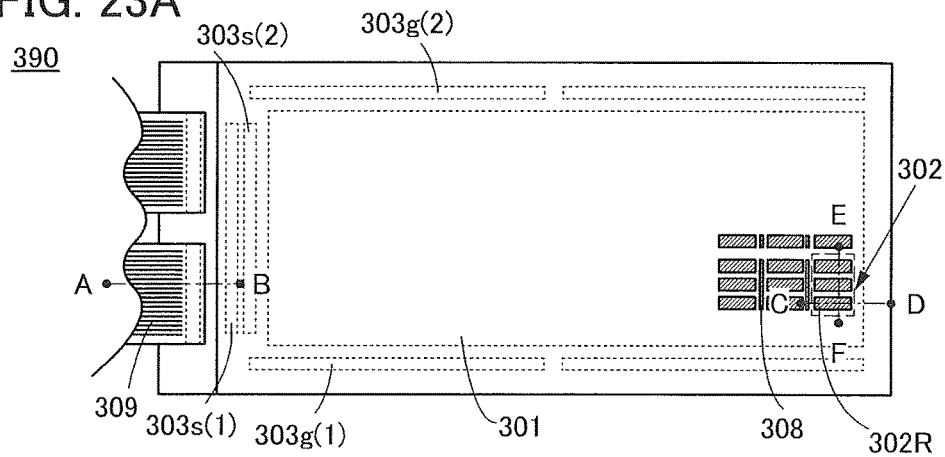
FIGS. 23A to 23C illustrate an example of an input/output device.
Figure 23B:
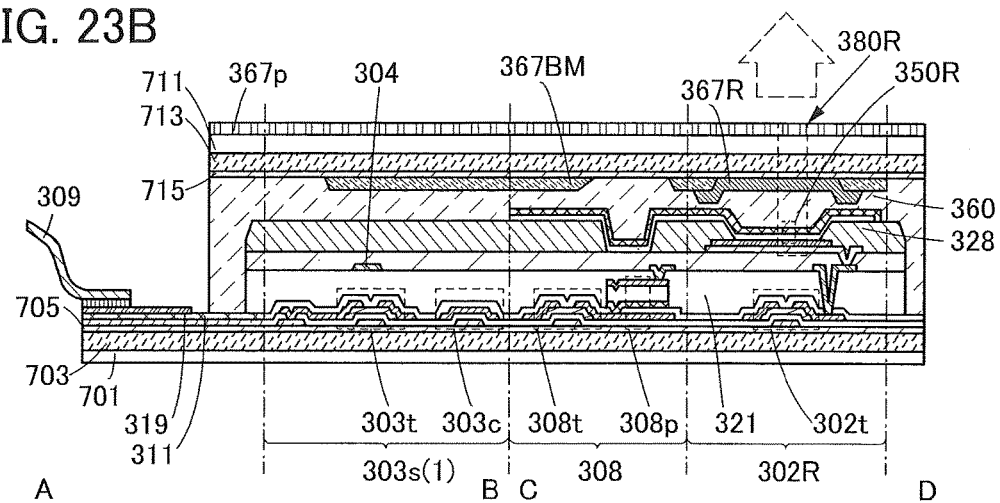
Figure 23C:
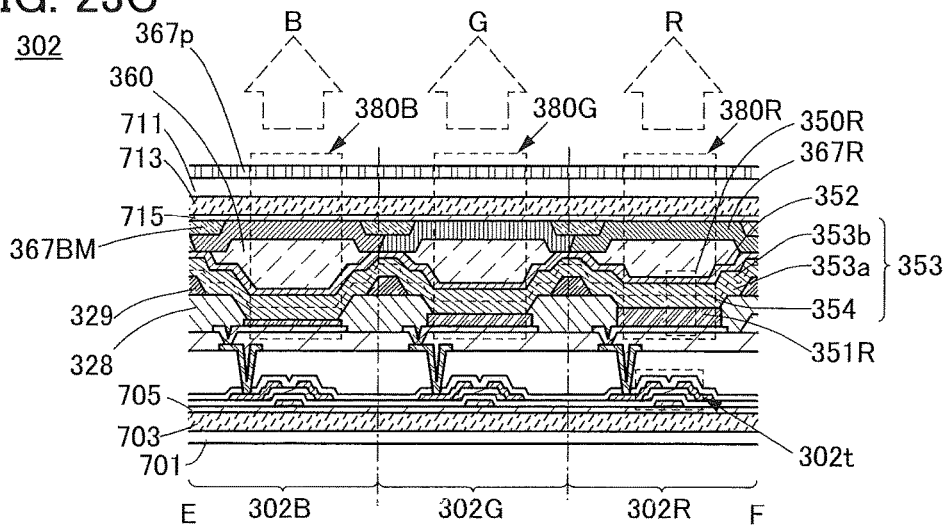

FIG. 23A is a top view of the input/output device. FIG. 23B is a cross-sectional view taken along dashed-dotted line A-B and dashed-dotted line C-D in FIG. 23A. FIG. 23C is a cross-sectional view taken along dashed-dotted line E-F in FIG. 23A.

A touch panel 390 illustrated in FIG. 23A includes a display portion 301 (serving also as an input portion), a scan line driver circuit 303$g$(1), an imaging pixel driver circuit 303$g$(2), an image signal line driver circuit 303$s$(1), and an imaging signal line driver circuit 303$s$(2).

The display portion 301 includes a plurality of pixels 302 and a plurality of imaging pixels 308.

The pixel 302 includes a plurality of subpixels. Each subpixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303$g$(1) can supply selection signals to the pixels 302.

The image signal line driver circuit 303$s$(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303$g$(2) can supply control signals to the imaging pixels 308.

The imaging signal line driver circuit 303$s$(2) can read out imaging signals.

As illustrated in FIGS. 23B and 23C, the touch panel 390 includes the flexible substrate 701, the bonding layer 703, the insulating layer 705, the flexible substrate 711, the bonding layer 713, and the insulating layer 715. The flexible substrate 701 and the flexible substrate 711 are bonded to each other with a bonding layer 360.

The flexible substrate 701 and the insulating layer 705 are attached to each other with the bonding layer 703. The flexible substrate 711 and the insulating layer 715 are attached to each other with the bonding layer 713. Embodiment 3 can be referred to for materials used for the substrates, the bonding layers, and the insulating layers.

Each of the pixels 302 includes a subpixel 302R, a subpixel 302G, and a subpixel 302B (see FIG. 23C). The sub-pixel 302R includes a light-emitting module 380R, the sub-pixel 302G includes a light-emitting module 380G, and the sub-pixel 302B includes a light-emitting module 380B.

For example, the subpixel 302R includes a light-emitting element 350R and the pixel circuit. The pixel circuit includes a transistor 302$t$ that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 23C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

For example, the light-emitting module 380R includes the bonding layer 360 that is in contact with the light-emitting element 350R and the coloring layer 367R. The coloring layer 367R is positioned in a region overlapping with the light-emitting element 350R. Accordingly, part of light emitted from the light-emitting element 350R passes through the bonding layer 360 and through the coloring layer 367R and is emitted to the outside of the light-emitting module 380R as denoted by arrows in FIGS. 23B and 23C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for planarizing unevenness caused by the pixel circuits and the imaging pixel circuits. The transistor 302t is preferably covered with an insulating layer that can inhibit diffusion of impurities to the transistor 302t and the like.

The touch panel 390 includes a partition 328 that overlaps with an end portion of the lower electrode 351R. A spacer 329 that controls the distance between the flexible substrate 701 and the flexible substrate 711 is provided on the partition 328.

The image signal line driver circuit 303s(1) includes a transistor 303t and a capacitor 303c. Note that the driver circuit can be formed in the same process and over the same substrate as the pixel circuits. As illustrated in FIG. 23B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for the transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t. For example, a PIN photodiode can be used as the photoelectric conversion element 308p.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302t, 303t, and 308t can be formed in the same process. Alternatively, the transistors may be formed in different processes.

<Structure Example 2>

Figure 24A:
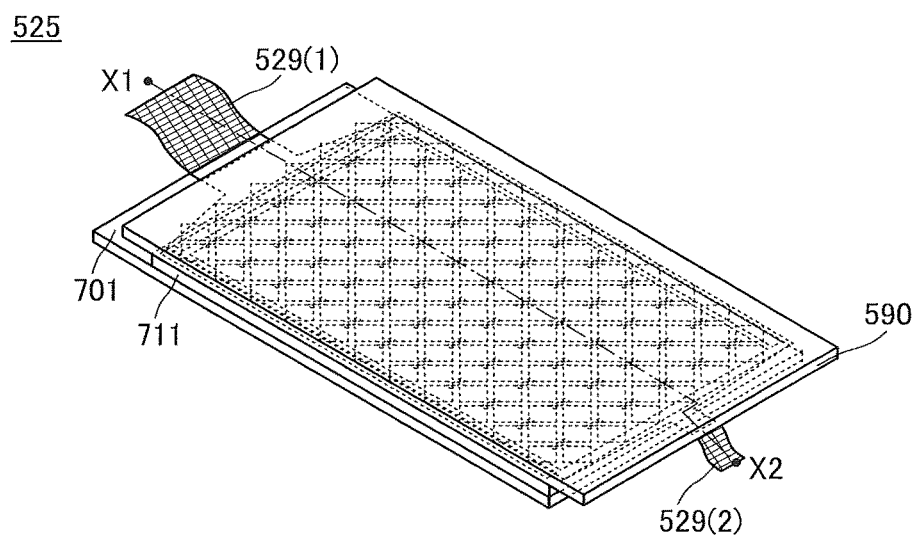
FIGS. 24A and 24B illustrate an example of an input/output device.
Figure 24B:
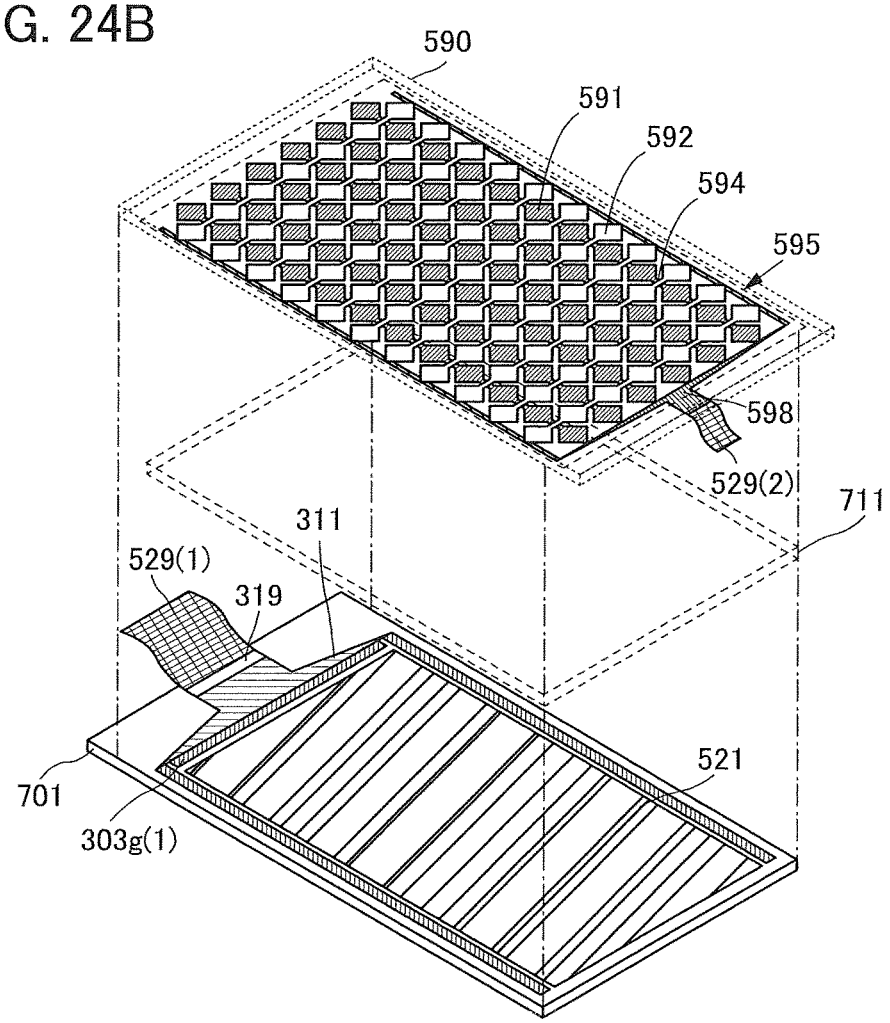
Figure 25A:
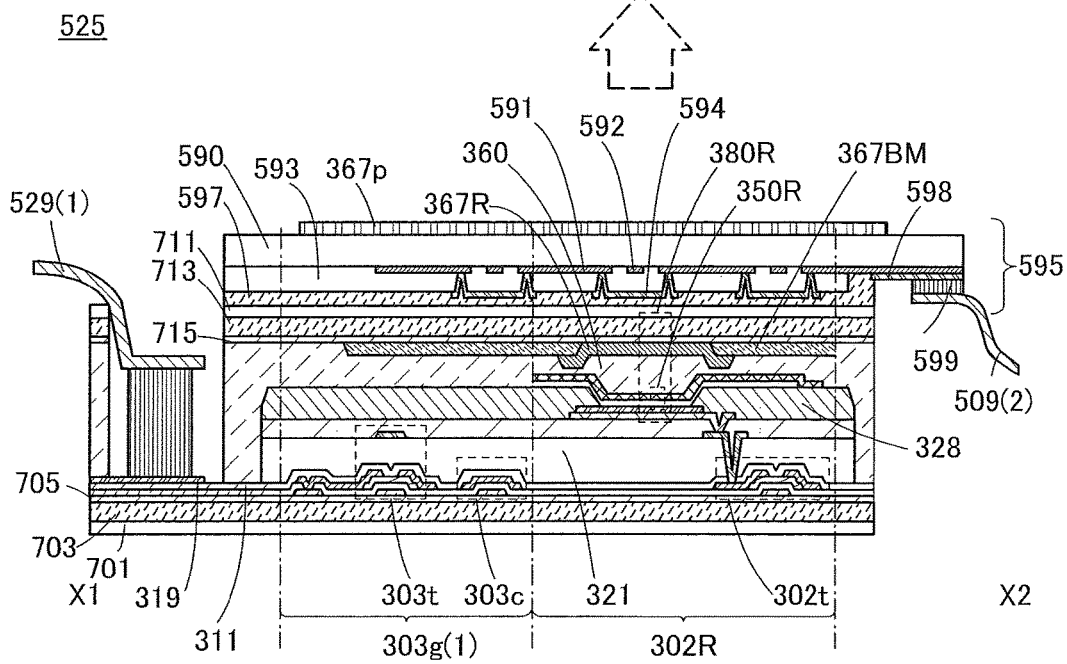
FIGS. 25A and 25B illustrate examples of an input/output device.
Figure 25B:
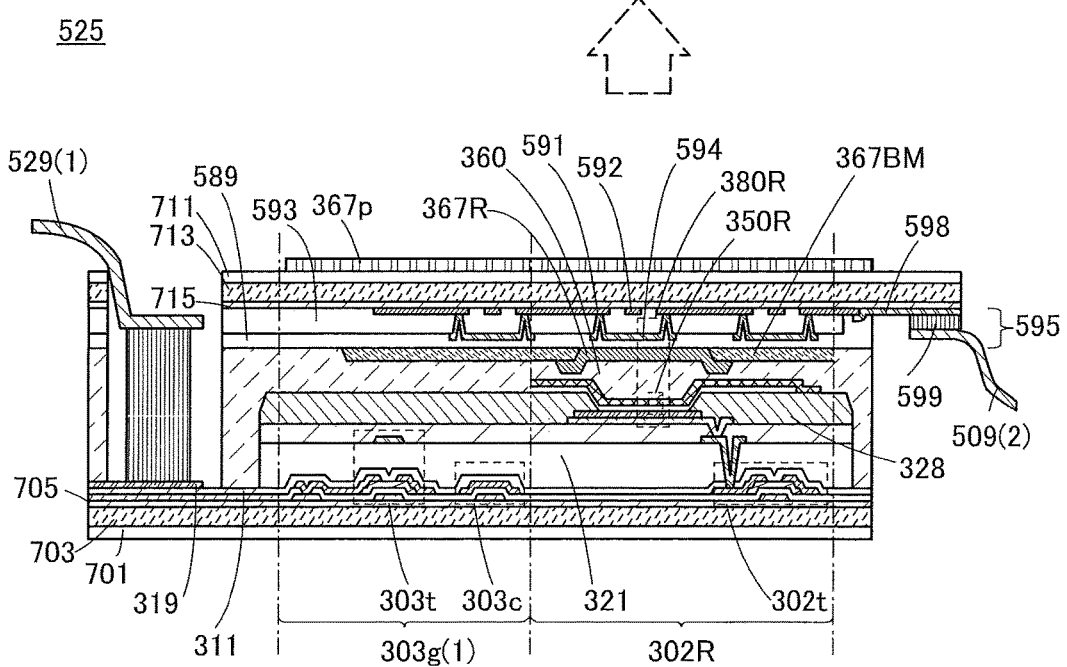

FIGS. 24A and 24B are perspective views of a touch panel 525. Note that FIGS. 24A and 24B illustrate only main components for simplicity. FIGS. 25A and 25B are each a cross-sectional view taken along dashed-dotted line X1-X2 in FIG. 24A.

As illustrated in FIGS. 24A and 24B, the touch panel 525 includes a display portion 521, the scan line driver circuit 303g(1), a touch sensor 595, and the like. Furthermore, the touch panel 525 includes the flexible substrate 701, the flexible substrate 711, and a flexible substrate 590.

The touch panel 525 includes a plurality of pixels and a plurality of wirings 311. The plurality of wirings 311 can supply signals to the pixels. The plurality of wirings 311 are arranged to a peripheral portion of the flexible substrate 701, and part of the plurality of wirings 311 form the terminal 319. The terminal 319 is electrically connected to an FPC 529(1).

The touch panel 525 includes the touch sensor 595 and a plurality of wirings 598. The plurality of wirings 598 are electrically connected to the touch sensor 595. The plurality of wirings 598 are arranged to a peripheral portion of the flexible substrate 590, and part of the plurality of wirings 598 form a terminal. The terminal is electrically connected to an FPC 529(2). Note that in FIG. 24B, electrodes, wirings, and the like of the touch sensor 595 provided on the back side of the flexible substrate 590 (the side facing the flexible substrate 701) are denoted by solid lines for clarity.

As the touch sensor 595, for example, a capacitive touch sensor can be used. Examples of the capacitive touch sensor are a surface capacitive touch sensor and a projected capacitive touch sensor. An example of using a projected capacitive touch sensor is described here.

Examples of a projected capacitive touch sensor are a self-capacitive touch sensor and a mutual capacitive touch sensor. The use of a mutual capacitive type is preferable because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 24A and 24B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90°.

The wiring 594 intersects with the electrode 592. The wiring 594 electrically connects two electrodes 591 between which one of the electrodes 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes.

As illustrated in FIG. 25A, the touch panel 525 includes the flexible substrate 701, the bonding layer 703, the insulating layer 705, the flexible substrate 711, the bonding layer 713, and the insulating layer 715. The flexible substrate 701 and the flexible substrate 711 are attached to each other with the bonding layer 360.

A bonding layer 597 attaches the flexible substrate 590 to the flexible substrate 711 so that the touch sensor 595 overlaps with the display portion 521. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

Note that as a material of the conductive films such as the electrodes 591, the electrodes 592, and the wiring 594, that is, wirings and electrodes forming the touch panel, a transparent conductive film including indium oxide, tin oxide, zinc oxide, or the like (e.g., ITO) can be given. A low-resistance material is preferably used as a material that is used as the wirings and electrodes forming the touch panel. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance value of 40 ohm/square or more and 100 ohm/square or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

The electrodes 591 and the electrodes 592 may be formed by depositing a light-transmitting conductive material on the flexible substrate 590 by a sputtering method and then removing an unnecessary portion by any of various patterning techniques such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 529(2).

The display portion 521 includes a plurality of pixels arranged in a matrix. Each pixel has the same structure as Structure Example 1; thus, description is omitted.

As illustrated in FIG. 25B, the touch panel may include two substrates of the flexible substrate 701 and the flexible substrate 711 without including the flexible substrate 590. The flexible substrate 711 and the insulating layer 715 are attached to each other with the bonding layer 713, and the touch sensor 595 is provided in contact with the insulating layer 715. The coloring layer 367R and the light-blocking layer 367BM are provided in contact with the insulating layer 589 that covers the touch sensor 595. The insulating layer 589 is not necessarily provided, in which case thecoloring layer 367R or the light-blocking layer 367BM is provided in contact with the wiring 594.

<Structure Example 3>

Figure 26A:
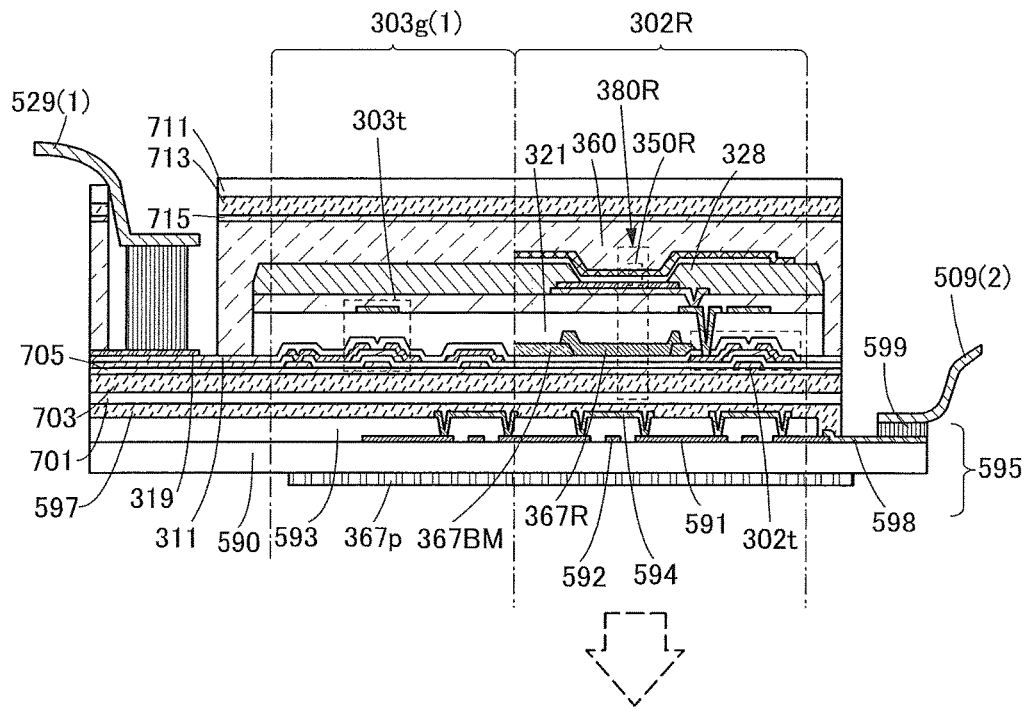
FIGS. 26A to 26C illustrate an example of an input/output device.
Figure 26B:
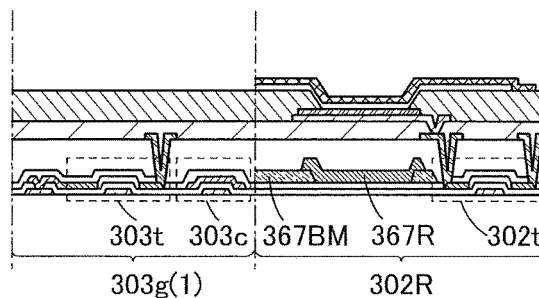
Figure 26C:
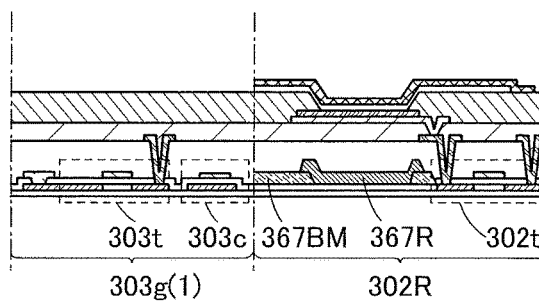

FIGS. 26A to 26C are cross-sectional views of a touch panel 525B. The touch panel 525B described in this embodiment is different from the touch panel 525 in Structure example 2 in that received image data is displayed on the side where the transistors are provided and that the touch sensor is provided on the flexible substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 26A emits light to the side where the transistor 302t is provided. Accordingly, part of light emitted from the light-emitting element 350R passes through the coloring layer 367R and is emitted to the outside of the light-emitting module 380R as denoted by an arrow in FIG. 26A.

The touch panel 525B includes the light-blocking layer 367BM on the light extraction side. The light-blocking layer 367BM is provided so as to surround the coloring layer (e.g., the coloring layer 367R).

The touch sensor 595 is provided not on the flexible substrate 711 side but on the flexible substrate 701 side (see FIG. 26A).

The bonding layer 597 attaches the flexible substrate 590 to the flexible substrate 701 so that the touch sensor 595 overlaps with the display portion. The bonding layer 597 has a light-transmitting property.

Note that a structure in the case of using bottom-gate transistors in the display portion 521 is illustrated in FIGS. 26A and 26B.

For example, a semiconductor layer containing an oxide semiconductor, amorphous silicon, or the like can be used in the transistor 302t and the transistor 303t illustrated in FIG. 26A.

For example, a semiconductor layer containing polycrystalline silicon or the like can be used in the transistor 302t and the transistor 303t illustrated in FIG. 26B.

A structure in the case of using top-gate transistors is illustrated in FIG. 26C.

For example, a semiconductor layer containing polycrystalline silicon, a single crystal silicon film that is transferred from a single crystal silicon substrate, or the like can be used in the transistor 302t and the transistor 303t illustrated in FIG. 26C.

This embodiment can be combined with any other embodiment as appropriate.

[Embodiment 7]

In this embodiment, electronic devices and lighting devices of embodiments of the present invention are described with reference to drawings.

With the use of the light-emitting device, the display device, the input-output device, or the like of one embodiment of the present invention, an electronic device or a lighting device with high reliability can be fabricated. Furthermore, with the use of the light-emitting device, the display device, the input-output device, or the like of one embodiment of the present invention, an electronic device or a lighting device with high reliability that has a curved surface or flexibility can be fabricated.

Examples of electronic devices include a television set (also referred to as a television or a television receiver), a monitor of a computer or the like, a digital camera, a digital video camera, a digital photo frame, a mobile phone (also referred to as a cellular phone or a mobile phone device), a portable game console, a portable information terminal, an audio reproducing device, and a large game machine such as a pinball machine.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery can be charged by non-contact power transmission.

Examples of the secondary battery include a lithium ion secondary battery such as a lithium polymer battery using a gel electrolyte (lithium ion polymer battery), a lithium ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

FIGS. 27A, 27B, 27C1, 27C2, 27D, and 27E illustrate examples of an electronic device including a display portion 7000 with a curved surface. The display surface of the display portion 7000 is curved, and images can be displayed on the curved display surface. The display portion 7000 may be flexible.

The display portion 7000 is formed using the light-emitting device, the display device, the input-output device, or the like of one embodiment of the present invention.

One embodiment of the present invention makes it possible to provide an electronic device having a curved display portion and high reliability.

FIG. 27A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 27A includes a touch sensor in the display portion 7000. Moreover, operations such as making a call and inputting characters can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

FIG. 27B illustrates an example of a television set. In the television set 7200, the display portion 7000 is incorporated into the housing 7201. Here, the housing 7201 is supported by a stand 7203.

The television set 7200 illustrated in FIG. 27B can be operated with an operation switch of the housing 7201 or a separate remote controller 7211. The display portion 7000 may include a touch sensor. The television set 7200 can be operated by touching the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 27C1, 27C2, 27D, and 27E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

Figure 2:
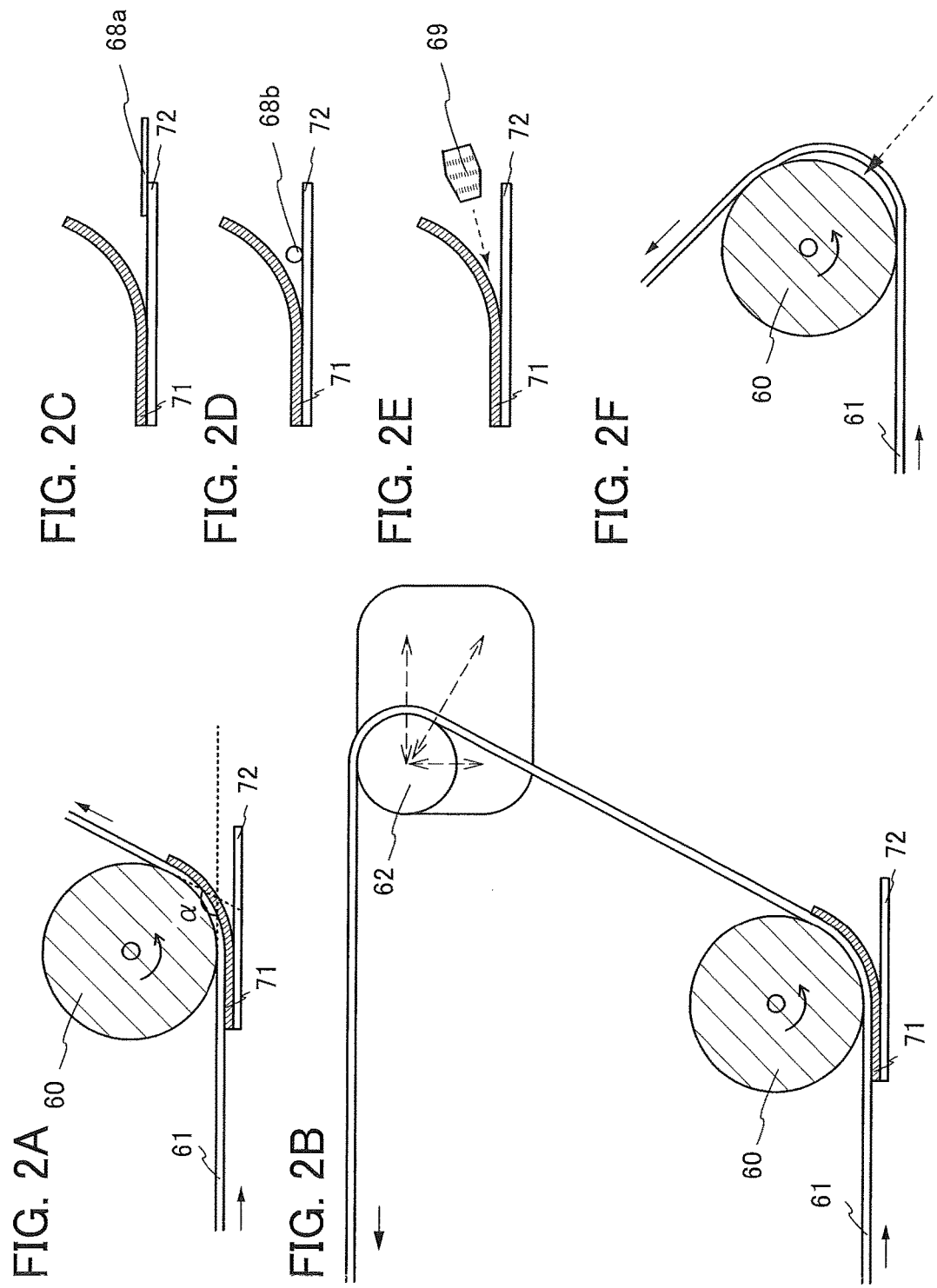

FIG. 27C1 is a perspective view of a portable information terminal 7300. FIG. 27C2 is a top view of the portable information terminal 7300. FIG. 27D is a perspective view of a portable information terminal 7310. FIG. 27E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals described in this embodiment can execute a variety of applications such as mobile phone calls, e-mailing, reading and editing texts, music reproduction, Internet communication, and a computer game, for example.

The portable information terminals 7300, 7310, and 7320 can display characters and image data on its plurality of surfaces. For example, as illustrated in FIGS. 27C1 and 27D, three operation buttons 7302 can be displayed on one surface, and data 7303 indicated by a rectangle can be displayed on another surface. FIGS. 27C1 and 27C2 illustrate an example in which data is displayed at the top of the portable information terminal. FIG. 27D illustrates an example in which data is displayed on the side of the portable information terminal. Data may be displayed on three or more surfaces of the portable information terminal. FIG. 27E illustrates an example where data 7304, data 7305, and data 7306 are displayed on different surfaces.

Examples of the data include notification from a social networking service (SNS), display indicating reception of e-mail or an incoming call, the title of e-mail or the like, the sender of e-mail or the like, the date, the time, remaining battery, the reception strength of an antenna, and the like. Instead of the data, an operation button, an icon, or the like may be displayed on the position where the data is displayed.

For example, a user of the portable information terminal 7300 can see the display (here, the data 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 27F to 27H each illustrate an example of a lighting device having a curved light-emitting portion.

The light-emitting portion included in each of the lighting devices illustrated in FIGS. 27F to 27H can be manufactured using the light-emitting device or the like of one embodiment of the present invention.

One embodiment of the present invention makes it possible to provide a lighting device having a curved light-emitting portion and high reliability.

A lighting device 7400 illustrated in FIG. 27F includes a light-emitting portion 7402 having a wave-shaped light-emitting surface, which is a good-design lighting device.

A light-emitting portion 7412 included in the lighting device 7410 illustrated in FIG. 27G has two convex-curved light-emitting portions symmetrically placed. Thus, all directions can be illuminated with the lighting device 7410 as a center.

A lighting device 7420 illustrated in FIG. 27H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that an emission surface of the light-emitting portion can be curved freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 28A1, 28A2, and 28B to 28I illustrate examples of a portable information terminal including a display portion 7001 having flexibility The display portion 7001 is manufactured using the light-emitting device, the display device, the input-output device, or the like of one embodiment of the present invention. For example, a light-emitting device, a display device, or an input-output device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

One embodiment of the present invention makes it possible to provide a highly reliable electronic device including a display portion having flexibility.

FIG. 28A1 is a perspective view illustrating an example of a portable information terminal and FIG. 28A2 is a side view illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 28A1, 28A2, and 28B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 28B illustrates the portable information terminal 7500 in a state where the display portion 7001 is pulled out. Videos can be displayed on the display portion 7001 in this state. The display portion 7001 can be pulled out by using the display portion tab 7502. In addition, the portable information terminal 7500 may perform different displays in the state where part of the display portion 7001 is rolled as shown in FIG. 28A1 and in the state where the display portion 7001 is pulled out as shown in FIG. 28B. For example, in the state shown in FIG. 28A1, the rolled portion of the display portion 7001 is put in a non-display state, which results in a reduction in power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 28C to 28E illustrate an example of a foldable portable information terminal. FIG. 28C illustrates a portable information terminal 7600 that is opened. FIG. 28D illustrates the portable information terminal 7600 that is being opened or being folded. FIG. 28E illustrates the portable information terminal 7600 that is folded. The portable information terminal 7600 is highly portable when folded, and is highly browsable when opened because of a large seamless display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 28F and 28G illustrate an example of a foldable portable information terminal. FIG. 28F illustrates a portable information terminal 7650 that is folded so that the display portion 7001 is on the inside. FIG. 28G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 28H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be changed in shape freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 28I illustrates an example of a wrist-watch-type portable information terminal. The portable information terminal 7800 includes a band 7801, the display portion 7001, an input-output terminal 7802, operation buttons 7803, and the like. The band 7801 has a function of a housing. A flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 29A:
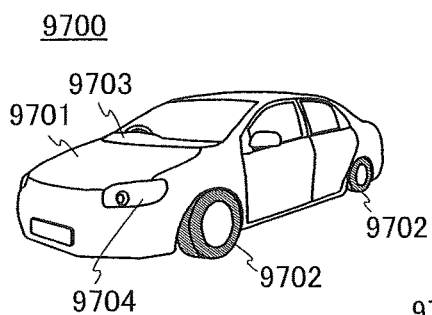
FIGS. 29A to 29E illustrate examples of an electronic device.
Figure 29B:
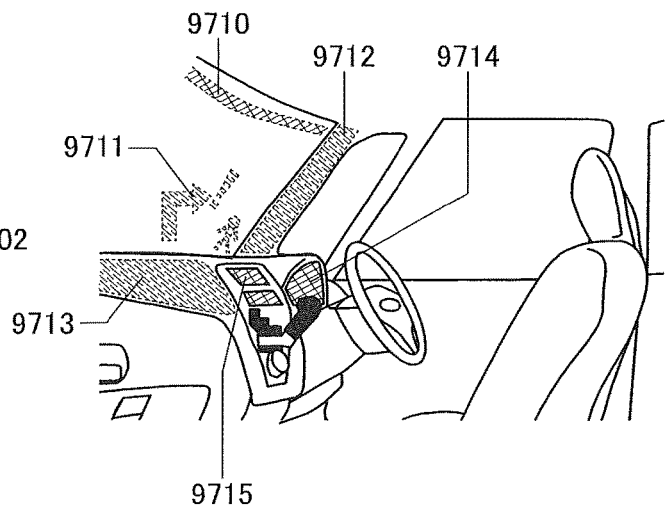

FIG. 29A is an external view of an automobile 9700. FIG. 29B illustrates a driver's seat of the automobile 9700. The automobile 9700 includes a car body 9701, wheels 9702, a dashboard 9703, lights 9704, and the like. The display device, the input-output device, or the like of one embodiment of the present invention can be used in a display portion or the like of the automobile 9700. For example, the display device, the input-output device, or the like of one embodiment of the present invention can be used in display portions 9710 to 9715 illustrated in FIG. 29B.

The display portion 9710 and the display portion 9711 are display devices provided in an automobile windshield. The display device or the input-output device of one embodiment of the present invention can be a see-through device, through which the opposite side can be seen, by using a light-transmitting conductive material for its electrodes and wirings. The see-through display portion 9710 or the see-through display portion 9711 does not hinder driver's vision during driving of the automobile 9700. Therefore, the display device or the input-output device of one embodiment of the present invention can be provided in the windshield of the automobile 9700. Note that in the case where a transistor or the like for driving the display device or the input-output device is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 29C:
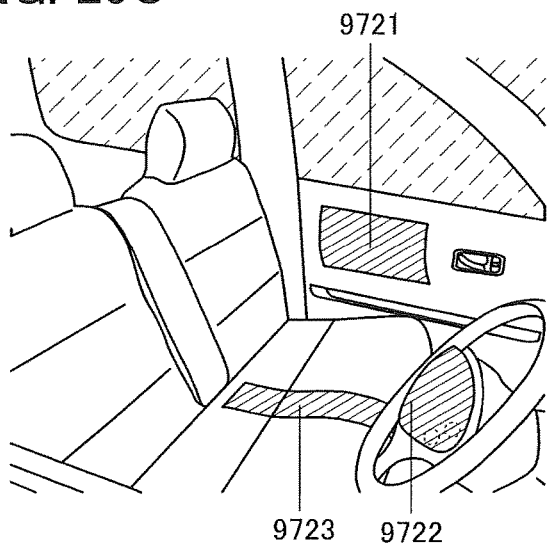

FIG. 29C illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of data such as navigation data, a speedometer, a tachometer, a mileage, a fuel meter, a gearshift indicator, and air-condition setting. The content, layout, or the like of the display on the display portions can be changed freely by a user as appropriate. The data listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portion in which the light-emitting device, display device, input-output device, or the like of one embodiment of the present invention is used may have a flat surface. In this case, the light-emitting device, the display device, the input/output device, or the like of one embodiment of the present invention need not necessarily have a curved surface or flexibility.

Figure 29D:
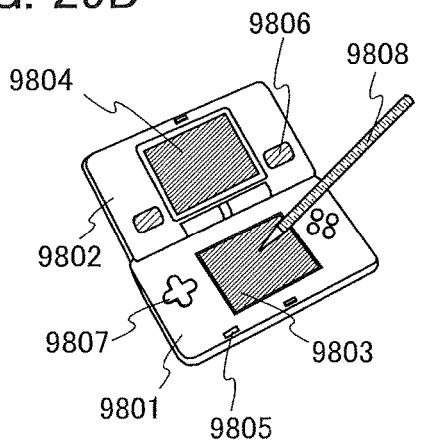

FIG. 29D illustrates a portable game console including a housing 9801, a housing 9802, a display portion 9803, a display portion 9804, a microphone 9805, a speaker 9806, an operation key 9807, a stylus 9808, and the like.

The portable game console illustrated in FIG. 29D includes two display portions 9803 and 9804. Note that the number of display portions of an electronic device of one embodiment of the present invention is not limited to two and can be one or three or more as long as at least one display portion includes the light-emitting device, the display device, the input-output device, or the like of one embodiment of the present invention.

Figure 29E:
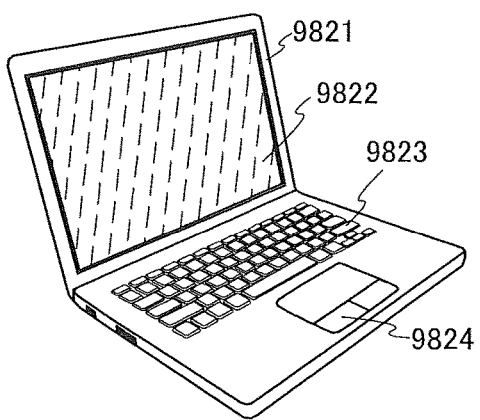

FIG. 29E illustrates a laptop personal computer, which includes a housing 9821, a display portion 9822, a keyboard 9823, a pointing device 9824, and the like.

This embodiment can be combined with any other embodiment as appropriate.

EXAMPLE 1

In this example, a separation apparatus of one embodiment of the present invention is described with reference to FIGS. 30A and 30B and FIGS. 31A and 31B.

Figure 30A:
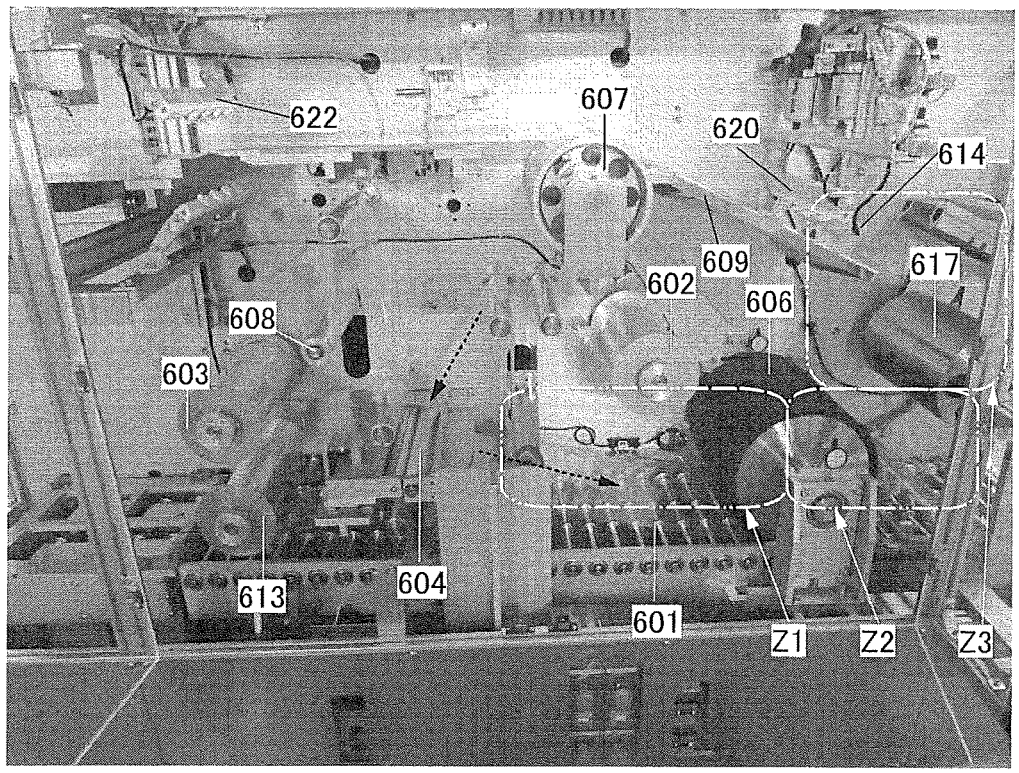
FIGS. 30A and 30B illustrate an example of a separation apparatus in Example 1.

A separation apparatus illustrated in FIG. 30A has a structure similar to that of the separation apparatus of FIG. 4 described in Embodiment 1. Note that in photographs shown in FIGS. 30A and 30B and FIGS. 31A and 31B, no member to be processed is transferred in the separation apparatus.

Specifically, the separation apparatus in FIG. 30A includes the tape reel 602, the first wind-up reel 603, the direction changing roller 604, the first press roller 606, the tension roller 608, the carrier plate 609 the second wind-up reel 613, the drying mechanism 614, the roller 617, the ionizer 620, the ionizer 622, and the like.

Figure 30B:
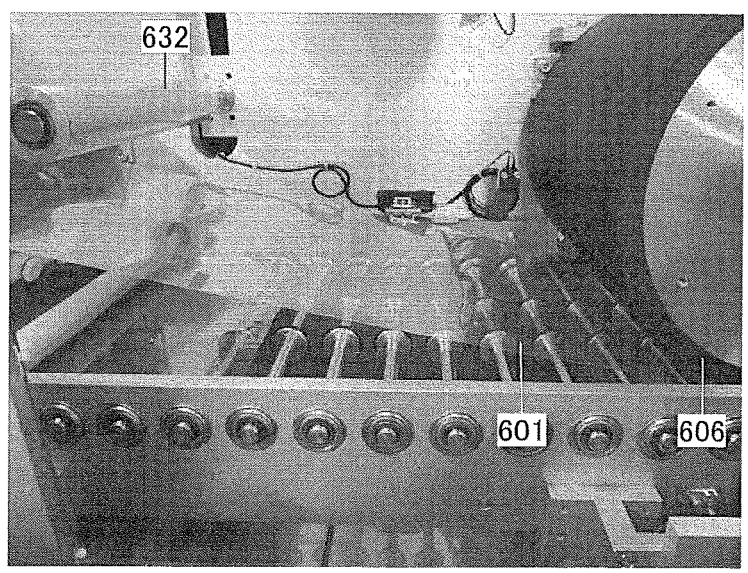
Figure 31A:
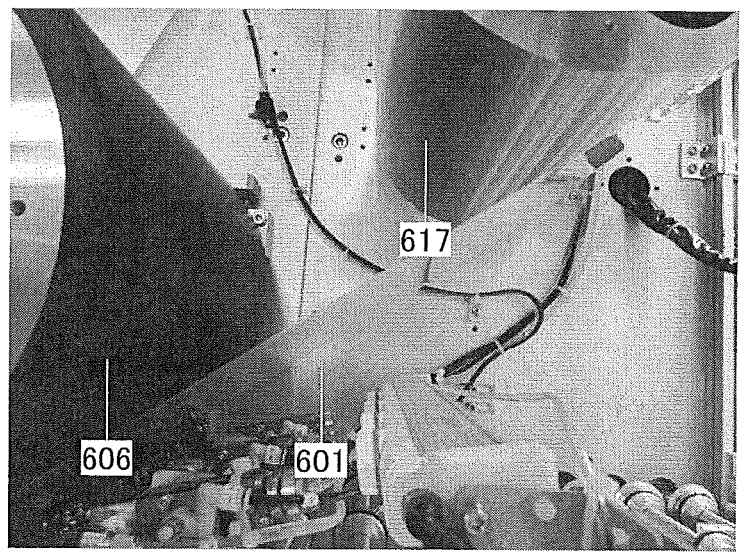
FIGS. 31A and 31B illustrate an example of a separation apparatus in Example 1.
Figure 31B:
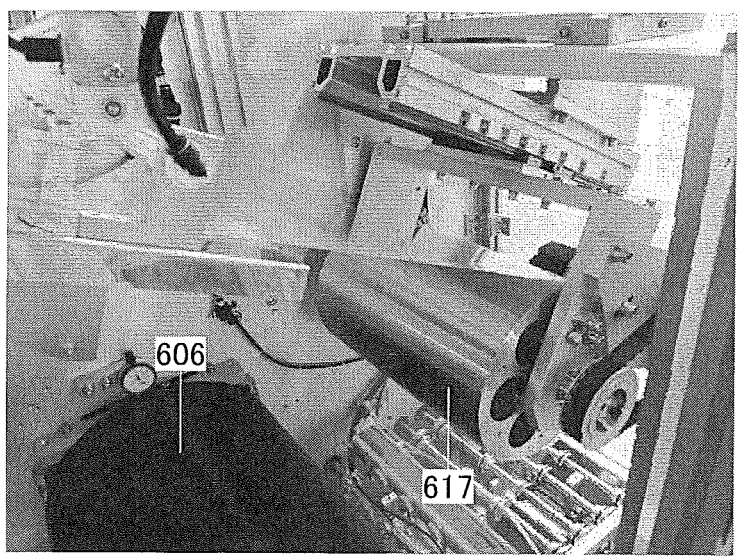

FIG. 30B, FIG. 31A, and FIG. 31B show a region Z1, a region Z2, and a region Z3 in FIG. 30A, respectively.

As shown in FIG. 30B, when the support body 601 is transferred, the support body 601 is at a higher level than that of the transfer mechanism before reaching the first press roller 606 so as to be sufficiently distant from the transfer mechanism Therefore, the support body 601 and a process member can be prevented from being in contact with each other before the support body 601 is bonded to the process member by the first press roller 606. The guide roller 632 can apply tension to the support body 601, as shown in FIG. 30B.

As shown in FIGS. 31A and 31B, the roller 617 can control the angle at which the first press roller 606 bends back the support body 601. Specifically, the roller 617 can change the angle at which the first press roller 606 bends back the support body 601 by moving along a rail.

This application is based on Japanese Patent Application serial no. 2015-107024 filed with Japan Patent Office on May 27, 2015, the entire contents of which are hereby incorporated by reference.

What is claimed is:

1. A separation apparatus comprising:
   a support body supply unit;
   a support body hold unit;
   a direction changing mechanism; and
   a first structure body,
   wherein the direction changing mechanism is located between the support body supply unit and the support body hold unit,
   wherein the first structure body is located between the direction changing mechanism and the support body hold unit,
   wherein the support body supply unit is configured to feed a support body having a sheet-like shape,
   wherein the support body supply unit includes one of a pair of tension applying mechanisms,
   wherein the support body hold unit includes the other of the pair of tension applying mechanisms,
   wherein the pair of tension applying mechanisms is configured to apply tension to the support body,
   wherein the direction changing mechanism is configured to change a feed direction of the support body from a first direction to a second direction,
   wherein the first structure body is configured to change the feed direction of the support body from the second direction to a third direction,
   wherein the first structure body includes a convex surface,
   wherein the first structure body is configured to bond the support body to a surface of a process member,
   wherein the first structure body is configured to change the feed direction of the support body along the convex surface to divide the process member into a first member and a second member, and
   wherein when at least part of the process member is located between the direction changing mechanism and the first structure body, a shortest distance between the direction changing mechanism and a first plane including the surface of the first member is longer than a shortest distance between the first plane and the first structure body.

2. The separation apparatus according to claim 1, wherein an angle at which the first structure body bends back the support body is an obtuse angle.

3. The separation apparatus according to claim 1, further comprising a second structure body having a convex surface,
   wherein the second structure body is located between the first structure body and the support body hold unit,
   wherein the second structure body is configured to send the support body from the first structure body to the support body hold unit along the convex surface, and
   wherein the second structure body is configured to apply tension to the support body by moving the shaft of the second structure body.

4. The separation apparatus according to claim 3, wherein a radius of curvature of the convex surface included in the first structure body is larger than a radius of curvature of the convex surface included in the second structure body.

5. The separation apparatus according to claim 1, further comprising a second structure body having a convex surface,
   wherein the second structure body is located between the first structure body and the support body hold unit,
   wherein the second structure body is configured to send the support body from the first structure body to the support body hold unit along the convex surface, and wherein the second structure body is configured to control an angle at which the first structure body bends back the support body.

6. The separation apparatus according to claim 5, wherein a radius of curvature of the convex surface included in the first structure body is larger than a radius of curvature of the convex surface included in the second structure body.

7. The separation apparatus according to claim 1, further comprising a fixing mechanism,
wherein the fixing mechanism is configured to fix the second member at least part of which is separated from the first member.

8. The separation apparatus according to claim 1, further comprising a liquid supply mechanism,
wherein the liquid supply mechanism is configured to supply liquid between the first member and the second member.

9. The separation apparatus according to claim 1, wherein the radius of curvature of the convex surface included in the first structure body is greater than or equal to 0.5 mm and less than or equal to 1000 mm.

10. The separation apparatus according to claim 1, further comprising a reel,
wherein the reel is located between the support body supply unit and the support body hold unit,
wherein a tape is bonded to one surface of the support body, and
wherein the reel is configured to wind up the tape.

11. A separation apparatus comprising:
a support body supply unit;
a support body hold unit;
a direction changing mechanism;
a pressure applying mechanism;
a first structure body; and
a second structure body,
wherein the direction changing mechanism is located between the support body supply unit and the support body hold unit,
wherein the first structure body is located between the direction changing mechanism and the support body hold unit,
wherein the pressure applying mechanism is located between the direction changing mechanism and the first structure body,
wherein the support body supply unit is configured to feed a support body having a sheet-like shape,
wherein the support body supply unit includes one of a pair of tension applying mechanisms,
wherein the support body hold unit includes the other of the pair of tension applying mechanisms,
wherein the pair of tension applying mechanisms is configured to apply tension to the support body,
wherein the direction changing mechanism is configured to change a feed direction of the support body from a first direction to a second direction,
wherein the pressure applying mechanism is configured to change the feed direction of the support body from the second direction to a third direction,
wherein the pressure applying mechanism is configured to bond the support body to a surface of a process member,
wherein the first structure body includes a convex surface,
wherein the first structure body is configured to change the feed direction of the support body along the convex surface to divide the process member into a first member and a second member,
wherein when at least part of the process member is located between the direction changing mechanism and the pressure applying mechanism, a shortest distance between the direction changing mechanism and a first plane including the surface of the first member is longer than a shortest distance between the first plane and the pressure applying mechanism,
wherein the second structure body includes a convex surface,
wherein the second structure body is located between the first structure body and the support body hold unit,
wherein the second structure body is configured to send the support body from the first structure body to the support body hold unit along the convex surface, and
wherein the second structure body is configured to control an angle at which the first structure body bends back the support body.

12. The separation apparatus according to claim 11, wherein the angle at which the first structure body bends back the support body is an obtuse angle.

13. The separation apparatus according to claim 11,
wherein the second structure body is configured to apply tension to the support body by moving the shaft of the second structure body.

14. The separation apparatus according to claim 11, wherein a radius of curvature of the convex surface included in the first structure body is larger than a radius of curvature of the convex surface included in the second structure body.

15. The separation apparatus according to claim 11, further comprising a fixing mechanism,
wherein the fixing mechanism is configured to fix the second member at least part of which is separated from the first member.

16. The separation apparatus according to claim 11, further comprising a liquid supply mechanism,
wherein the liquid supply mechanism is configured to supply liquid between the first member and the second member.

17. The separation apparatus according to claim 11, wherein the radius of curvature of the convex surface included in the first structure body is greater than or equal to 0.5 mm and less than or equal to 1000 mm.

18. The separation apparatus according to claim 11, further comprising a reel,
wherein the reel is located between the support body supply unit and the support body hold unit,
wherein a tape is bonded to one surface of the support body, and
wherein the reel is configured to wind up the tape.

* * * * *